United States Patent
Suzuki et al.

(10) Patent No.: US 8,503,222 B2
(45) Date of Patent: Aug. 6, 2013

(54) NON-VOLATILE LOGIC CIRCUIT

(75) Inventors: Tetsuhiro Suzuki, Tokyo (JP);
Shunsuke Fukami, Tokyo (JP);
Kiyokazu Nagahara, Tokyo (JP);
Nobuyuki Ishiwata, Tokyo (JP);
Tadahiko Sugibayashi, Tokyo (JP);
Noboru Sakimura, Tokyo (JP);
Ryusuke Nebashi, Tokyo (JP)

(73) Assignee: NEC Corporation, Tokyo (JP)

( * ) Notice: Subject to any disclaimer, the term of this patent is extended or adjusted under 35 U.S.C. 154(b) by 180 days.

(21) Appl. No.: 13/144,480

(22) PCT Filed: Jan. 21, 2010

(86) PCT No.: PCT/JP2010/050708
§ 371 (c)(1),
(2), (4) Date: Aug. 10, 2011

(87) PCT Pub. No.: WO2010/087269
PCT Pub. Date: Aug. 5, 2010

(65) Prior Publication Data
US 2011/0292718 A1    Dec. 1, 2011

(30) Foreign Application Priority Data

Jan. 27, 2009  (JP) .................................. 2009-015434
Sep. 25, 2009  (JP) .................................. 2009-220725

(51) Int. Cl.
*G11C 11/00*    (2006.01)
(52) U.S. Cl.
USPC ........................................ 365/158; 365/173
(58) Field of Classification Search
USPC ................................................ 365/5, 32, 55
See application file for complete search history.

(56) References Cited

U.S. PATENT DOCUMENTS

| 7,379,321 B2 * | 5/2008 | Ravelosona et al. .......... 365/145 |
| 7,821,088 B2 * | 10/2010 | Nguyen et al. ................ 257/421 |
| 8,373,438 B2 * | 2/2013 | Shukh ............................. 326/37 |

FOREIGN PATENT DOCUMENTS

| JP | 9-74183 A | 3/1997 |
| JP | 9-148440 A | 6/1997 |
| JP | 2004006775 A | 1/2004 |
| JP | 2006032951 A | 2/2006 |
| JP | 2007299992 A | 11/2007 |
| JP | 2008066479 A | 3/2008 |
| JP | 2007103663 A | 4/2010 |

OTHER PUBLICATIONS

International Search Report for PCT/JP2010/050708 mailed Apr. 6, 2010.

* cited by examiner

*Primary Examiner* — Tan T. Nguyen

(57) ABSTRACT

A non-volatile logic circuit includes an input section, a control section and an output section. The input section has perpendicular magnetic anisotropy and has a ferromagnetic layer whose magnetization state is changeable. The control section includes a ferromagnetic layer. The output section is provided in a neighborhood of the input section and the control section and includes a magnetic tunnel junction element whose magnetization state is changeable. The magnetization state of the input section is changed based on the magnetization state. A magnetization state of the magnetic tunnel junction element of the output section which state is changed based on the magnetization state of the ferromagnetic material of the control section and the magnetization state of the ferromagnetic material of the input section.

28 Claims, 53 Drawing Sheets

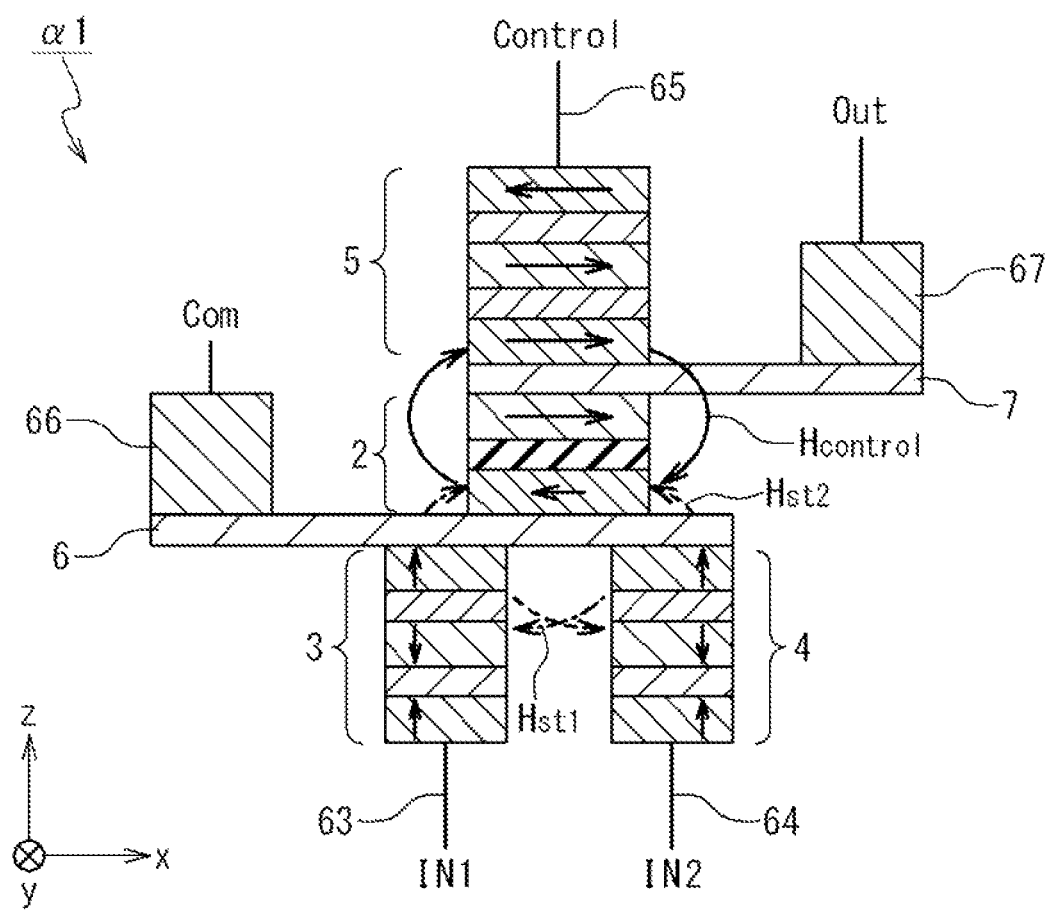

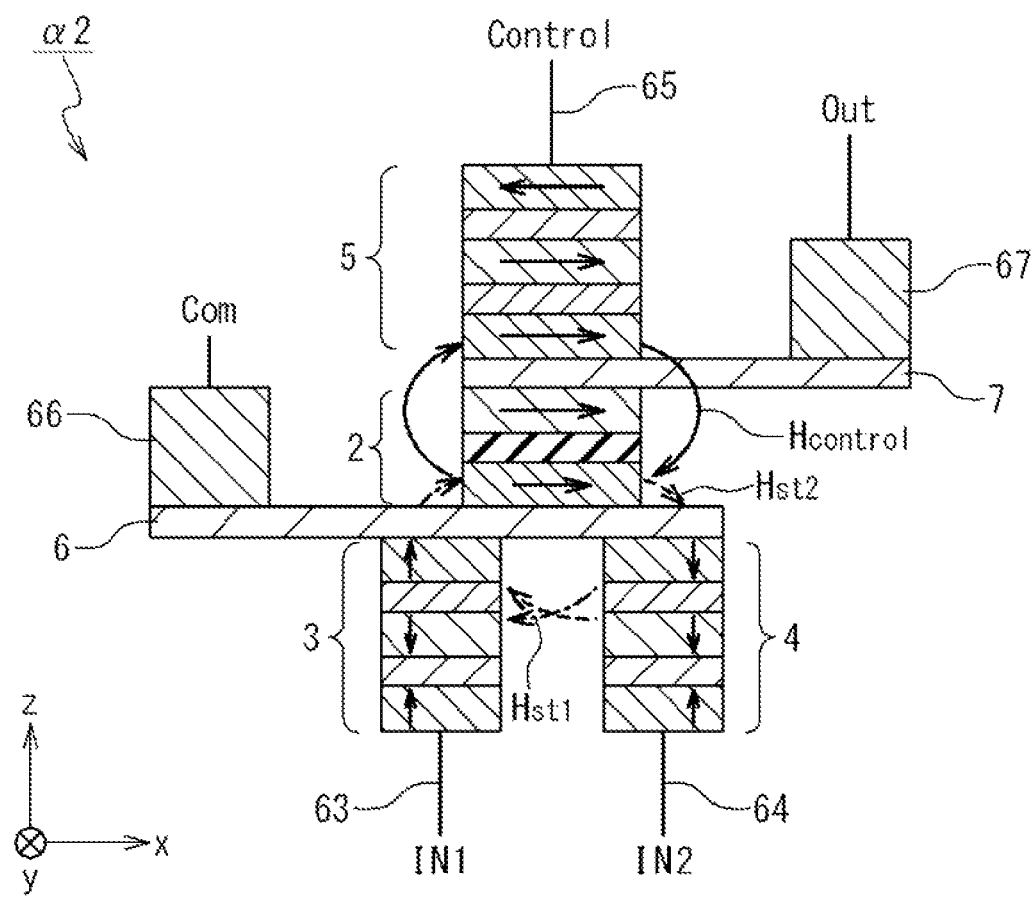

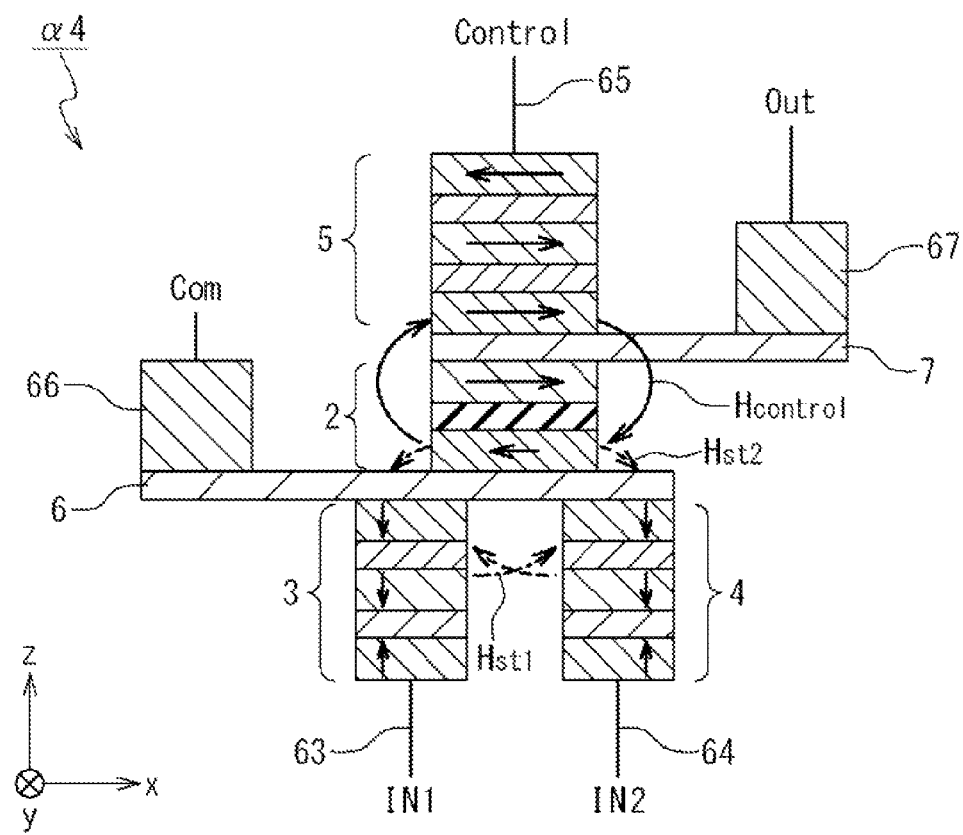

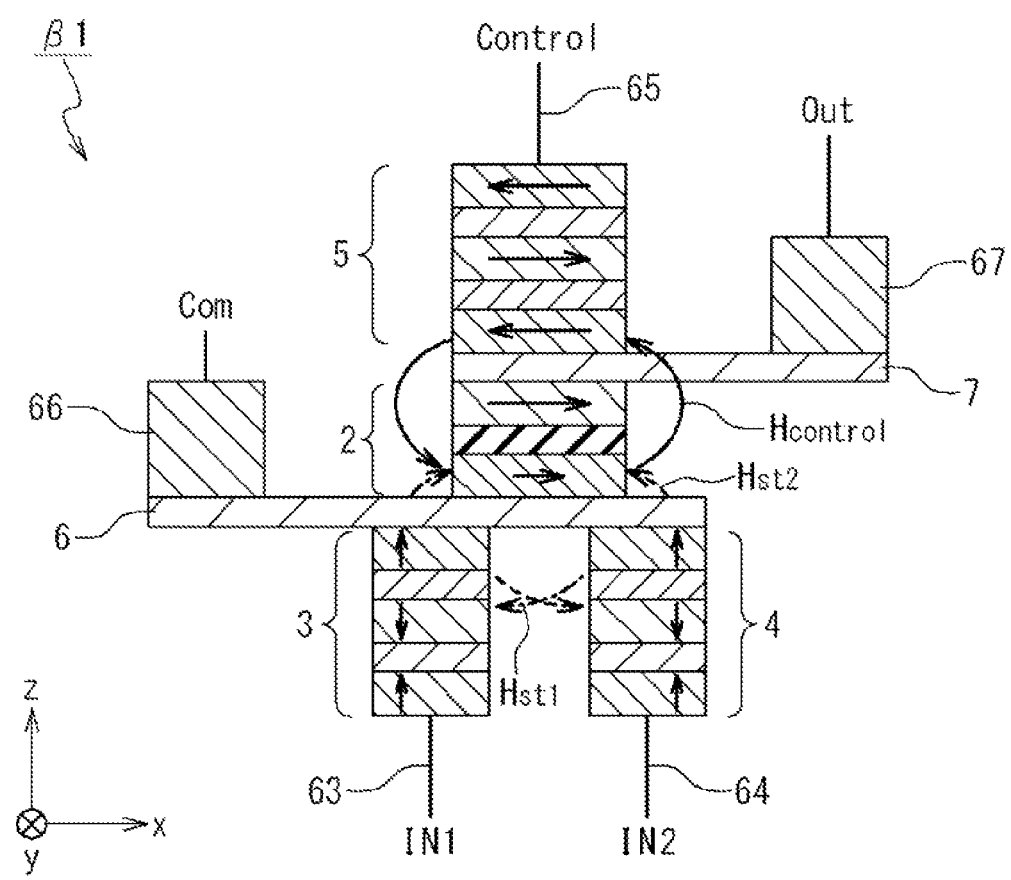

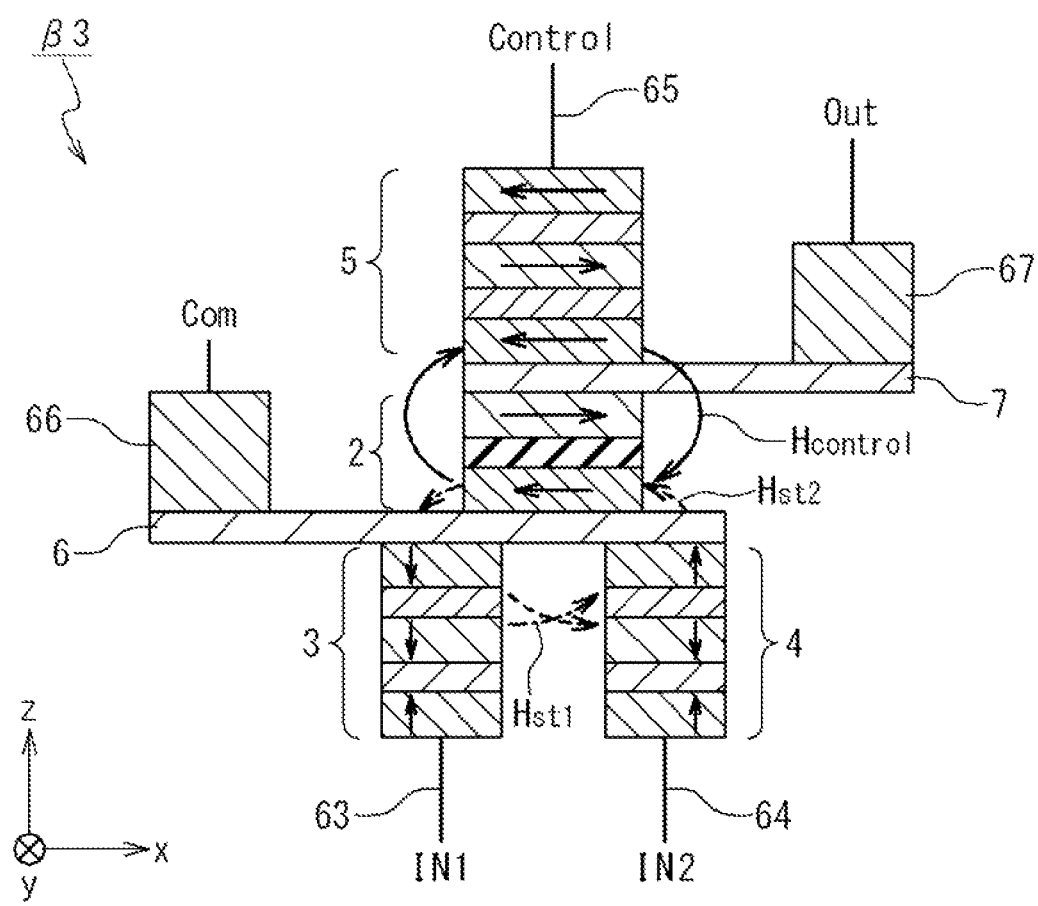

Fig. 7A

| STATE | MEMORY LAYER A | MEMORY LAYER B | BIAS LAYER C | SYNTHETIC MAGNETIC FIELD Hsx |
|---|---|---|---|---|
| α1 | ↑ | ↑ | → | −b |
| α2 | ↑ | ↓ | → | +2s−b |
| α3 | ↓ | ↑ | → | −2s−b |
| α4 | ↓ | ↓ | → | −b |

Fig. 7B

| STATE | MEMORY LAYER A | MEMORY LAYER B | BIAS LAYER C | SYNTHETIC MAGNETIC FIELD Hsx |
|---|---|---|---|---|
| β1 | ↑ | ↑ | ← | +b |
| β2 | ↑ | ↓ | ← | +2s+b |
| β3 | ↓ | ↑ | ← | −2s+b |
| β4 | ↓ | ↓ | ← | +b |

Fig. 9A

| IN1 | IN2 | Control | STATE | MEMORY LAYER A | MEMORY LAYER B | BIAS LAYER C | OUT |
|---|---|---|---|---|---|---|---|
| 1 | 0 | 1 | α1 | ↑ | ↑ | → | 1 |
| 1 | 1 | 1 | α2 | ↑ | ↓ | → | 0 |
| 0 | 0 | 1 | α3 | ↓ | ↑ | → | 1 |
| 0 | 1 | 1 | α4 | ↓ | ↓ | → | 1 |

NAND

Fig. 9B

| IN1 | IN2 | Control | STATE | MEMORY LAYER A | MEMORY LAYER B | BIAS LAYER C | OUT |
|---|---|---|---|---|---|---|---|
| 1 | 0 | 0 | β1 | ↓ | ↑ | ← | 0 |
| 1 | 1 | 0 | β2 | ↑ | ↓ | ← | 0 |
| 0 | 0 | 0 | β3 | ↓ | ↑ | ← | 1 |
| 0 | 1 | 0 | β4 | ↓ | ↓ | ← | 0 |

NOR

Fig. 21A

| CASE | A | B | a | p | l | q | b | out |
|---|---|---|---|---|---|---|---|---|
| γ1 | 0 | 0 | ⊗ | ↑ | ⊗ | ↑ | ⊗ | 1 |
| γ2 | 0 | 1 | ⊗ | ↑ | ⊗ | ← | ⊙ | 0 |
| γ3 | 1 | 0 | ⊙ | → | ⊗ | ↑ | ⊗ | 0 |
| γ4 | 1 | 1 | ⊙ | → | ⊗ | ← | ⊙ | 0 |

Fig. 21B

| CASE | A | B | a | p | l | q | b | out |
|---|---|---|---|---|---|---|---|---|
| δ1 | 0 | 0 | ⊗ | ← | ⊙ | → | ⊗ | 0 |
| δ2 | 0 | 1 | ⊗ | ← | ⊙ | ↑ | ⊙ | 0 |
| δ3 | 1 | 0 | ⊙ | ↑ | ⊙ | → | ⊗ | 0 |
| δ4 | 1 | 1 | ⊙ | ↑ | ⊙ | ↑ | ⊙ | 1 |

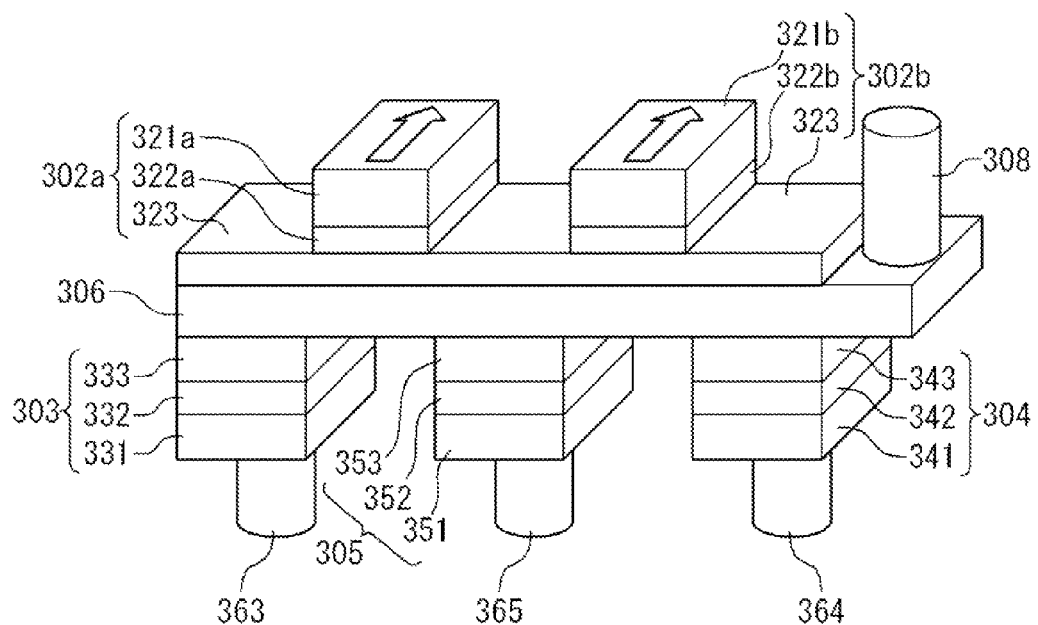

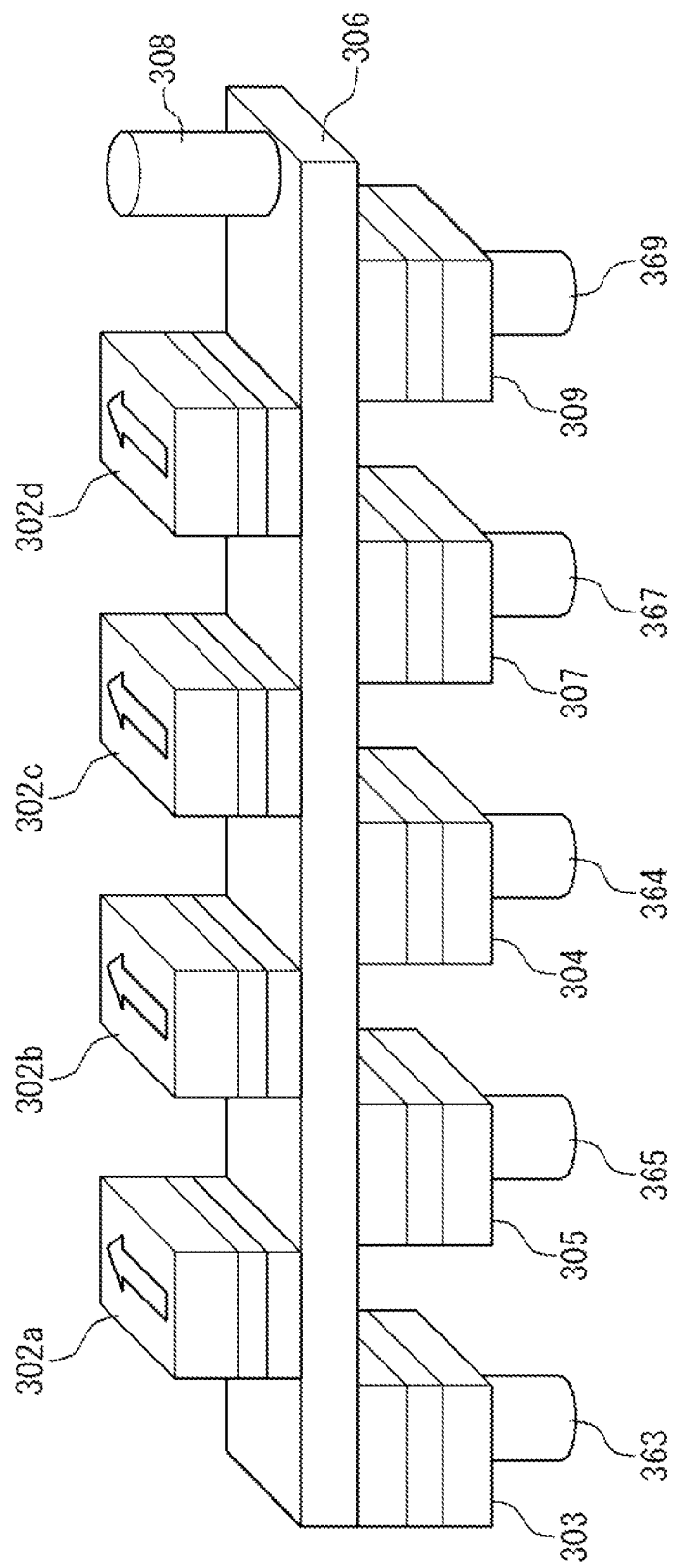

Fig. 29A

| CASE | A | a | r | l | out |
|---|---|---|---|---|---|
| ε1 | 0 | ⊗ | ← | ⊙ | 0 |
| ε2 | 1 | ⊙ | ↑ | ⊙ | 1 |

Fig. 29B

| CASE | A | a | r | l | out |
|---|---|---|---|---|---|
| ζ1 | 0 | ⊗ | ↑ | ⊗ | 1 |
| ζ2 | 1 | ⊙ | → | ⊗ | 0 |

Fig. 32A

| CASE | A | B | a | p | I1 | q | b | O-1 | o | r | I2 | O-2 |
|---|---|---|---|---|---|---|---|---|---|---|---|---|
| η1 | 0 | 0 | ⊗ | ↑ | ⊗ | ↑ | ⊗ | 1 | ⊙ | ↑ | ⊙ | 1 |
| η2 | 0 | 1 | ⊗ | ↑ | ⊗ | ← | ⊙ | 0 | ⊗ | ← | ⊙ | 0 |
| η3 | 1 | 0 | ⊙ | → | ⊗ | ↑ | ⊗ | 0 | ⊗ | ← | ⊙ | 0 |
| η4 | 1 | 1 | ⊙ | → | ⊗ | ← | ⊙ | 0 | ⊗ | ← | ⊙ | 0 |

Fig. 32B

| CASE | A | B | a | p | I1 | q | b | O-1 | o | r | I2 | O-2 |
|---|---|---|---|---|---|---|---|---|---|---|---|---|
| θ1 | 0 | 0 | ⊗ | ← | ⊙ | → | ⊗ | 0 | ⊗ | ↑ | ⊗ | 1 |
| θ2 | 0 | 1 | ⊗ | ← | ⊙ | ↑ | ⊙ | 0 | ⊗ | ↑ | ⊗ | 1 |
| θ3 | 1 | 0 | ⊙ | ↑ | ⊙ | → | ⊗ | 0 | ⊗ | ↑ | ⊗ | 1 |
| θ4 | 1 | 1 | ⊙ | ↑ | ⊙ | ↑ | ⊙ | 1 | ⊙ | → | ⊗ | 0 |

Fig. 34A

| CASE | A | B | a | p | l | q | b | out |
|------|---|---|---|---|---|---|---|-----|
| κ1 | 0 | 0 | ⊗ | ↑ | ⊗ | ↑ | ⊗ | 1 |
| κ2 | 0 | 1 | ⊗ | ↑ | ⊗ | ← | ⊙ | 0 |
| κ3 | 1 | 0 | ⊙ | → | ⊗ | ↑ | ⊗ | 0 |
| κ4 | 1 | 1 | ⊙ | → | ⊗ | ← | ⊙ | 0 |

Fig. 34B

| CASE | A | B | a | p | l | q | b | out |
|------|---|---|---|---|---|---|---|-----|
| λ1 | 0 | 0 | ⊗ | ← | ⊙ | → | ⊗ | 0 |
| λ2 | 0 | 1 | ⊗ | ← | ⊙ | ↑ | ⊙ | 0 |
| λ3 | 1 | 0 | ⊙ | ↑ | ⊙ | → | ⊗ | 0 |
| λ4 | 1 | 1 | ⊙ | ↑ | ⊙ | ↑ | ⊙ | 1 |

Fig. 41A

| CASE | A | a | r | l | out |
|---|---|---|---|---|---|
| $\mu 1$ | 0 | ⊗ | ← | ⊙ | 0 |
| $\mu 2$ | 1 | ⊙ | ↑ | ⊙ | 1 |

Fig. 41B

| CASE | A | a | r | l | out |
|---|---|---|---|---|---|
| $\nu 1$ | 0 | ⊗ | ↑ | ⊗ | 1 |
| $\nu 2$ | 1 | ⊙ | → | ⊗ | 0 |

Fig. 43A

| CASE | A | B | a | p | I1 | q | b | O-1 | o | r | I2 | O-2 |
|---|---|---|---|---|---|---|---|---|---|---|---|---|
| ξ1 | 0 | 0 | ⊗ | ↑ | ⊗ | ↑ | ⊗ | 1 | ⊙ | ↑ | ⊙ | 1 |
| ξ2 | 0 | 1 | ⊗ | ↑ | ⊗ | ← | ⊙ | 0 | ⊗ | ← | ⊙ | 0 |
| ξ3 | 1 | 0 | ⊙ | → | ⊗ | ↑ | ⊗ | 0 | ⊗ | ← | ⊙ | 0 |
| ξ4 | 1 | 1 | ⊙ | → | ⊗ | ← | ⊙ | 0 | ⊗ | ← | ⊙ | 0 |

Fig. 43B

| CASE | A | B | a | p | I1 | q | b | O-1 | o | r | I2 | O-2 |
|---|---|---|---|---|---|---|---|---|---|---|---|---|
| π1 | 0 | 0 | ⊗ | ← | ⊙ | → | ⊗ | 0 | ⊗ | ↑ | ⊗ | 1 |
| π2 | 0 | 1 | ⊗ | ← | ⊙ | ↑ | ⊙ | 0 | ⊗ | ↑ | ⊗ | 1 |
| π3 | 1 | 0 | ⊙ | ↑ | ⊙ | → | ⊗ | 0 | ⊗ | ↑ | ⊗ | 1 |
| π4 | 1 | 1 | ⊙ | ↑ | ⊙ | ↑ | ⊙ | 1 | ⊙ | → | ⊗ | 0 |

NON-VOLATILE LOGIC CIRCUIT

This patent application is the National Phase of PCT/JP2010/050708, filed Jan. 21, 2010, which claims priorities on convention based on Japanese Patent Application No. 2009-015434 filed on Jan. 27, 2009 and Japanese Patent Application No. 2009-220725 number filed on Sep. 25, 2009. The disclosures thereof are incorporated herein by reference.

TECHNICAL FIELD

The present invention is related to a non-volatile logic circuit, more particularly, to a non-volatile logic circuit using a magneto-resistance element.

RELATED ARTS

A Reconfigurable Logic is known which is a re-configurable logic device. As such a re-configurable logic device, for example, FPGA (Field Programmable Gate Array) is in practical use, in which basic logical blocks are arranged in an array and logic is re-configurable.

As an example of the FPGA, a changeable logic integrated circuit is disclosed in JP H09-148440A (corresponding to U.S. Pat. No. 5,825,203). The changeable logic integrated circuit is provided with a plurality of changeable logic blocks and a plurality of changeable wiring circuits, and the logical functions of the plurality of changeable logic blocks are re-configurable, which are alternately arranged on a semiconductor chip in a horizontal direction and a vertical direction. Wirings which are not connected with the changeable wiring circuits are formed above the changeable logic blocks for another purpose.

As related techniques, a single polarity-type resistance variable PCMO register adjusting circuit is disclosed in the JP 2006-32951A (corresponding to U.S. Pat. No. 7,084,691). The single polarity-type resistance variable PCMO register adjusting circuit is a circuit which adjusts a resistance value of a matching register to a resistance value of a reference register reversibly. The matching register is configured of a programmable resistance material having a single polarity-type resistance variable characteristic. The circuit is provided with a resistance bridge circuit network that has the reference register and the matching register, and a pulse feed-back circuit. The resistance bridge circuit network compares the resistance states of the reference register and the matching register and generates a comparison resultant signal showing a difference between the reference register and the matching register. The pulse feed-back circuit is connected with the resistance bridge circuit network and supplies an electric pulse signal of a single polarity according to the comparison resultant signal, so as to correct the resistance value of the matching register to the resistance value of the reference register.

CITATION LIST

[Patent Literature 1]: JP H09-148440A
[Patent Literature 2]: JP 2006-32951A

SUMMARY OF THE INVENTION

In an FPGA like the variable logic integrated circuit disclosed in JP H09-148440A, configuration information is stored in SRAM (Static Random Access memory). Therefore, to retain the configuration information at the time of power-off, it is necessary to further provide a non-volatile memory such as a flash memory. Therefore, a chip area of the device becomes large by an area of the non-volatile memory.

As a method of solving the problem of increase of the chip area by the area of the non-volatile memory, it could be considered to use a non-volatile memory such as FeRAM (Ferroelectric Random Access Memory) and MRAM (Magneto-resistive Random Access Memory), and to form a non-volatile logic circuit by replacing the SRAM by these memories. However, in case of using FeRAM, there is a problem that the number of times of rewrite is limited. Also, in case of using MRAM, there is a problem with a large cell size.

Also, as another method of solving the problem of increase of the chip area by the non-volatile memory, it could be considered to use a device having a logical element function and a memory function. If the method can be realized, it is possible to configure a circuit in a more compact size, compared with the above-mentioned method of replacing SRAM with the non-volatile memory.

The single polarity-type resistance variable PCMO register adjusting circuit in JP 2006-32951A is an example of a re-configurable non-volatile logic circuit using spin MOSFET (Metal-Oxide Semiconductor Field-Effect Transistor). However, there is a problem that a stable operation at the room temperature is difficult in the spin MOSFET because the spin transfer efficiency from a magnetic substance to a semiconductor is low.

The present invention provides a non-volatile logic circuit operable at room temperature and having a logical element function and a memory function.

The non-volatile logic circuit of the present invention is provided with an input section, a control section and an output section. The input section has perpendicular magnetic anisotropy and is provided with a ferromagnetic layer having changeable magnetization state. The control section is provided with a ferromagnetic layer. The output section is provided in the neighborhood of the input section and the control section and is provided with a magnetic tunnel junction element having changeable magnetization state. The magnetization state of the input section changes according to the input data. The magnetization state of the magnetic tunnel junction element in the output section changes according to the magnetization states of the input section and the control section.

Also, an operation method of a non-volatile logic circuit of the present invention is provided. The non-volatile logic circuit is provided with an input section having perpendicular magnetic anisotropy and provided with a ferromagnetic layer having changeable magnetization state, a control section provided with a ferromagnetic layer, and an output section provided in the neighborhood of the input section and the control section and provided with a magnetic tunnel junction element having changeable magnetization state. The operation method of the non-volatile logic circuit includes inputting a control data by the control section to set the magnetization state of the ferromagnetic layer in the control section to a state determined in accordance with the control data, inputting an input data by the input section to set the magnetization state of the ferromagnetic layer in the input section to a state determined in accordance with the input data, and reading the magnetization state of the magnetic tunnel junction element in the output section which is changed based on the magnetization state of the ferromagnetic layer in the control section and the magnetization state of the ferromagnetic layer of the input section.

According to the present invention, it is possible to the non-volatile logic circuit operable at the room temperature and having a logical element function and a memory function.

BRIEF DESCRIPTION OF THE DRAWINGS

FIG. 3A is a sectional view showing an example of a magnetization state of the non-volatile logic circuit according to the first exemplary embodiment of the present invention;

FIG. 3B is a sectional view showing the example of the magnetization state of the non-volatile logic circuit according to the first exemplary embodiment of the present invention;

FIG. 3D is a sectional view showing the example of the magnetization state of the non-volatile logic circuit according to the first exemplary embodiment of the present invention;

FIG. 3E is a sectional view showing the example of the magnetization state of the non-volatile logic circuit according to the first exemplary embodiment of the present invention;

FIG. 3G is a sectional view showing the example of the magnetization state of the non-volatile logic circuit according to the first exemplary embodiment of the present invention;

FIG. 7A is a table showing a relation between the magnetization direction of a memory layer A, the magnetization direction of a bias layer, and the synthetic magnetic field in the first exemplary embodiment of the present invention;

FIG. 7B is a table showing a relation between the magnetization direction of a memory layer B, the magnetization direction of the bias layer, and the synthetic magnetic field in the first exemplary embodiment of the present invention;

FIG. 9A is a table showing a relation between the magnetization direction of the memory layer A, the magnetization direction of the bias layer, and input/output data in the first exemplary embodiment of the present invention;

FIG. 9B is a table showing a relation between the magnetization direction of the memory layer B, the magnetization direction of the bias layer, and the input/output data in the first exemplary embodiment of the present invention;

FIG. 21A is a table showing a relation of the magnetization directions of the memory layers A and B, the bias layer, and the sensor layer in the fifth exemplary embodiment of the present invention;

FIG. 21B is a table showing a relation of the magnetization directions of the memory layers A and B, the bias layers and the sensor layer according to the fifth exemplary embodiment of the present invention;

FIG. 24A is a diagram showing another modification example of the configuration of the non-volatile logic circuit according to the fifth exemplary embodiment of the present invention;

FIG. 24B is a diagram showing the other modification example of the configuration of the non-volatile logic circuit according to the fifth exemplary embodiment of the present invention;

FIG. 26 is a diagram schematically showing another modification example of the configuration of the non-volatile logic circuit according to the fifth exemplary embodiment of the present invention;

FIG. 29A is a table showing a relation of the magnetization directions of the memory layer A, the bias layer and the sensor layer in the sixth exemplary embodiment of the present invention;

FIG. 29B is a table showing a relation of the magnetization directions of the memory layer A, the bias layer and the sensor layer in the sixth exemplary embodiment of the present invention;

FIG. 32A is a table showing a relation of the magnetization directions of the memory layers A and B, the bias layer and the sensor layer in the non-volatile logic circuit according to the seventh exemplary embodiment of the present invention;

FIG. 32B is a table showing a relation of the magnetization directions of the memory layers A and B, the bias layer and the sensor layer in the non-volatile logic circuit according to the seventh exemplary embodiment of the present invention;

FIG. 34A is a table showing a relation of the magnetization directions of the magnetization invertible region and the sensor layer in the eighth exemplary embodiment of the present invention;

FIG. 34B is a table showing a relation of the magnetization invertible region and the magnetization direction of the sensor layer in the eighth exemplary embodiment of the present invention;

FIG. 41A is a table showing a relation of the magnetization direction of the magnetization invertible region and the sensor layer in the ninth exemplary embodiment of the present invention;

FIG. 41B is a table showing a relation of the magnetization direction of the magnetization invertible region and the sensor layer in the ninth exemplary embodiment of the present invention;

FIG. 43A is a table showing a relation of the magnetization directions of the sensor layer and the magnetization invertible region in the non-volatile logic circuit according to the tenth exemplary embodiment of the present invention; and FIG. 43B is a table showing a relation of the magnetization directions of the sensor layer and the magnetization invertible region in the non-volatile logic circuit according to the tenth exemplary embodiment of the present invention.

DESCRIPTION OF EXEMPLARY EMBODIMENTS

Hereinafter, a non-volatile logic circuit according to the present invention will be described with reference to the attached drawings.

Figure 1:
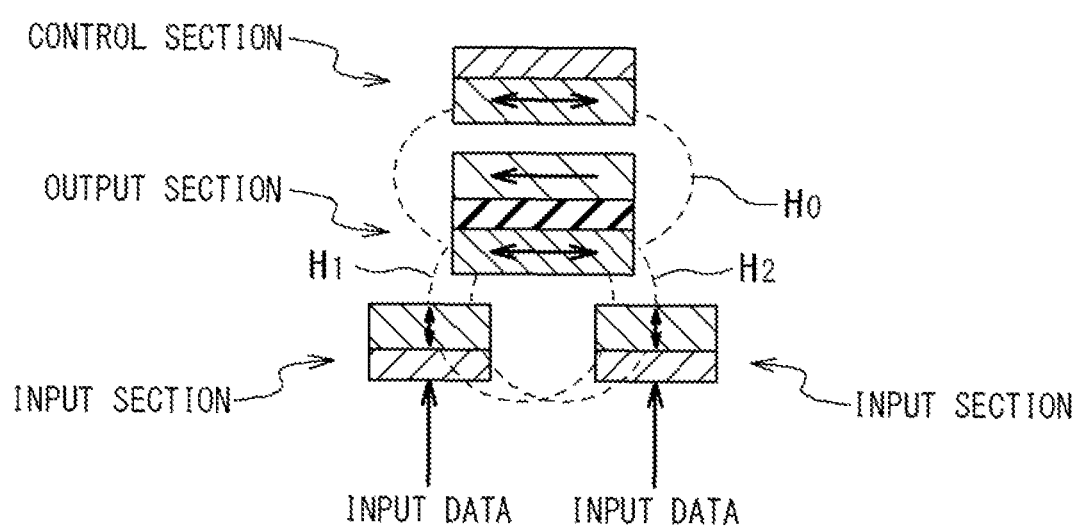
FIG. 1 is a diagram schematically showing a principle of a non-volatile logic circuit according to the present invention.

FIG. 1 is a diagram schematically showing a principle of the non-volatile logic circuit according to the present invention. The non-volatile logic circuit is provided with a plurality of input sections, a control section and an output section. The plurality of input sections (two input sections in this figure) contain ferromagnetic layers having perpendicular magnetic anisotropy and having a changeable magnetization state. The control section contains a ferromagnetic layer (in a case of the in-plane magnetic anisotropy in this figure). The output section is provided in the neighborhood of the plurality of input sections and the control section and contains a magnetic tunnel junction element which has a changeable magnetization state. The magnetization states of each of the plurality of input sections changes in accordance with input data. The magnetization state of the magnetic tunnel junction element in the output section is changed in accordance with the magnetization states of the plurality of input sections and the control section. That is, the magnetization state of the magnetic tunnel junction element in the output section changes due to leakage magnetic fields (H1, H2, H0) which change in accordance with the magnetization states of the plurality of input sections and the control section. Output data corresponding to the input data can be obtained by detecting a resistance value of the magnetic tunnel junction element in which a magnetization state is changed. In this case, the control section, the plurality of input sections and the output section configure a device which has a logical element function and a memory function. Hereinafter, the non-volatile logic circuit according to the present invention will be described in detail.

It should be noted that in FIG. 1, the magnetization state of the magnetic tunnel junction element in the output section is controlled with leakage magnetic fields (H1, H2, H0) in the two input sections and the one control section, but the present invention is not limited to this example. That is, as understood from the principle figure shown in FIG. 1, even if the one input section is omitted and a configuration of one input section and one control section is adopted, it is possible to control the magnetization state of the magnetic tunnel junction element in the output section with these leakage magnetic fields (H1, H0). Moreover, even if the control section of in FIG. 1 is omitted, and one of the input sections is set as the control section, it is possible to control the magnetization state of the magnetic tunnel junction element in the output section based on those leakage magnetic fields (H1, H2). In these cases, the one control section, the one input section and the one output section configure a device which has the logical element function and the memory function. Also, oppositely, three or more input sections may be provided, and these details are later mentioned.

First Exemplary Embodiment

1. Basic Configuration of Non-Volatile Logic Circuit

Figure 2A:
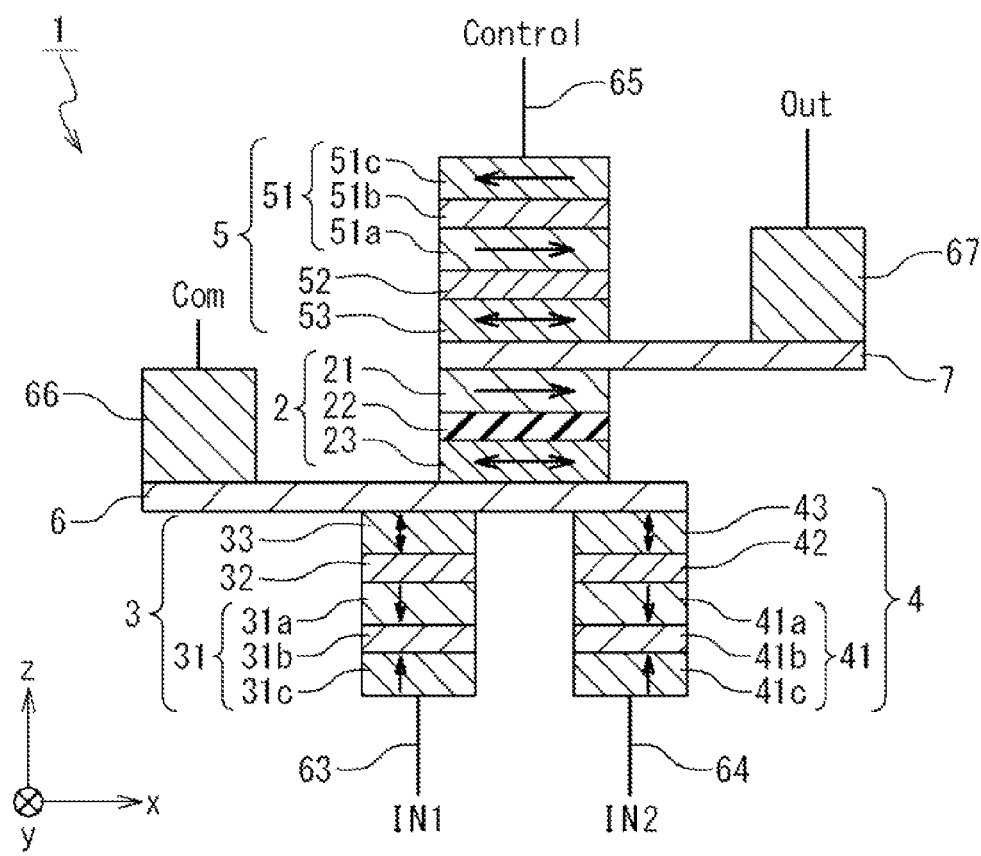
FIG. 2A is a sectional view showing a configuration of the non-volatile logic circuit according to a first exemplary embodiment of the present invention.

Hereinafter, the basic configuration of the non-volatile logic circuit according to a first exemplary embodiment of the present invention will be described. FIG. 2A is a sectional view showing the configuration of the non-volatile logic circuit according to the first exemplary embodiment of the present invention. The non-volatile logic circuit 1 is provided with input sections 3 and 4, an output section 2, and a control section 5.

The input section 3 is a spin polarized current write type GMR (Giant Magneto-Resistance) element as an example. The input section 3 is provided with a pinned layer 31, an intermediate layer 32 and a memory layer A 33, which are laminated in the direction of +z. The pinned layer 31 is provided to be connected with the one surface of the intermediate layer 32, and the memory layer A 33 is provided to be connected with the other surface of the intermediate layer 32.

The pinned layer 31 is a ferromagnetic layer having a perpendicular magnetic anisotropy and the fixed magnetization direction. Here, the perpendicular magnetic anisotropy means magnetic anisotropy in the direction of +z perpendicular to the xy plane in this example of the figure. Hereinafter, it is a same in the Description. The magnetization direction of the pinned layer 31 is fixed in the direction of −z in an example of this figure. The pinned layer 31 is configured of a plurality of ferromagnetic layers (a ferromagnetic layer 31a, a non-magnetic layer 31b, and a ferromagnetic layer 31c) which have a synthetic ferrimagnetic coupling to fix the magnetization firmly. An anti-ferromagnetic layer may be provided in the neighborhood of the ferromagnetic layer to fix the magnetization firmly.

The memory layer A 33 is a ferromagnetic layer in which the magnetization direction is changeable. It is desirable that the memory layer A 33 has perpendicular magnetic anisotropy. When the memory layer A 33 is the ferromagnetic layer having perpendicular magnetic anisotropy, it is possible to reduce the write current while maintaining heat stability, as the layer thickness is made thinner. Therefore, it becomes possible to form the element in a smaller size. The magnetization direction of the memory layer A 33 is invertible to either of the direction of +z and the direction of −z, in an example of this figure. The input data is inputted to the memory layer A 33. Specifically, the write current corresponding to the input data is supplied. The magnetization direction of the memory layer A 33 is inverted through interaction with spin electrons in the pinned layer 31 when the write current passes through the input section 3 in the direction of z. The input data is stored according to the magnetization direction of the memory layer A 33. The memory layer A 33 functions as a free layer in the GMR element. The memory layer A 33 is magnetically coupled with the output section 2 to be mentioned later. Therefore, the magnetization direction of the memory layer A 33 has an influence on the magnetization state of the output section 2. The intermediate layer 32 is a non-magnetic film which is provided between the pinned layer 31 and the memory layer A 33.

The input section 4 is a spin polarized current write type GMR element as an example. The input section 4 is provided with a pinned layer 41 (a ferromagnetic layer 41a, a non-magnetic layer 41b, a ferromagnetic layer 41c), an intermediate layer 42 and a memory layer B 43, which are laminated in the direction of +z. Because these are the same as the pinned layers 31 (the ferromagnetic layer 31a, the non-magnetic layer 31b, and the ferromagnetic layer 31c), the intermediate layer 32 and the memory layer A 33 in the input section 3, the description are omitted.

The control section 5 is a spin polarized current write type GMR element. The control section 5 is provided with a bias layer 53, an intermediate layer 52 and the pinned layer 51, which are laminated in the direction of +z. The pinned layer 51 is provided to be connected with one of the surfaces of the intermediate layer 52, and the bias layer 53 is provided to be connected with the other surface of the intermediate layer 52.

The pinned layer 51 is a ferromagnetic layer having in-plane magnetic anisotropy and having a fixed magnetization direction, as an example. In an example of this figure, the in-plane magnetic anisotropy means magnetic anisotropy in the direction parallel to the xy plane. Hereinafter, this is the same in the Description. The magnetization direction of the pinned layer 51 is fixed on the direction of +x in an example of this figure. The pinned layer 51 is configured from a plurality of ferromagnetic layers (a ferromagnetic layer 51a, a non-magnetic layer 51b, and a ferromagnetic layer 51c) which have a synthetic ferrimagnetic coupling, to fix a magnetization direction firmly. An anti-ferromagnetic layer may be provided close to the ferromagnetic layer and may fix the magnetization direction firmly.

The bias layer 53 is a ferromagnetic layer which has in-plane magnetic anisotropy and in which the magnetization direction is changeable, as an example. The magnetization direction of the bias layer 53 is invertible to the direction of +x or the direction of −x direction, in an example of this figure. Control data is inputted to the bias layer 53. Specifically, the write current corresponding to the control data is supplied. The magnetization direction of the bias layer 53 is inverted through interaction with spin electrons in the pinned layer 51 when the write current passes through the control section 5 in the direction of z. The control data is stored in accordance with the magnetization direction of the bias layer 53. Hereinafter, the bias layer 53 is a free layer in the GMR element. The bias layer 53 is magnetically coupled with the output section 2 to be mentioned later. Therefore, the magnetization direction of the bias layer 53 has an influence on the magnetization state of the output section 2.

The bias layer 53 may be a ferromagnetic layer in which the magnetization direction is fixed, in that the non-volatile logic circuit operable at the room temperature and having a logical element function and a memory function is realized. However, in this case, it is impossible to change logic species (NAND, and NOR) to be described later. Therefore, the bias layer is formed from a ferromagnetic layer in which the magnetization direction is invertible, in order to set the reconfigurable non-volatile logic circuit.

The intermediate layer 52 is a non-magnetic layer provided between the pinned layer 51 and the bias layer 53.

The output section 2 is TMR (Tunnel Magneto-Resistance) element. The output section 2 is provided with a sensor layer 23, a barrier layer 22 and a reference layer 21, which are laminated in the direction of +z. The reference layer 21 is provided to be connected with one of the surfaces of the barrier layer 22, and the sensor layer 23 is provided to be connected with the other surface of the barrier layer 22. The sensor layer 23, the barrier layer 22 and the reference layer 21 configure a magnetic tunnel junction (MTJ) element.

The reference layer 21 is a ferromagnetic layer which has in-plane magnetic anisotropy and in which the magnetization direction is fixed. The magnetization direction of the reference layer 21 is fixed in the direction of +x in an example of this figure. The reference layer 21 may be formed from a plurality of ferromagnetic layers which have synthetic ferrimagnetic coupling, to fix the magnetization direction firmly (not shown). In the reference layer 21, an anti-ferromagnetic layer may be arranged in the neighborhood of the ferromagnetic layer.

The sensor layer 23 is a ferromagnetic layer which has in-plane magnetic anisotropy and in which the magnetization direction is changeable. In an example of this figure, the magnetization direction of the sensor layer 23 is invertible to the direction of +x or the direction of −x direction. The sensor layer 23 is magnetically coupled with the memory layer A 33, the memory layer B 43 and the bias layer 53, to be described later. Therefore, the magnetization direction of the sensor layer 23 undergoes influence by the magnetization states (the magnetization directions) of the memory layer A 33, the memory layer B 43, and the bias layer 53. Here, the sensor layer 23 (the output section 2) is formed such that the direction of x turns to the direction of the hard axis and the direction of y turns to the direction of the easy axis. Therefore, the magnetization direction of the sensor layer 23 does not have a component in the direction of x, to turn to the direction of y when not undergoing other influence. On the other hand, when undergoing influence by the magnetization states of the memory layer A 33, the memory layer B 43 and the bias layer 53, the magnetization direction of the sensor layer 23 changes to the direction corresponding to the magnetization state and has a component in the direction of x. That is, the magnetization direction changes due to the synthetic magnetic field of leakage magnetic fields from the memory layer A 33, the memory layer B 43 and the bias layer 53. Thus, output data is stored based on the magnetization direction of the sensor layer 23. The barrier layer 22 is an insulating film which is provided between the reference layer 21 and the sensor layer 23.

Figure 2B:
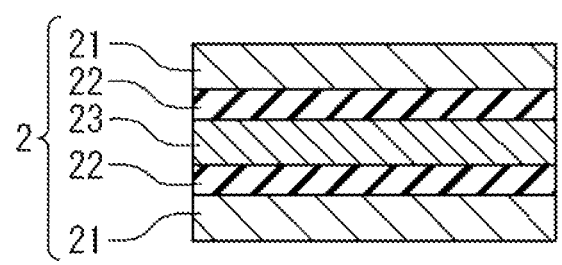
FIG. 2B is a sectional view showing another configuration example of an output section according to the first exemplary embodiment of the present invention.

It should be noted that the position relation of the sensor layer 23 and the reference layer 21 in the output section 2 may be opposite in the upper and lower direction (the direction of +z). That is, the reference layer 21 may be provided for the side of the input sections 3 and 4 and the sensor layer 23 may be provided for the side of the control section 5, respectively. Moreover, the output section 2 may have another configuration. For example, FIG. 2B is a sectional view showing another configuration example of the output section according to the first exemplary embodiment of the present invention. The output section 2 has the reference layers 21 on the side of each of the input sections 3 and 4 and the side of the control section 5, and the reference layer 21 is formed on the sensor layer 23 in the center of the output section 2 through the barrier layer 22. In this case, the detection becomes easier because the value of the MTJ resistance becomes twice.

However, the input sections 3 and 4 and the control section 5 may be TMR elements. In this case, it is desirable that the TMR element has a low resistance value. Also, the output section 2 may be a GMR element.

It is desirable that the memory layer A 33 and the memory layer B 43 have perpendicular magnetic anisotropy, and contains at least one material selected from Fe, Co, and Ni. Moreover, it is possible to be stabilized in the perpendicular magnetic anisotropy by containing Pt and Pd. In addition, by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, and Sm, it is possible to adjust for the desired magnetic property. Specifically, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, Gd—Fe—Co, Tb—Fe—Co, Gd—Tb—Fe—Co, and so on, are exemplified. Besides, it is possible to attain the magnetic anisotropy in a perpendicular direction by alternately laminating the layer containing a material selected from Co, Fe, and Ni and a different layer. Specifically, a laminate layer in which Co/Pd, Co/Pt, Co/Ni, or Fe/Au are alternately laminated is exemplified. Also, the above-mentioned ferromagnetic material and anti-ferromagnetic material such as PtMn, NiMn, and FeMn can be use for the pinned layers 31 and 41.

The sensor layer 23 and bias layer 53 which have in-plane magnetic anisotropy, are formed of ferromagnetic material which contains at least one material selected from Co, Fe, and Ni. In addition, by adding B, C, N, O, Al, Si, P, Ti, V, Cr, Mn, Cu, Zn, Zr, Nb, Mo, Tc, Ru, Rh, Ag, Hf, Ta, W, Re, Os, Ir, and Au, it is possible to adjust the magnetic property for the desired property. Specifically, Ni—Fe, Co—Fe, Fe—Co—Ni, Ni—Fe—Zr, Co—Fe—B, Co—Fe—Zr—B, and so on, are exemplified. Also, the above-mentioned ferromagnetic material and anti-ferromagnetic materials such as PtMn, NiMn, and FeMn are used for the reference layer 21 and the pinned layer 51.

Various materials can be used for the intermediate layers 32, 42, and 52. For example, an electric conductor such as Al, Cr, and Cu can be used. Also, insulation like Mg—O may be used. The input sections 3 and 4 and the intermediate layers 32, 42 and 52 in the control section 5 exist on the route of the write current, to be mentioned later. Generally, it is desirable that the resistance in the write current route is low. At this point, the low resistance material is desirable. On the other hand, if the intermediate layers 32, 42 and 52 have filtering effect to primarily pass one of the types of spin polarized electrons, the current density required for the write is reduced. With this, Mg—O is suitable. Also, it is desirable that the barrier layer 22 is formed of insulating material. As the concrete material, Mg—O, Al—O, Al—N, Ni—O, Hf—O, and so on are exemplified. However, semiconductor and metal can be used as the material.

The memory layer A 33 in the input section 3 and the memory layer B 43 in the input section 4 are connected with the lower surface of the metal layer 6 which extends in the direction of x at the upper surfaces (the side of the direction of +z). The sensor layer 23 in the output section 2 is connected with the upper surface of the metal layer 6 at the lower surface (the direction of −z). The reference layer 21 in the output section 2 is connected with the lower surface of the metal layer 7 at the upper surfaces. The bias layer 53 in control layer 5 is connected with the upper surface of the metal layer 7 at the lower surface. The metal layer 6 is connected with a common terminal (Com) 66. The metal layer 7 is connected with an output terminal (Out) 67. The pinned layer 31 in the input section 3 is connected with first input terminal (IN1) 63. The pinned layer 41 in the input section 4 is connected with second input terminal (IN2) 64. The pinned layer 51 in the control section 5 is connected with control terminal (Control) 65.

It should be noted that the metal layer 6, the metal layer 7, the common terminal 66, the output terminal 67, the first input terminal 63, the second input terminal 64, and the control terminal 65 are formed of material which is used for usual wiring in a semiconductor device such as Cu, Al, and W and the terminal (the via) and so on.

Figure 2C:
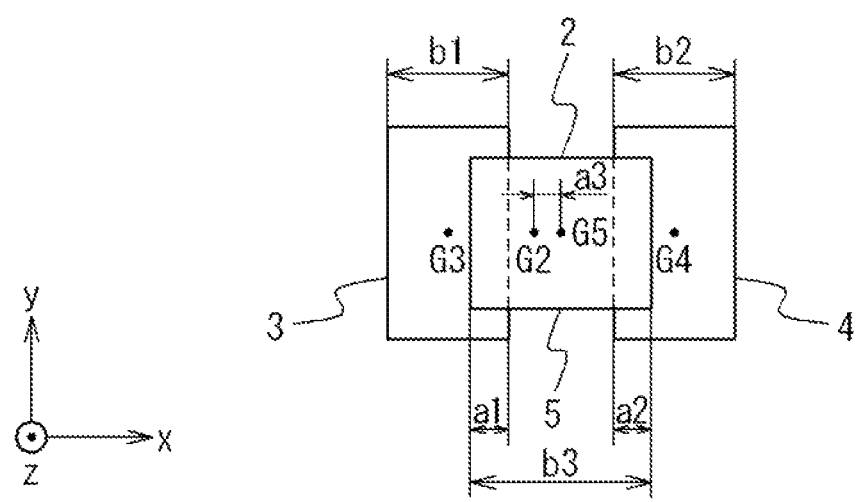
FIG. 2C is a plan view schematically showing the structure of a main portion of the non-volatile logic circuit according to the first exemplary embodiment of the present invention.

FIG. 2C is a plan view schematically showing the structure of a main portion in the non-volatile logic circuit according to the first exemplary embodiment of the present invention. This figure shows the positions of the centers of gravity G3, G4, G5, and G2 in projections of the input sections 3 and 4, the control section 5, and the output section 2 when the input sections 3 and 4 (the memory layer A 33, and the memory layer B 43), the control section 5 (the bias layer 53), and the output section 2 (the sensor layer 23) are projected onto the xy plane which contains a bottom plane of the output section 2. That is, the position relation of the centers of gravity G3, G4, G5, and G2 of the input sections 3 and 4, the control section 5 and the output sections 2 on the xy plane is shown. The center of gravity in this case is the center of gravity on the xy plane in the geometrical meaning. That is, when the position vector of an optional point i in a geometric shape is $$Ri=(Xi, Yi),$$

the position vector Rg=(Xg, Yg) of the center of gravity satisfies the relation of:

$$\Sigma i(Ri-Rg)=0.$$

Here, $\Sigma i$ means a summation of i. For example, in case of a rectangle and parallelogram, the center of gravity is in a point of intersection of the diagonals and in case of the elliptical form, the center of gravity is the center.

As shown in the figure, the centers of gravity G3 and G4 of the input sections 3 and 4 (the memory layer A 33, and the memory layer B 43) and the center of gravity G2 of the output section 2 (the sensor layer 23) are shifted on the xy plane. In other words, in the xy plane, the center of gravity G3 of the input section 3 is shifted in the direction of −x from the center of gravity G2 of the output section 2 and the center of gravity G4 of the input section 4 is shifted in the direction of +x from the center of gravity G2 of the output section. Thus, it is desirable that the input sections 3 and 4 and the output section 2 overlap in at least a part in the direction of +x. That is, supposing that the widths of the input sections 3 and 4 in the direction of x are b1 and b2, it is desirable that the overlap parts a1 and a2 respectively meet the conditions of $0 < a1 \leq b1/2$ and $0 < a2 \leq b2/2$.

Also, as shown in the figure, the center of gravity G5 of the control section 5 (the bias layer 53) and the center of gravity G2 of the output section 2 (the sensor layer 23) are adjacent to each other on the xy plane. Thus, it is desirable that the center of gravity G5 of the control section 5 and the center of gravity G2 of the output section 2 overlap substantially. That is, supposing that the widths of the control section 5 and the output section 2 in the direction of x are b3, it is desirable that a distance a3 between the centers of gravity meets the condition of $0 \leq a3 \leq b3/2$.

In the above position relation, the leakage magnetic fields from the input sections 3 and 4 (the memory layer A 33, the memory layer B 43) and the control section 5 (the bias layer 53) have an influence on the output section 2 (the sensor layer 23), to change the magnetization state, to be mentioned later. It should be noted that in an example of this figure, the xy sectional shapes of the input sections 3 and 4, the control section 5 and the output section 2 are rectangular. However, the present invention is not limited to this example and may have another sectional shape, if the later mentioned change in magnetization state is possible.

2. Magnetization State of Non-Volatile Logic Circuit

Next, possible magnetization states of the non-volatile logic circuit according to the first exemplary embodiment of the present invention will be described. FIG. 3A to FIG. 3H are sectional views showing examples of the magnetization states of the non-volatile logic circuit according to the first exemplary embodiment of the present invention. First, FIG. 3A to FIG. 3D are described. However, in the following description, the states shown in FIG. 3A to FIG. 3D are referred to as a "state $\alpha 1$ to state $\alpha 4$", respectively. The magnetization direction of the bias layer 53 in the control section 5 is a direction of +x in the state $\alpha 1$ to the state $\alpha 4$.

As shown in FIG. 3A, in a case of the state $\alpha 1$, the magnetization direction of the memory layer A 33 in the input section 3 turns to the direction of +z. The magnetization of the memory layer B 43 in the input section 4 turns to the direction of +z. The magnetization direction of the bias layer 53 in the control section 5 turns to the direction of +x. Therefore, the memory layer A 33 generates a leakage magnetic field Hst1 which goes out upwardly (in the direction of +z), passes through the sensor layer 23 substantially to the direction of +x and returns downwardly (in the direction of −z). Also, the memory layer B 43 generates a leakage magnetic field Hst2 which goes out upwardly, passes through the sensor layer 23 substantially to the direction of −x and returns downwardly. Moreover, the bias layer 53 generates the leakage magnetic field Hcontrol which goes in the right direction (in the direction of +x), passes through the sensor layer 23 substantially to the direction of −x and returns in the left direction (in the direction of −x).

Figure 3C:
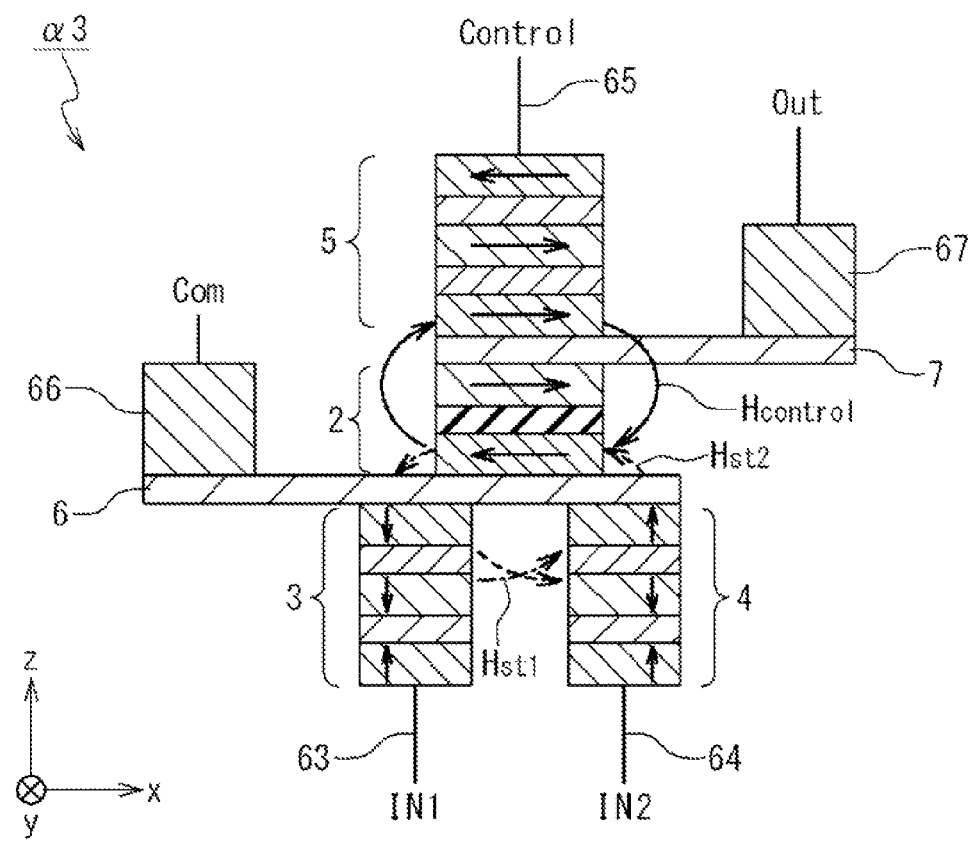
FIG. 3C is a sectional view showing the example of the magnetization state of the non-volatile logic circuit according to the first exemplary embodiment of the present invention.
Figure 4:
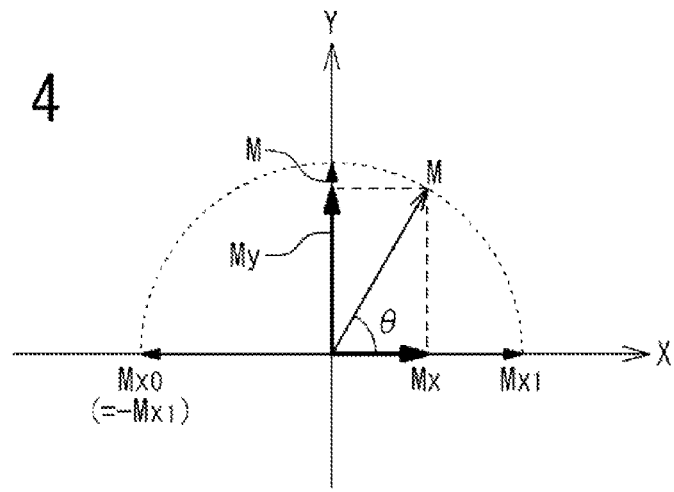
FIG. 4 is a diagram schematically showing an example of a relation between a component of the magnetization in the direction of x and a magnetization direction of a sensor layer in an xy plane in the first exemplary embodiment of the present invention.

FIG. 4 is a diagram schematically showing an example of a relation of the magnetization direction of the sensor layer in the xy plane and a component of the magnetization in the direction of x in the first exemplary embodiment of the present invention. The vertical axis shows the direction of the y-axis and the horizontal axis shows the direction of the x-axis. In the sensor layer 23, the direction of y is a direction of the magnetization easy axis. Therefore, when there is not any influence of another magnetic field, the direction of the magnetization direction M of the sensor layer 23 turns to the direction of y and does not have a component in the direction of x. However, the sensor layer 23 undergoes influence due to the magnetic field Hs obtained by synthesizing the leakage magnetic field Hst1, the leakage magnetic field Hst2 and the leakage magnetic field Hcontrol. Undergoing influence due to such a synthetic magnetic field Hs, the direction of the magnetization M of the sensor layer 23 turns from the direction of y according to the direction and strength of the synthetic magnetic field Hs. In an example of this figure, the magnetization M of the sensor layer 23 shifting by the angle θ (θ≠90 degrees) from the direction of +x through the turn and the magnetization M=(Mx, My)=(M*cos θ, M*sin θ). That is, the magnetization M has a component Mx in the direction of x corresponding to the strength of the synthetic magnetic field Hs. A range of Mx is from Mx1 (θ=0 degrees) to Mx0 (=−Mx1; θ=180 degrees). In case of FIG. 3A, the direction of the magnetization M of the sensor layer 23 has a component in the direction of −x. The strength and so on will be described later.

In the same way, as shown in FIG. 3B, the magnetization direction of the memory layer A 33 in the input section 3 turns to the direction of +z in case of the state α2. The magnetization direction of the memory layer B 43 in the input section 4 turns to the direction of −z. The magnetization direction of the bias layer 53 in the control section 5 turns to the direction of +x. Therefore, the memory layer A 33 generates the leakage magnetic field Hst1 which goes out upwardly, passes through the sensor layer 23 substantially to the direction of +x, and returns downwardly. Also, the memory layer B 43 generates the leakage magnetic field Hst2 which goes out downwardly, returns upwardly, and passes through the sensor layer 23 substantially to the direction of +x. Moreover, the bias layer 53 generates the leakage magnetic field Hcontrol which goes in the right direction, passes through the sensor layer 23 to substantially the direction of −x, and returns in the left direction. As a result, the direction of the magnetization M of the sensor layer 23 has a component in the direction of +x due to synthetic magnetic field Hs in case of FIG. 3B, in the same way of the description with reference to FIG. 4. The strength will be described later.

In the same way, as shown in FIG. 3C, in case of the state α3, the magnetization direction of the memory layer A 33 in the input section 3 turns to the direction of −z. The magnetization direction of the memory layer B 43 in the input section 4 turns to the direction of +z. The magnetization direction of the bias layer 53 in the control section 5 turns to the direction of +x. Therefore, the memory layer A 33 generates the leakage magnetic field Hst1 which goes out downwardly, returns upwardly, and passes through the sensor layer 23 substantially to the direction of −x. Also, the memory layer B 43 generates the leakage magnetic field Hst2 which goes out upwardly, passes through the sensor layer 23 substantially to the direction of −x, and returns downwardly. Moreover, the bias layer 53 generates the leakage magnetic field Hcontrol which goes in the right direction, passes through the sensor layer 23 substantially to the direction of −x and returns to its left portion. As a result, as described with reference to FIG. 4, in case of FIG. 3C, the direction of the magnetization M of the sensor layer 23 has a component in the direction of −x due to the synthetic magnetic field Hs. The strength and so on will be described later.

In the same way, as shown in FIG. 3D, in case of the state α4, the magnetization direction of the memory layer A 33 in the input section 3 turns to the direction of −z. The magnetization direction of the memory layer B 43 in the input section 4 turns to the direction of −z. The magnetization direction of the bias layer 53 in the control section 5 turns to the direction of +x. Therefore, the memory layer A 33 generates the leakage magnetic field Hst1 which goes out downwardly, returns upwardly, and passes through the sensor layer 23 substantially to the direction of −x. Also, the memory layer B 43 generates the leakage magnetic field Hst2 which goes out downwardly, returns upwardly, and passes through the sensor layer 23 substantially to the direction of +x. Moreover, the bias layer 53 generates the leakage magnetic field Hcontrol which goes in the right direction, passes through the sensor layer 23 substantially to the direction of −x, and returns to its left portion. As a result, as described with reference to FIG. 4, in case of the FIG. 3D, the direction of the magnetization M of the sensor layer 23 has a component in the direction of −x due to synthetic magnetic field Hs. The strength and so on will be described later.

Next, FIG. 3E to FIG. 3H are described. Here, the states shown in FIG. 3E to FIG. 3H are referred to as a state β1 to a state β4 in the following description, respectively The magnetization direction of the bias layer 53 in the control section 5 is the direction of −x in the state β1 to the state β4.

As shown in FIG. 3E, in case of the state β1, the magnetization direction of the memory layer A 33 in the input section 3 turns to the direction of +z. The magnetization direction of the memory layer B 43 in the input section 4 turns to the direction of +z. The magnetization direction of the bias layer 53 in the control section 5 turns to the direction of −x. Therefore, the memory layer A 33 generates the leakage magnetic field Hst1 which goes out upwardly, passes through the sensor layer 23 substantially in the direction of +x and returns downwardly. Also, the memory layer B 43 generates the leakage magnetic field Hst2 which goes out upwardly, passes through the sensor layer 23 substantially to the direction of −x and returns downwardly. Moreover, the bias layer 53 generates the leakage magnetic field Hcontrol which goes out in the left direction (in the direction of −x), passes through the sensor layer 23 substantially to the direction of +x and returns in the right direction (in the direction of +x). As a result, in case of FIG. 3E, the magnetization of the memory layer A 33 has a component in the direction of +x due to synthetic magnetic field Hs, as in the description of FIG. 4. The strength and so on will be described later.

Figure 3F:
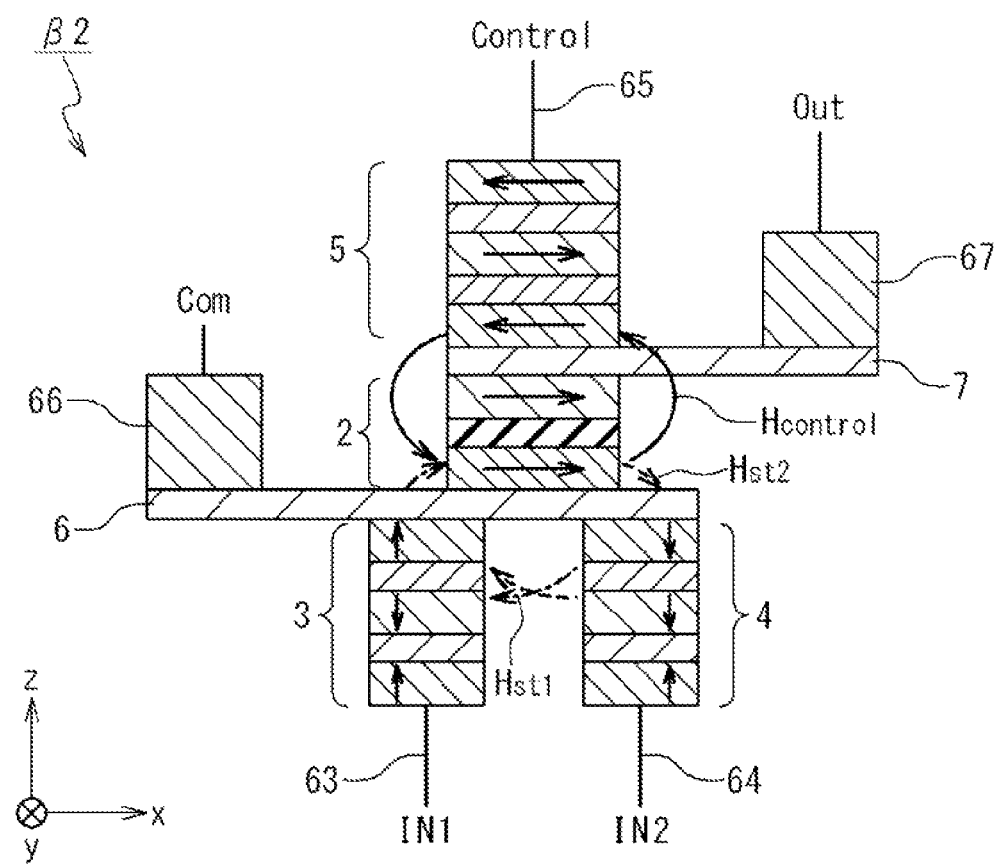
FIG. 3F is a sectional view showing the example of the magnetization state of the non-volatile logic circuit according to the first exemplary embodiment of the present invention.

As shown in FIG. 3F, similarly, in case of the state β2, the magnetization direction of the memory layer A 33 in the input section 3 turns to the direction of +z. The magnetization direction of the memory layer B 43 in the input section 4 turns to the direction of −z. The magnetization direction of the bias layer 53 in the control section 5 turns to the direction of −x. Therefore, the memory layer A 33 generates a leakage magnetic field Hst1 which goes out upwardly, passes through the sensor layer 23 substantially to the direction of +x and returns downwardly. Also, the memory layer B 43 generates the leakage magnetic field Hst2 which goes out downwardly, returns upwardly, and passes through the sensor layer 23 substantially to the direction of +x. Moreover, the bias layer 53 generates the leakage magnetic field Hcontrol which goes out in the left direction, passes through the sensor layer 23 substantially to the direction of +x and returns in the right direction. As a result, as in the description of FIG. 4, the magnetization of the memory layer A 33 has a component in the direction of +x due to synthetic magnetic field Hs in case of FIG. 3F. The strength and so on will be described later.

In the same way, as shown in FIG. 3G, in case of the state β3, the magnetization direction of the memory layer A 33 in the input section 3 turns to the direction of −z. The magnetization direction of the memory layer B 43 in the input section 4 turns to the direction of +z. The magnetization direction of the bias layer 53 in the control section 5 turns to the direction of −x. Therefore, the memory layer A 33 generates the leakage magnetic field Hst1 which goes out downwardly, returns upwardly, and passes through the sensor layer 23 substantially to the direction of −x. Also, the memory layer B 43 generates the leakage magnetic field Hst2 which goes out upwardly, passes through the sensor layer 23 substantially to the direction of −x and returns downwardly. Moreover, the bias layer 53 generates the leakage magnetic field Hcontrol which goes out in the left direction, passes through the sensor layer 23 substantially to the direction of +x and returns in the right direction. As a result, in case of FIG. 3G, the magnetization of the memory layer A 33 has a component in the direction of −x due to synthetic magnetic field Hs, as in the description of FIG. 4. The strength and so on will be described later.

Figure 3H:
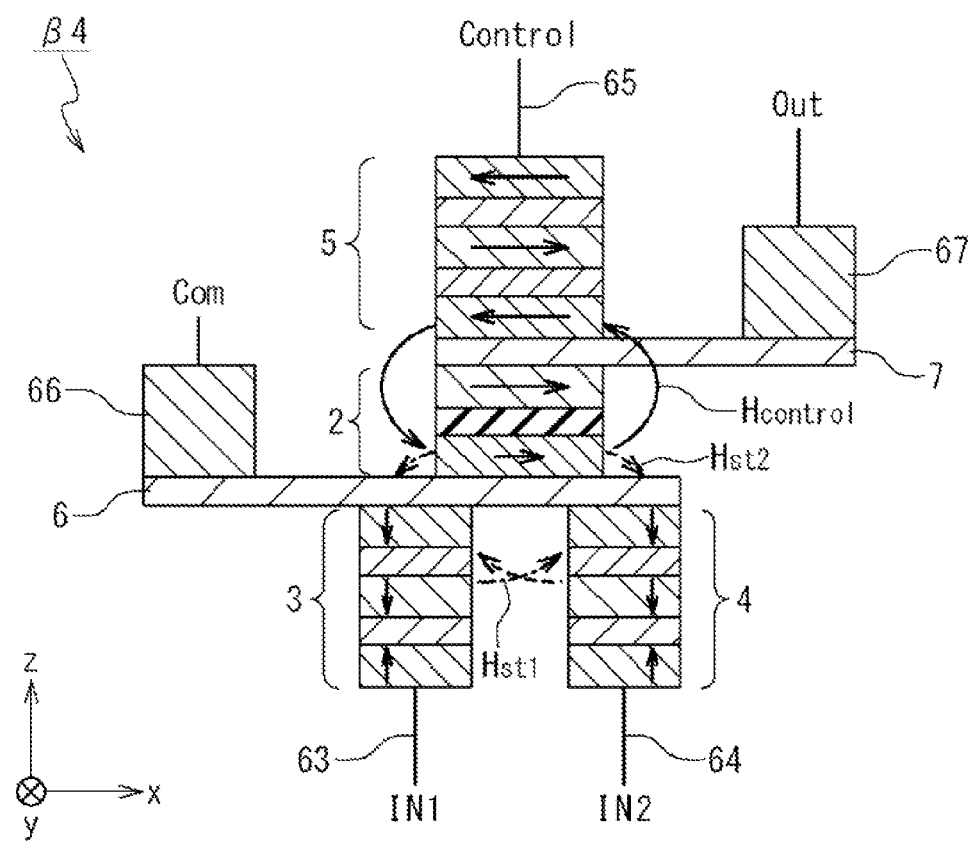
FIG. 3H is a sectional view showing the example of the magnetization state of the non-volatile logic circuit according to the first exemplary embodiment of the present invention.

In the same way, as shown in FIG. 3H, in case of the state β4, the magnetization direction of the memory layer A 33 in the input section 3 turns to the direction of −z. The magnetization direction of the memory layer B 43 in the input section 4 turns to the direction of −z. The magnetization direction of the bias layer 53 in the control section 5 turns to the direction of −x. Therefore, the memory layer A 33 generates the leakage magnetic field Hst1 which goes out upwardly, returns upwardly, and passes through the sensor layer 23 substantially to the direction of −x. Also, the memory layer B 43 generates the leakage magnetic field Hst2 which goes out downwardly, returns upwardly, and passes through the sensor layer 23 substantially to the direction of +x. Moreover, the bias layer 53 generates the leakage magnetic field Hcontrol which goes out in the left direction, passes through the sensor layer 23 substantially to the direction of +x and returns in the right direction. As a result, in case of FIG. 3H, the magnetization of the memory layer A 33 has a component in the direction of +x due to synthetic magnetic field Hs, as in the description of FIG. 4. The strength and so on will be described later.

In this way, the magnetization direction of the sensor layer 23 changes due to the synthetic magnetic field Hs obtained by synthesizing the leakage magnetic field Hst1, the leakage magnetic field Hst2 and the leakage magnetic field Hcontrol, and can have a component Mx of a plurality of types in direction of x. At this time, the leakage magnetic field Hcontrol from the bias layer 53 in FIG. 3A to FIG. 3D functions as a bias magnetic field in the synthetic magnetic field Hs. Also, the leakage magnetic field Hcontrol from the bias layer 53 in FIG. 3E to FIG. 3H functions as a bias magnetic field in the synthetic magnetic field Hs.

3. Operation Principle of Non-Volatile Logic Circuit

Figure 5:
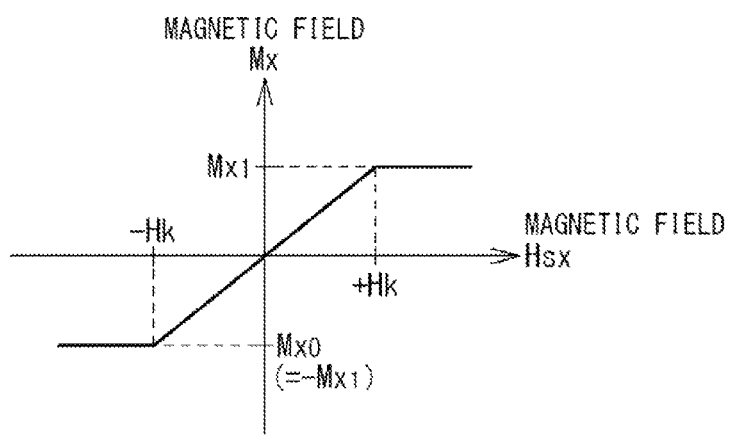
FIG. 5 is a graph showing a relation between a component of the magnetization of the sensor layer in the direction of x and a component of a synthetic magnetic field in the direction of x in the first exemplary embodiment of the present invention.

Next, an operation principle of the non-volatile logic circuit according to the first exemplary embodiment of the present invention will be described. FIG. 5 is a graph showing a relation between a component of the magnetization of the sensor layer in the direction of x and a component of the synthetic magnetic field in the direction of x in the first exemplary embodiment of the present invention. The vertical axis shows the component Mx of the magnetization M of the sensor layer 23 in the direction of x, and the horizontal axis shows the component Hsx of the synthetic magnetic field Hs in the direction of x. Magnetic field ±Hk shows a saturated magnetic field of the sensor layer 23. As mentioned previously, the magnetization M of the sensor layer 23 has the component Mx in the direction of x according to the synthetic magnetic field Hs. The Mx is substantially proportional to the Hsx in the range where the component Hsx of the synthetic magnetic field Hs in the direction of x meets an equation of $-Hk \leq Hsx \leq +Hk$ as shown in figure. The Mx takes Mx0 $(=-Mx1) \leq Hsx \leq Mx1$ about the range. Therefore, one Mx can be assigned to one Hsx. That is, one data can be written in the sensor layer 23 in accordance with the applied component Hsx.

Figure 6:
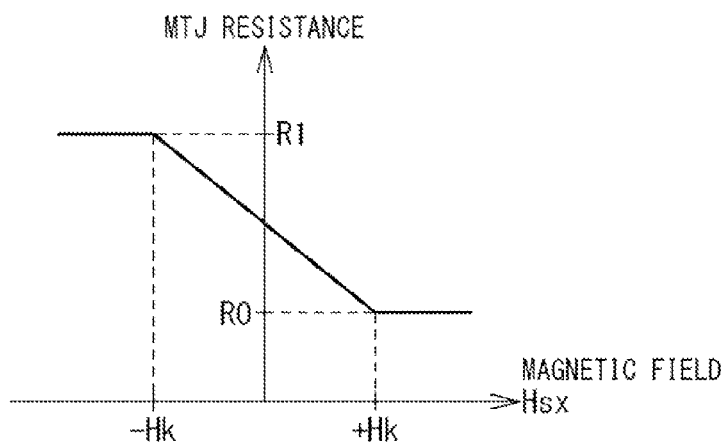
FIG. 6 is a graph showing a relation between a magnetic tunnel junction resistance in an output section and a component of the synthetic magnetic field in the direction of x in the first exemplary embodiment of the present invention.

FIG. 6 is a graph showing a relation between the resistance of the magnetic tunnel junction in the output section and the component of the synthetic magnetic field in the direction of x in the first exemplary embodiment of the present invention. The vertical axis shows the resistance of magnetic tunnel junction (MTJ) in the output section 2 and the horizontal axis shows the component Hsx of the synthetic magnetic field Hs in the direction of x. The resistance of MTJ in the output section 2 becomes maximum R1 at the time of Hsx=−Hk. Here, Hsx=−Hk is met when Mx=Mx0=−Mx1 from FIG. 5 and when the direction of the magnetization M of the sensor layer 23 is the direction of −x, as seen from FIG. 4. That is, it is met when the direction of the magnetization M of the sensor layer 23 is in an anti-parallel relation with the magnetization direction of the reference layer 21. On the other hand, the resistance of MTJ becomes minimum R0 at the time of Hsx=+Hk. Here, Hsx=+Hk is met when Mx=Mx1 from FIG. 5 and when the direction of the magnetization M of the sensor layer 23 is the direction of +x from FIG. 4. That is, it is met when the magnetization direction of the sensor layer 23 is in a parallel relation with the magnetization direction of the reference layer 21. If considering the above, due to the magnetic field Hsx applied to the sensor layer 23, the MTJ resistance is determined as follows:

$$\text{MTJ resistance} = R1 : Hsx < -Hk$$

$$\text{MTJ resistance} = (R0-R1) \cdot Hsx/2Hk + (R0+R1)/2 :$$

$$-Hk < Hsx < +Hk$$

$$\text{MTJ resistance} = R0 : Hsx > +Hk$$

Therefore, by setting Hsx to a range to meet $-Hk < Hsx < +Hk$, one MTJ resistance can be assigned to one Hsx. The data written in the sensor layer 23 in correspondence to the applied magnetic field Hsx can be read as a value of the MTJ resistance.

FIG. 7A and FIG. 7B are a table showing a relation of the magnetization directions of the memory layers A and B, the magnetization direction of the bias layer, and synthetic magnetic field Hsx in the first exemplary embodiment of the present invention. However, FIG. 7A shows a case where the magnetization direction of the bias layer 53 in the control section 5 is the direction of +x. On the other hand, FIG. 7B shows a case where the magnetization direction of the bias layer 53 is the direction of +x.

As mentioned previously, the synthetic magnetic field Hsx applied to the sensor layer 23 is shown as follows:

Hsx=

Leak magnetic field Hst1 from memory layer A 33

+Leak magnetic field Hst2 from memory layer B 43

+Leak magnetic field Hcontrol from bias layer 53

Here, it is assumed that the values of the leakage magnetic fields (the components in the direction of x) from the memory layer A 33 and the memory layer B 43 are s in an either case and the value of the leakage magnetic field (the component in the direction of x) from the bias layer 53 is b. At that time, the relation of the magnetization directions of the memory layer A 33 and the memory layer B 43, the magnetization direction of the bias layer 53 and the synthetic magnetic field Hsx in the state α1 to the state α4 shown in FIG. 3A to FIG. 3D is as shown in FIG. 7A. The relation of the state β1 to the state β4 shown in FIG. 3E to FIG. 3H is as shown in FIG. 7B.

As shown in FIG. 7A, first, in the state α1, the magnetization direction of the memory layer A 33 turns to the direction of −z, the magnetization direction of the memory layer B 43 turns to the direction of +z, and the magnetization direction of the bias layer 53 turns to the direction of +x (reference to FIG. 3A). Therefore, the leakage magnetic field Hst1 from the memory layer A 33 passes through the sensor layer 23 substantially to the direction of +x (=+s). Also, the leakage magnetic field Hst2 from the memory layer B 43 passes through the sensor layer 23 substantially to the direction of −x (=−s). Moreover, the leakage magnetic field Hcontrol from the bias layer 53 passes through the sensor layer 23 substantially to the direction of −x (=−b). Therefore, the synthetic magnetic field Hsx is −b (=+s−s−b).

Also, in the state α2, the magnetization direction of the memory layer A 33 turns to the direction of +z, the magnetization direction of the memory layer B 43 turns to the direction of and the magnetization direction of the bias layer 53 turns to the direction of +x (reference to FIG. 3B). Therefore, the leakage magnetic field Hst1 from the memory layer A 33 passes through the sensor layer 23 substantially to the direction of +x (=+s). Also, the leakage magnetic field Hst2 from the memory layer B 43 passes through the sensor layer 23 substantially to the direction of +x (=+s). Moreover, the leakage magnetic field Hcontrol from the bias layer 53 passes through the sensor layer 23 substantially to the direction of −x (=−b). Therefore, the synthetic magnetic field Hsx is +2s−b (=+s+s−b).

Also, in the state α3, the magnetization direction of the memory layer A 33 turns to the direction of −z, the magnetization direction of the memory layer B 43 turns to the direction of +z, and the magnetization direction of the bias layer 53 turns to the direction of +x (reference to FIG. 3C). Therefore, the leakage magnetic field Hst1 from the memory layer A 33 passes through the sensor layer 23 substantially to the direction of −x (=−s). Also, the leakage magnetic field Hst2 from the memory layer B 43 passes through the sensor layer 23 substantially to the direction of −x (=−s). Moreover, the leakage magnetic field Hcontrol from the bias layer 53 passes through the sensor layer 23 substantially to the direction of −x (=−b). Therefore, the synthetic magnetic field Hsx is −2s−b (=−s−s−b).

Also, in the state α4, the magnetization direction of the memory layer A 33 turns to the direction of −z, the magnetization direction of the memory layer B 43 turns to the direction of −z, and the magnetization direction of the bias layer 53 turns to the direction of +x (reference to FIG. 3D). Therefore, the leakage magnetic field Hst1 from the memory layer A 33 passes through the sensor layer 23 substantially to the direction of −x (=−s). Also, the leakage magnetic field Hst2 from the memory layer B 43 passes through the sensor layer 23 substantially to the direction of +x (=+s). Moreover, the leakage magnetic field Hcontrol from the bias layer 53 passes through the sensor layer 23 substantially to the direction of −x (=−b). Therefore, the synthetic magnetic field Hsx is −b (=−s+s−b).

Similarly, as shown in FIG. 7B, in the first state β1, the magnetization direction of the memory layer A 33 turns to the direction of +z, the magnetization direction of the memory layer B 43 turns to the direction of +z, and the magnetization direction of the bias layer 53 turns to the direction of −x (reference to FIG. 3E). Therefore, the leakage magnetic field Hst1 from the memory layer A 33 passes through the sensor layer 23 substantially to the direction of +x (=+s). Also, the leakage magnetic field Hst2 from the memory layer B 43 passes through the sensor layer 23 substantially to the direction of −x (=−s). Moreover, the leakage magnetic field Hcontrol from the bias layer 53 passes through the sensor layer 23 substantially to the direction of +x (=+b). Therefore, the synthetic magnetic field Hsx is +b (=+s−s+b).

Also, in the state β2, the magnetization direction of the memory layer A 33 turns to the direction of +z, the magnetization direction of the memory layer B 43 turns to the direction of −z, and the magnetization direction of the bias layer 53 turns to the direction of −x (reference to FIG. 3F). Therefore, the leakage magnetic field Hst1 from the memory layer A 33 passes through the sensor layer 23 substantially to the direction of +x (=+s). Also, the leakage magnetic field Hst2 from the memory layer B 43 passes through the sensor layer 23 substantially to the direction of +x (=+s). Moreover, the leakage magnetic field Hcontrol from the bias layer 53 passes through the sensor layer 23 substantially to the direction of +x (=+b). Therefore, the synthetic magnetic field Hsx is +2s+b (=+s+s+b).

Also, in the state β3, the magnetization direction of the memory layer A 33 turns to the direction of −z, the magnetization direction of the memory layer B 43 turns to the direction of +z, and the magnetization direction of the bias layer 53 turns to the direction of −x (reference to FIG. 3G). Therefore, the leakage magnetic field Hst1 from the memory layer A 33 passes through the sensor layer 23 substantially to the direction of −x (=−s). Also, the leakage magnetic field Hst2 from the memory layer B 43 passes through the sensor layer 23 substantially to the direction of −x (=−s). Moreover, the leakage magnetic field Hcontrol from the bias layer 53 passes through the sensor layer 23 substantially to the direction of +x (=+b). Therefore, the synthetic magnetic field Hsx is −2s+b (=−s−s+−b).

Also, in the state β4, the magnetization direction of the memory layer A 33 turns to the direction of −z, the magnetization direction of the memory layer B 43 turns to the direction of −z, and the magnetization direction of the bias layer 53 turns to the direction of −x (reference to FIG. 3H). Therefore, the leakage magnetic field Hst1 from the memory layer A 33 passes through the sensor layer 23 substantially to the direction of −x (=−s). Also, the leakage magnetic field Hst2 from the memory layer B 43 passes through the sensor layer 23 substantially to the direction of +x (=+s). Moreover, the leakage magnetic field Hcontrol from the bias layer 53 passes through the sensor layer 23 to the direction of +x substantially (=+b). Therefore, the synthetic magnetic field Hsx becomes +b (=−s+s+b).

In this way, the synthetic magnetic field Hsx of the leakage magnetic fields (the components in the direction of x) from the respective layers is made to correspond to each of the state α1 to the state α4 (FIG. 7A) and the state β1 to the state β4 (FIG. 7B) corresponding to a combination of the magnetization state of the memory layer A 33, the magnetization state of the memory layer B 43 and the magnetization state of the bias layer 53.

Figure 8:
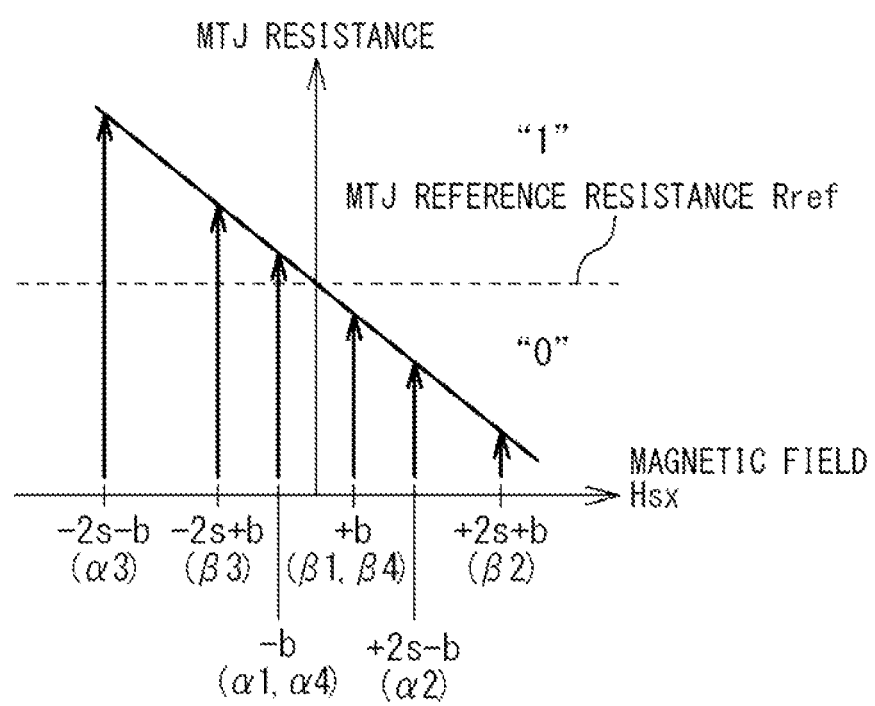
FIG. 8 is a graph showing a relation between the magnetic tunnel junction resistance in the output section and a component of the synthetic magnetic field in the direction of x in the first exemplary embodiment of the present invention.

FIG. 8 is a graph showing a relation between the resistance of the magnetic tunnel junction in the output section and a component of the synthetic magnetic field in the direction of x in the first exemplary embodiment of the present invention. The vertical axis shows the resistance of magnetic tunnel junction (MTJ) in the output section 2 and the horizontal axis shows the synthetic magnetic field Hs component Hsx in the direction of x. One MTJ resistance is determined to the synthetic magnetic field Hsx for the state α1 to the state α4 and the state β1 to the state β4 described with reference to FIG. 7A to FIG. 7B, as shown in FIG. 5 and FIG. 6. At this time, if setting the MTJ reference resistance Rref to read the MTJ resistance, it is possible to assign "1" to the states α1, α3, α4, β3 and to set "0" to the states α2, β1, β2, β4, respectively.

FIG. 9A and FIG. 9B are tables showing a relation between the magnetization directions of the memory layers A and B, the magnetization direction of the bias layer and the input/output data in the first exemplary embodiment of the present invention. However, FIG. 9A shows a case that the magnetization direction of the bias layer 53 in the control section 5 is the direction of +x. On the other hand, FIG. 9B shows a case that the magnetization direction of the bias layer 53 is the direction of +x.

Also, "IN1" shows first input data which is inputted (supplied) to the input section 3. The data is set such that the data is "1" when the magnetization direction of the memory layer A 33 is the direction of +z (upward direction arrow) and such that the data is "0" when the magnetization direction of the memory layer A 33 is the direction of −z (downward direction arrow). In relation of the direction (direction of −z) with the magnetization of (the ferromagnetic layer 31a in) the pinned layer 31, the anti-parallel state corresponds to data "1" and the parallel state corresponds to data "0". A method of writing (inputting) data in the input section 3 will be described later.

On the other hand, "IN2" shows a second input data which is inputted (stored) to the input section 4. In "IN2", the direction of +z to the magnetization of the memory layer B 43 is set to data "0" and the direction of −z is set to data "1". In a relation with the direction (direction of −z) of the magnetization of (the ferromagnetic layer 41a in) the pinned layer 41, the anti-parallel state corresponds to data "0" and the parallel state corresponds to data "1", respectively. A method of writing (inputting) each data in the input section 4 will be described later.

The "control" shows control data which is inputted (stored) to the control section 5. The "control" is set such that the direction of +x (right direction arrow) of the magnetization direction of the bias layer 53 corresponds to data "1" and the direction of −x (left direction arrow) corresponds to data "0". In a relation with the magnetization direction of (the ferromagnetic layer 51a in) the pinned layer 51, the parallel state corresponds to data "1" and the anti-parallel state corresponds to data "0". A method of writing (inputting) each data in the input section 4 will be described later.

The "state" shows either of the state α1 to the state α4 shown in FIG. 3A to FIG. 3D, and the state β1 to the state β4 shown in FIG. 3E to FIG. 3H. The "memory layer A" shows the magnetization direction of the memory layer A 33, the "memory layer B" shows the magnetization direction of the memory layer B 43 and the "bias layer C" shows the magnetization direction of the bias layer 53. The "OUT" shows the output data which is written in the output section 2, and the data is "1" when the MTJ resistance in the output section 2 is larger than the MTJ reference resistance Rref shown in FIG. 8, and the data is "0" otherwise.

In the non-volatile logic circuit 1 shown in FIG. 9A, the data "1" is assigned to the control data ("control") in the control section 5. That is, the bias layer 53 ("bias layer C") turns to the direction of +x. In this case, the logical relation of the output "OUT" and two inputs "IN1" and "IN2" becomes a NAND. Therefore, the non-volatile logic circuit 1 functions as an NAND circuit. This is the non-volatile logic circuit 1 shown in FIG. 3A to FIG. 3D.

On the other hand, in the non-volatile logic circuit 1 shown in FIG. 9B, the data "0" is assigned to the control data ("control") in the control section 5. That is, the bias layer 53 ("bias layer C") turns to the direction of −x. In this case, the logical relation of the output "OUT" and two inputs "IN1" and "IN2" becomes a NOR. Therefore, the non-volatile logic circuit 1 functions as the NOR circuit. This is the non-volatile logic circuit 1 shown in FIG. 3E to FIG. 3H.

In this way, the non-volatile logic circuit 1 of the present exemplary embodiment can be used as the NAND circuit or the NOR circuit by controlling the magnetization state of the bias layer 53 (bias layer C). Therefore, a NAND circuit and a NOR circuit can be configured from the non-volatile logic circuits 1 in the present exemplary embodiment, and by combining them, another logic circuit can be provided together.

4. Data Input/Output Principle of Non-Volatile Logic Circuit

Next, the data input/output principle of the non-volatile logic circuit 1 according to the first exemplary embodiment of the present invention will be described. The input of the data to the non-volatile logic circuit 1 is performed by writing data in the GMR elements (or TMR element) of the control section 5 and the input sections 3 and 4. On the other hand, the output of data from the non-volatile logic circuit 1 is performed by reading the data from the TMR element in the output section 2. Hereinafter, the above matters will be described in detail.

Figure 10:
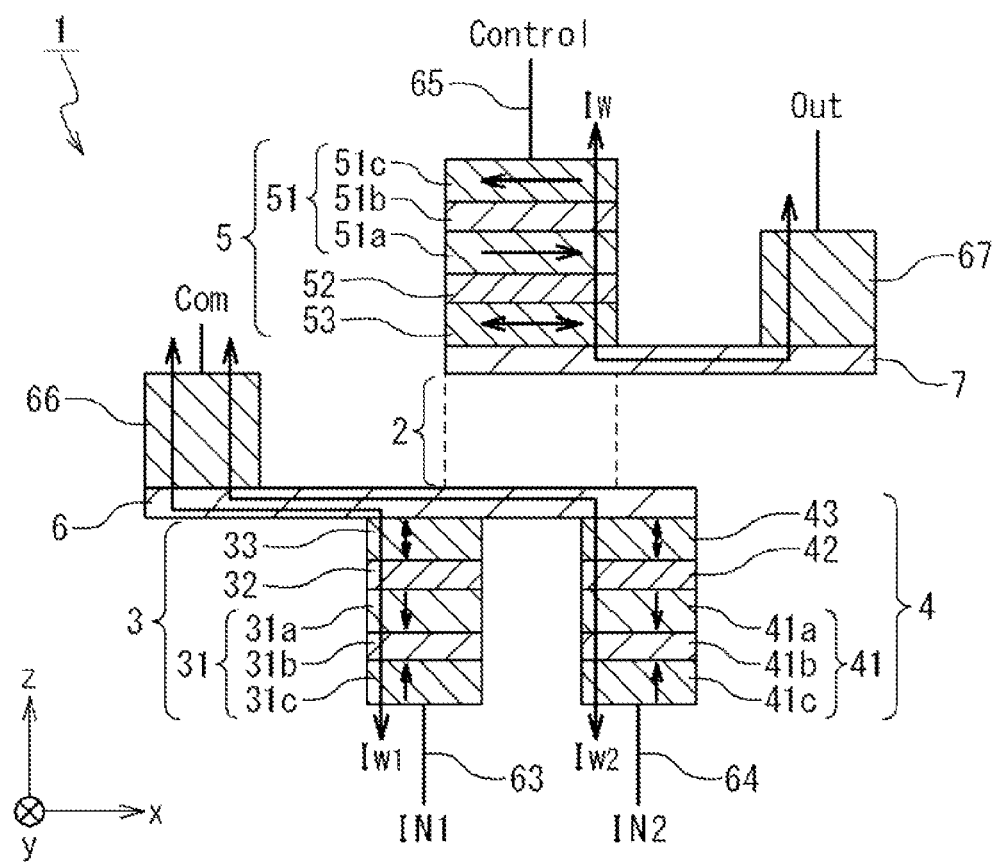
FIG. 10 is a sectional view showing the write principle of data in the first exemplary embodiment of the present invention.

First, the write operations of data in the input section 3, and the memory sections 3 and 4 will be described. FIG. 10 is a sectional view showing the write principle of the data in the first exemplary embodiment of the present invention. In the control section 5, before the non-volatile logic circuit 1 operates, the control data is written previously. By writing the control data, the non-volatile logic circuit 1 can be set to either of the NAND circuit (FIG. 3A to FIG. 3D, FIG. 7A, FIG. 9A) and the NOR circuit (FIG. 3E to FIG. 3H, FIG. 7B, FIG. 9B). On the other hand, the input sections 3 and 4 are supplied with the first input data and the second input data when the non-volatile logic circuit 1 operates.

The write operation of the control data into the control section 5 is carried out in the following way. As mentioned previously, the control section 5 is a spin polarized current write type GMR element. When writing control data in the control section 5, the write current Iw is supplied between the control terminal (control) 65 and the output terminal (Out) 67.

The write current Iw is supplied in the direction corresponding to the control data to be written (the magnetization direction of the bias layer 53). In this case, spin electrons flow in a direction opposite to the direction of the write current Iw.

In an example of this figure, when setting the magnetization direction of the bias layer 53 into the right direction (the direction of +x), the write current flows in direction from the output terminal 67 to the control terminal 65. In this case, the spin electrons flow in a direction from the control terminal 65 to the output terminal 67. As a result, the magnetization direction of the bias layer 53 is changed to the right direction by the spin torque effect due to interaction between the ferromagnetic layer 51a in the pinned layer 51 and the bias layer 53. On the other hand, when setting the magnetization direction of the bias layer 53 into left direction (the direction of −x), the write current flows in a direction from the control terminal 65 to the output terminal 67. In this case, the spin electrons flow in a direction from the output terminal 67 to the control terminal 65. As a result, the magnetization direction of the bias layer 53 is changed to the left direction by the spin torque effect due to the interaction between the ferromagnetic layer 51a and the bias layer 53.

On the other hand, write of an input data into the input sections 3 and 4 is carried out in the following way. The input section 3 is a spin polarized current write type GMR element. When writing first input data in the input section 3, the write current Iw1 is supplied between the first input terminal (IN1) 63 and the common terminal (Com) 66. The write current Iw1 is supplied in the direction corresponding to the first input data to be written (the magnetization direction of the memory layer A 33). In this case, the spin electrons flow in a direction opposite to the direction of the write current Iw1.

In an example of this figure, when setting the magnetization direction of the memory layer A 33 to an upward direction (the direction of +z), the write current flows in the direction from the first input terminal 63 to the common terminal 66. In this case, the spin electrons flow in a direction from the common terminal 66 to the first input terminal 63. As a result, the magnetization direction of the memory layer A 33 is changed to the upward direction by the spin torque effect due to the interaction among the ferromagnetic layer 31a in the pinned layer 31 and the memory layer A 33. On the other hand, when setting the magnetization direction of the memory layer A 33 to a downward direction (the direction of −z), the write current flows in a direction from the common terminal 66 to the first input terminal 63. In this case, the spin electrons flow in a direction from the first input terminal 63 to the common terminal 66. As a result, by the spin torque effect due to the interaction among the ferromagnetic layer 31a and the memory layer A 33, the magnetization direction of the memory layer A 33 is changed to the downward direction.

Moreover, the input section 4 is a spin polarized current write type GMR element. When writing second input data in the input section 4, the write current Iw2 is supplied between the second input terminal (IN2) 64 and the common terminal (Com) 66. Write current Iw2 flows in the direction corresponding to the second input data to be written (magnetization direction of the memory layer B 43). In this case, spin electrons flow in a direction opposite to the direction of the write current Iw2.

In an example of this figure, when setting the magnetization direction of the memory layer B 43 to the upward direction (the direction of +z), the write current is supplied in a direction from the second input terminal 64 to the common terminal 66. In this case, spin electrons flow in a direction from the common terminal 66 to the second input terminal 64. As a result, the magnetization direction of the memory layer B 43 is changed to upward direction by the spin torque effect due to the interaction between the ferromagnetic layer 41a in the pinned layer 41 and the memory layer B 43. On the other hand, when setting the magnetization direction of the memory layer B 43 to the downward direction (the direction of −z), the write current is supplied in a direction from the common terminal 66 to the second input terminal 64. In this case, spin electrons flow in a direction from the second input terminal 64 to the common terminal 66. As a result, the magnetization direction of the memory layer B 43 is changed by the spin torque effect due to the interaction between the ferromagnetic layer 41a and the memory layer B 43.

As mentioned above, the data input to the non-volatile logic circuit 1 is carried out. Through the data input, the magnetization states of the control section 5 and the input sections 3 and 4 are set to reflect their data. As a result, by the leakage magnetic fields from the control section 5 and the input sections 3 and 4 (the synthetic magnetic field Hs), the output data is written in the output section 2, as shown in FIG. 3A to FIG. 3H.

Figure 11:
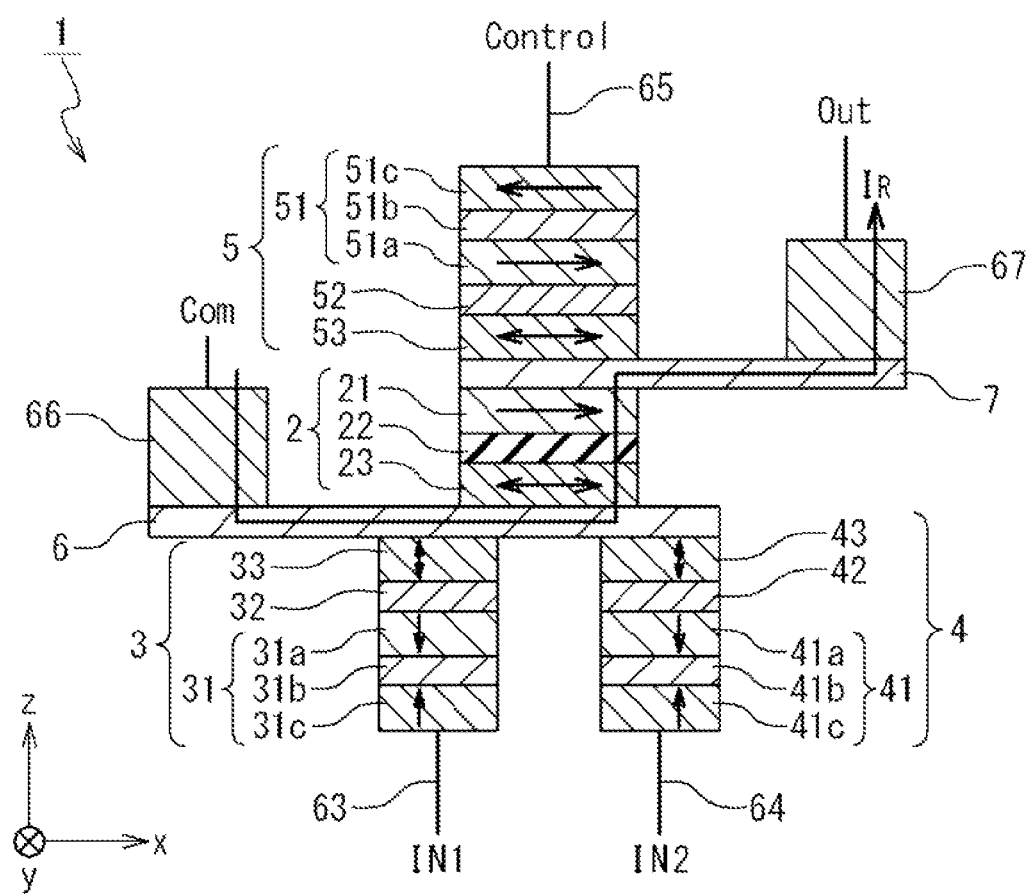
FIG. 11 is a sectional view showing the read principle of data in the first exemplary embodiment of the present invention.

Next, the read of the data from the output section 2 will be described. FIG. 11 is a sectional view showing the principle of data read in the first exemplary embodiment of the present invention. The output section 2 includes a TMR element. As described with reference to FIG. 3A to FIG. 3H, by the leakage magnetic fields (the synthetic magnetic field Hs) from the input sections 3 and 4 and the control section 5, the output section 2 is changed to a magnetization state depending on a combination of the magnetizations states of the input sections 3 and 4 and the control section 5. That is, the magnetization direction of the sensor layer 23 in the output section 2 is changed to the direction depending on a combination of the control data, the first input data and the second input data. As a result, the MTJ resistance in the output section 2 is set to the data depending on a combination of the control data, the first input data and the second input data. In this state, by applying read current IR between the common terminal (Com) 66 and the output terminal (Out) 67, the data of the MTJ resistance can be read. The direction of the read current IR is especially not limited. The MTJ resistance is the output data of the non-volatile logic circuit 1. It should be noted that although being not shown, the end of the output terminal (Out) 67 depends on a case of the write current IW and a case of the read current IR.

5. Logic Gate Using Non-Volatile Logic Circuit

Figure 12:
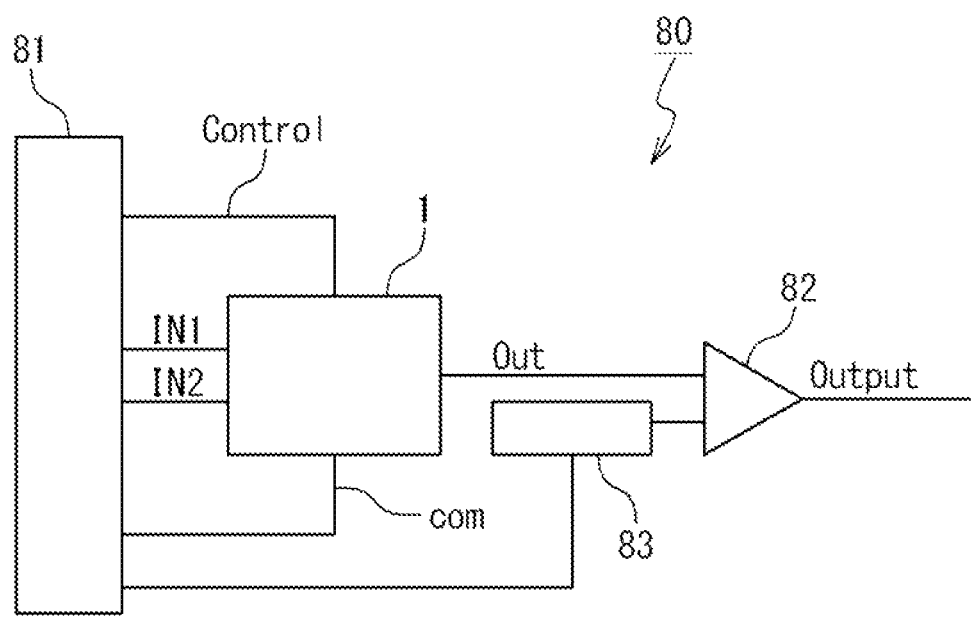
FIG. 12 is a block diagram showing an example of a logic gate in the first exemplary embodiment of the present invention.

Next, the logic gate using the non-volatile logic circuit will be described. FIG. 12 is a block diagram showing an example of the logic gate in the first exemplary embodiment of the present invention. A logic gate 80 is provided with a control circuit 81, the non-volatile logic circuit 1, an MTJ reference element 83 and a comparator 82.

The control circuit 81 is provided with a switch to convert a logic control value into a current. The control circuit 81 generates the write current having a direction and value corresponding to the control data, in response to the supply of the control data, and supplies the current between the control section 5 (control) of the non-volatile logic circuit 1 and the output terminal (Out). Also, the control circuit 81 generate the write current having a direction and value corresponding to the first input data in response to the supply of the first input data, and supplies between the input section 3 (IN1) of the non-volatile logic circuit 1 and the common terminal (Com). In the same way, the control circuit 81 generates the write current having a direction and a value corresponding to the second input data in response to the supply of the second input data, and supplies between the input section 4 (IN2) of the non-volatile logic circuit 1 and the common terminal (Com). Moreover, the control circuit 81 applies an output read current between the common terminal (Com) and the output terminal (Out).

The non-volatile logic circuit 1 is the same as described with reference to FIG. 1 to FIG. 11. That is, an output current (or output voltage) is outputted as the output data by the supply of the read current based on the write current corresponding to the input data from the control circuit 80. For example, the MTJ reference element 83 includes a TMR element MTJ. The MTJ reference element 83 has the MTJ reference resistance Rref shown in FIG. 8 and outputs the reference current (or the reference voltage) corresponding to the MTJ reference resistance Rref under the control of the control circuit 80. The comparator 82 compares a reference current (or reference voltage) and the output current (or output voltage) showing the output data of the non-volatile logic circuit 1 to output a final output data.

Specifically, the control circuit 81 supplies the write current between the control terminal (control) and the output terminal (Out) in the non-volatile logic circuit 1 in response to the input of the control data. The direction of the write current is set such that the magnetization state (the magnetization direction) of the control section 5 (the bias layer 53) is a magnetization state (a magnetization direction) corresponding to the control data. In the same way, the control circuit 81 applies the write current between the first input terminal (IN1) and the common terminal (Com) in the non-volatile logic circuit 1 in response to the input of the first input data. The direction of the write current is set to the direction such that the magnetization state (the magnetization direction) of the input section 3 (the memory layer A 33) is a magnetization state (a magnetization direction) corresponding to the first input data. Also, the control circuit 81 applies the write current between the second input terminal (IN2) and the common terminal (Com) in the non-volatile logic circuit 1 in response to the input of the second input data. The direction of the write current is set to the direction such that the magnetization state (magnetization direction) of the input section 4 (the memory layer B 43) is a magnetization state (a magnetization direction) corresponding to the second input data.

6. Operation Method of Non-Volatile Logic Circuit

Next, an operation method of the non-volatile logic circuit according to the first exemplary embodiment of the present invention will be described. The control circuit 81 writes the control data in the control section 5 before the non-volatile logic circuit 1 operates (Step S1). That is, the control circuit 81 applies the write current Iw between the control terminal (control) 65 and the output terminal (Out) 67. The control circuit 81 applies the write current Iw in the direction corresponding to the control data to be written (the magnetization direction of the bias layer 53). Through the operation, the non-volatile logic circuit 1 can be set as the desired logic circuit (e.g. NAND circuit, NOR circuit).

Next, the control circuit 81 writes a first input data in the input section 3 when the non-volatile logic circuit 1 which is set to a desired logic circuit operates (Step S2). That is, the control circuit 81 applies the write current Iw1 between the first input terminal (IN1) 63 and the common terminal (Com) 66. The control circuit 81 applies the write current Iw1 in the direction corresponding to the first input data to be written (the magnetization direction of the memory layer A 33).

Next, the control circuit 81 writes second input data in the input section 4 (Step S3). That is, the control circuit 81 applies the write current Iw2 between the second input terminal (IN2) 64 and the common terminal (Com) 66. The control circuit 81 applies the write current Iw2 in the direction corresponding to the second input data to be written (the magnetization direction in the memory layer B 43).

After that, the control circuit 81 supplies a read current IR to the output section 2 and supplies a read current to the MTJ reference element 83, too, (Step S4). That is, in the output section 2, the read current IR is supplied between the common terminal (Com) 66 and the output terminal (Out) 67. On the other hand, in the MTJ reference element 83, the read current flows to pass through the MTJ. Thus, the comparator 82 compares the output current from the non-volatile logic circuit 1 (or, the output voltage) and the output current from the MTJ reference element 83 (or, the output voltage) and outputs a comparison result as a final output data (Step S5).

As mentioned above, the non-volatile logic circuit 1 is set to the desirable logic circuit, and the input of the input data to the non-volatile logic circuit 1 and the output of the output data from the non-volatile logic circuit 1 become able to be executed.

The non-volatile logic circuit 1 in the present exemplary embodiment can re-configure the logic by changing the control data supplied to the control section 5. That is, the non-volatile logic circuit 1 in the present exemplary embodiment can realize the re-configurable logic circuit by using a read separation type spin transfer device (control section 5, and memory sections 3 and 4) and the MTJ element (output section 2).

The non-volatile logic circuit in the present exemplary embodiment stores configuration information (control data) in the control section 5. It is possible to regard the control section 5 as the non-volatile memory using a GMR element or a TMR element. It is not necessary to provide an SRAM to retain the configuration information at the time of power-off, by using the non-volatile memory. Therefore, the increase of a chip area due to the non-volatile memory which is a problem in FPGA can be solved.

Also, in the non-volatile logic circuit of the present exemplary embodiment, the control section 5, the memory sections 3 and 4, and the output section 2 use a magneto-resistance element such as the GMR element and the TMR element. However, the control section 5, the memory sections 3 and 4 and the output section 2 function as a device having a logical element function and a non-volatile memory function as a whole. Therefore, even if the magneto-resistance element is used, the size of the device can be suppressed to be small as a whole. Also, because it is possible for the magneto-resistance element to operate at the room temperature, it is possible for the non-volatile logic circuit in the present exemplary embodiment to operate at the room temperature.

As mentioned above, in the present invention, the re-configurable non-volatile logic circuit device can be provided while suppressing the increase of the chip area.

Figure 13:
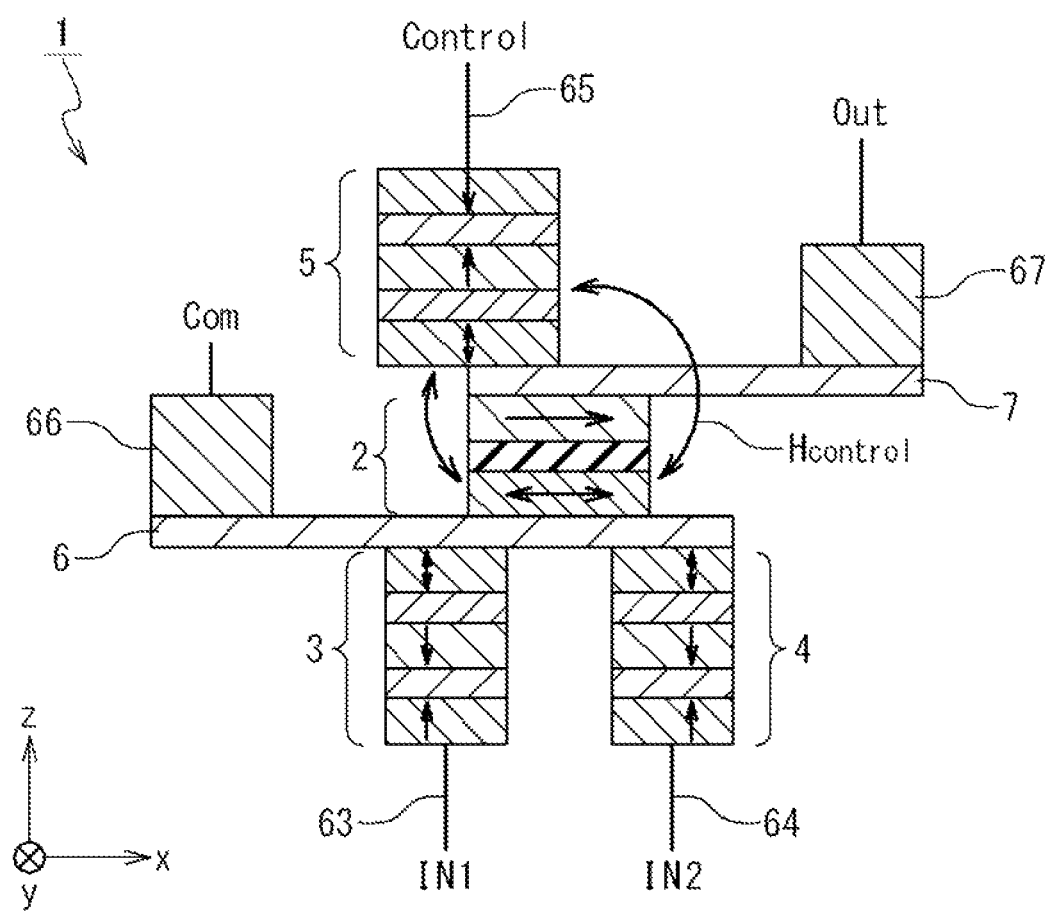
FIG. 13 is a sectional view showing another configuration example of the non-volatile logic circuit according to the first exemplary embodiment of the present invention.

The control section 5 may have perpendicular magnetic anisotropy not in-plane magnetic anisotropy, like the input sections 3 and 4. FIG. 13 is a sectional view showing another configuration example of the non-volatile logic circuit according to the first exemplary embodiment of the present invention. The non-volatile logic circuit 1 differs from the non-volatile logic circuit of FIG. 2A in that the bias layer 53 and the pinned layer 51 in the control section 5 are formed from a ferromagnetic layer having perpendicular magnetic anisotropy. In this case, the configurations of the bias layer 53, the intermediate layer 52 and the pinned layer 51 has configurations similar to those of the memory layer A 33 and the memory layer B 43 in the input sections 3 and 4, the intermediate layers 32 and 42 and the pinned layers 31 and 41.

Also, a relatively position relation of the control section 5 and the output section 2 in the xy plane is different from the non-volatile logic circuit of FIG. 2A in that the control section 5 and the output section 2 are shifted with respect to each other in the direction of +x or the direction of −x. That is, the center of gravity G5 of the control section 5 (the bias layer 53) is shifted to the center of gravity G2 of the output section 2 (the sensor layer 23) in the xy plane, like the centers of gravities G3 and G4 of the input sections 3 and 4 shown in FIG. 2C. In other words, in the xy plane, the center of gravity G5 of the control section 5 is shifted into the direction of +x or the direction of −x from the center of gravity G2 of the output section 2. It is desirable that the control section 5 and the output section 2 overlap in at least a part in the direction of x. That is, if width of the control section 5 in the direction of x is b3, it is desirable that the overlap a3 meets the condition of 0<a3≦b3/2.

Because the other matters are the same as the non-volatile logic circuit shown in FIG. 2A, the description of them is omitted. In this case, too, the same effect as in the non-volatile logic circuit shown in FIG. 2A can be attained.

Also, in the configuration of FIG. 2A and the configuration of FIG. 13, supposing that the control data in the control section 5 is third input data, these non-volatile logic circuits 1 can be used as a logic circuit of three inputs.

Second Exemplary Embodiment

Figure 14:
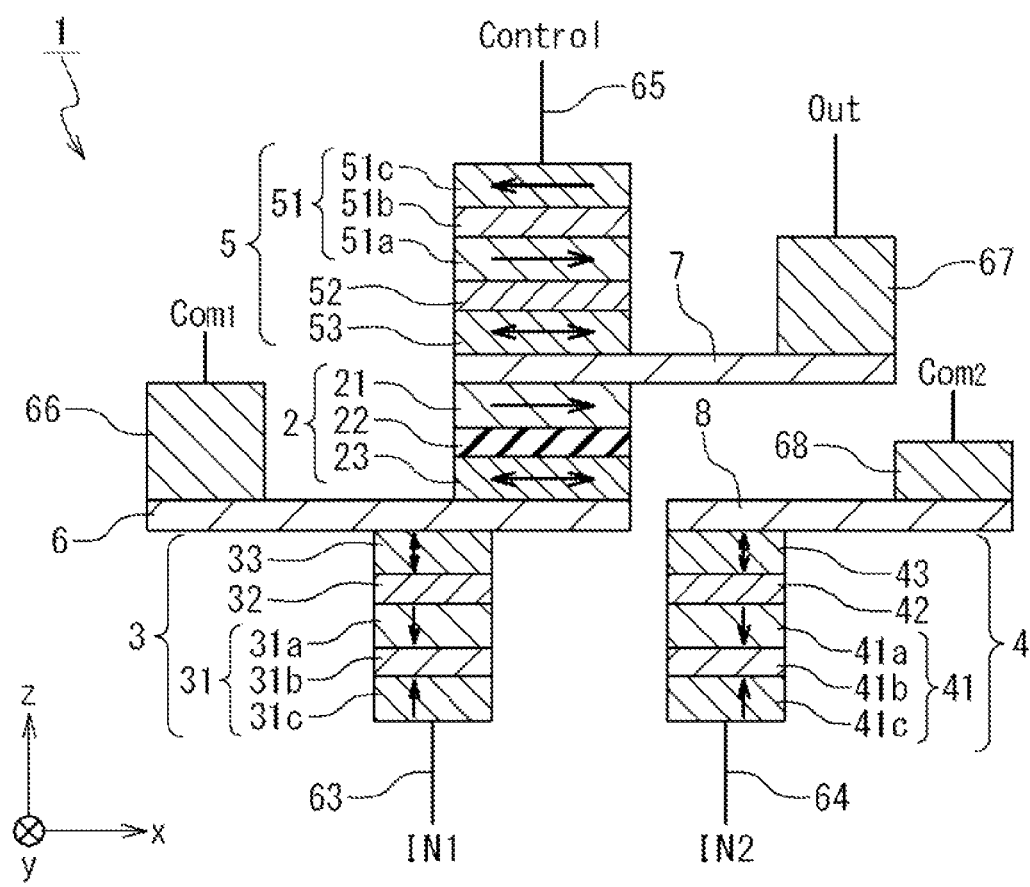
FIG. 14 is a sectional view showing a configuration of the non-volatile logic circuit according to a second exemplary embodiment of the present invention.

The non-volatile logic circuit according to the second exemplary embodiment of the present invention will be described. FIG. 14 is a sectional view showing the configuration of the non-volatile logic circuit according to the second exemplary embodiment of the present invention. The non-volatile logic circuit 1 is provided with the input sections 3 and 4, the output section 2 and the control section 5. The non-volatile logic circuit 1 is different from the non-volatile logic circuit 1 in the first exemplary embodiment in that the metal layer 6 is not connected with the input section 4. With this, another metal layer 8 and a common terminal (Com2) 68 are provided for the input section 4.

In the operation, the non-volatile logic circuit 1 in the first exemplary embodiment cannot perform an operation (step S2) to write the first input data in the input section 3 and an operation (step S3) to write the second input data in the input section 4 at a same time. This is because the metal layer 6 is connected with both of the input sections 3 and 4. However, in the non-volatile logic circuit 1 in the present exemplary embodiment, the metal layer 6 (and the common terminal (Com1) 66) is dedicated to the input section 3, and the metal layer 8 and the common terminal (Com2) 68 are dedicated to the input section 4. Therefore, because the operation to write the first input data in the input section 3 and the operation to write the second input data in the input section 4 can be performed at the same time, the operation can be made high-speed.

Because the other matters are the same as those of the non-volatile logic circuit in the first exemplary embodiment, the description is omitted. In this case, too, the same effect as in the non-volatile logic circuit in the first exemplary embodiment can be attained.

Third Exemplary Embodiment

The non-volatile logic circuit according to a third exemplary embodiment of the present invention will be described.

Figure 15:
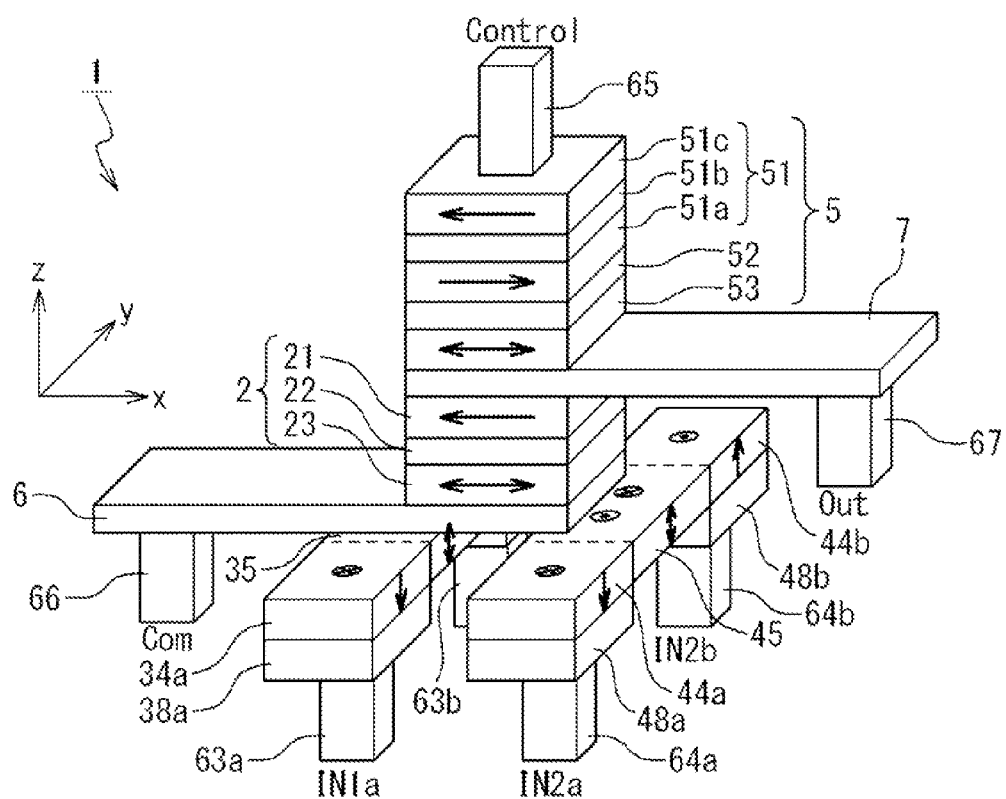
FIG. 15 is a perspective view showing the configuration of the non-volatile logic circuit according to a third exemplary embodiment of the present invention.

FIG. 15 is a perspective view showing the configuration of the non-volatile logic circuit according to the third exemplary embodiment of the present invention. The non-volatile logic circuit 1 is provided with the input sections 3 and 4, the output section 2 and the control section 5. The non-volatile logic circuit 1 is different from the non-volatile logic circuit 1 in the first exemplary embodiment in that each of the input sections 3 and 4 is provided with a magnetic recording layer of a domain wall motion type which extends into the direction of y.

Figure 16:
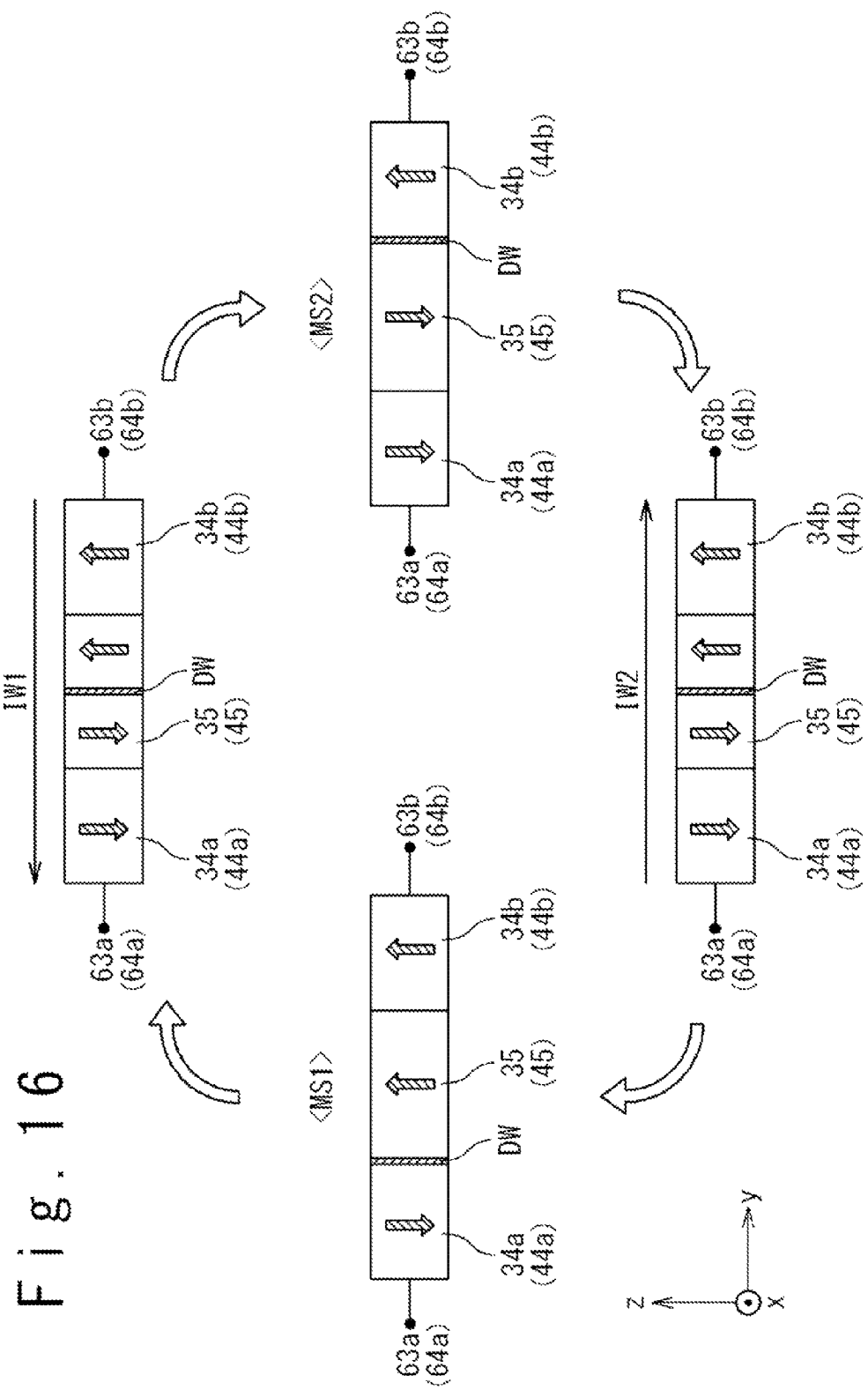
FIG. 16 is a sectional view showing a configuration and operation of an input section in the third exemplary embodiment of the present invention.

Hereinafter, the input sections 3 and 4 will be described. However, because the configurations of the input sections 3 and 4 are identical to each other, the input section 3 will be especially described. FIG. 16 is a sectional view showing a configuration and operation of the input section 3 according to the third exemplary embodiment of the present invention. The input section 3 is formed of a ferromagnetic layer having perpendicular magnetic anisotropy. The input section 3 has a first magnetization pinned region 34a, a second magnetization pinned region 34b and a magnetization invertible region 35. The magnetization invertible region 35 is put between the first magnetization pinned region 34a and the second magnetization pinned region 34b. For example, the magnetization direction of the first magnetization pinned region 34a is fixed substantially in the direction of −z by a hard layer 38a. For example, the magnetization direction of the second magnetization pinned region 34b is fixed substantively in the direction of +z by a hard layer 38b. It should be noted that FIG. 16 shows a state that the hard layers 38a and 38b contact the first magnetization pinned region 34a and the second magnetization pinned region 34b, respectively. However, the hard layers 38a and 38b may be respectively arranged in the neighborhood of the first magnetization pinned region 34a, and the second magnetization pinned region 34b without contact, because it is sufficient that the hard layers 38a and 38b can fix the magnetization directions of the first magnetization pinned region 34a and the second magnetization pinned region 34b. The magnetization direction of the magnetization invertible region 35 is not fixed and can be switched between the direction of −z and the direction of +z.

When the magnetization direction of the magnetization invertible region 35 is the direction of +z, a domain wall DW is formed in the neighborhood of the boundary between the first magnetization pinned region 34a and the magnetization invertible region 35. The magnetization state of the input section 3 is hereinafter referred to as a "first magnetization state MS1". On the other hand, when the magnetization direction of the magnetization invertible region 35 is the direction of −z, the domain wall DW is formed in the neighborhood of the boundary between the second magnetization pinned region 34b and the magnetization invertible region 35. The magnetization state of the input section 3 is hereinafter referred to as a "second magnetization state MS2". The magnetization state of the input sections 3, i.e. the magnetization direction of the magnetization invertible region 35 can be changed by applying the write current in the direction of y. The write current between the first input terminal (IN1a) 63a connected with the first magnetization pinned region 34a and the first input terminal (IN1b) 63b connected with the second magnetization pinned region 34b.

Specifically, for example, the first write current IW1 is applied from the first input terminal (IN1b) 63b to the first input terminal (IN1a) 63a, in order to change the magnetization state from the first magnetization state MS1 to the second magnetization state MS2. In this case, the spin polarized electrons in the direction of −z are supplied from the first magnetization pinned region 34a to the magnetization invertible region 35. The domain wall DW is driven by the spin torque effect and moves from the side of the first magnetization pinned region 34a to the side of the second magnetization pinned region 34b. As a result, the magnetization direction of the magnetization invertible region 35 is inverted to the direction of −z and the second magnetization state MS2 is attained. On the other hand, in order to change the magnetization state from the second magnetization state MS2 to the first magnetization state MS1, the second write current IW2 is applied from the first input terminal (IN1a) 63a to the first input terminal (IN1b) 63b. In this case, the spin polarized electrons in the direction of +z are supplied from the second magnetization pinned region 34b to the magnetization invertible region 35. The domain wall DW is driven by the spin torque effect and moves from the side of the second magnetization pinned region 34b to the side of the first magnetization pinned region 34a. As a result, the magnetization direction of the magnetization invertible region 35 is inverted to the direction of +z and the first magnetization state MS1 is attained.

In this way, the domain wall DW moves with the write current which flows between the first magnetization pinned region 34a and the second magnetization pinned region 34b. The magnetization direction of the magnetization invertible region 35 is inverted and the magnetization state of the input section 3 changes. That is, input data is inputted to the input section 3. Which of the first magnetization state MS1 and the second magnetization state MS2 is attained depends on the direction of the write current. In other words, by controlling the direction of the write current, the input data inputted to the input section 3 can be set.

It should be noted that the first magnetization pinned region 44a, the second magnetization pinned region 44b, the magnetization invertible region 45, the second input terminal (IN2a) 64a, the second input terminal (IN2b) 64b, and the hard layers 48a and 48b in the input section 4 correspond to the first magnetization pinned region 34a, the second magnetization pinned region 34b, the magnetization invertible region 35, the first input terminal (IN1a) 63a, the first input terminal (IN1b) 63b, and the hard layers 38a and 38b in the input section 3.

The ferromagnetic layer having the perpendicular magnetic anisotropy which configures the input section 3 or 4 can be formed of the same material as that of the memory layer A 33 and the memory layer B 43 in the first exemplary embodiment. Also, the hard layers 38a and 38b, and 48a and 48b can be formed of anti-ferromagnetic material such as PtMn, NiMn, and FeMn.

The position relation of the input sections 3 and 4 and the output section 2 is as shown in FIG. 2C when the magnetization invertible regions 35 and 45 in the present exemplary embodiment are regarded as the memory layer A 33 and the memory layer B 43 in the first exemplary embodiment.

Figure 17:
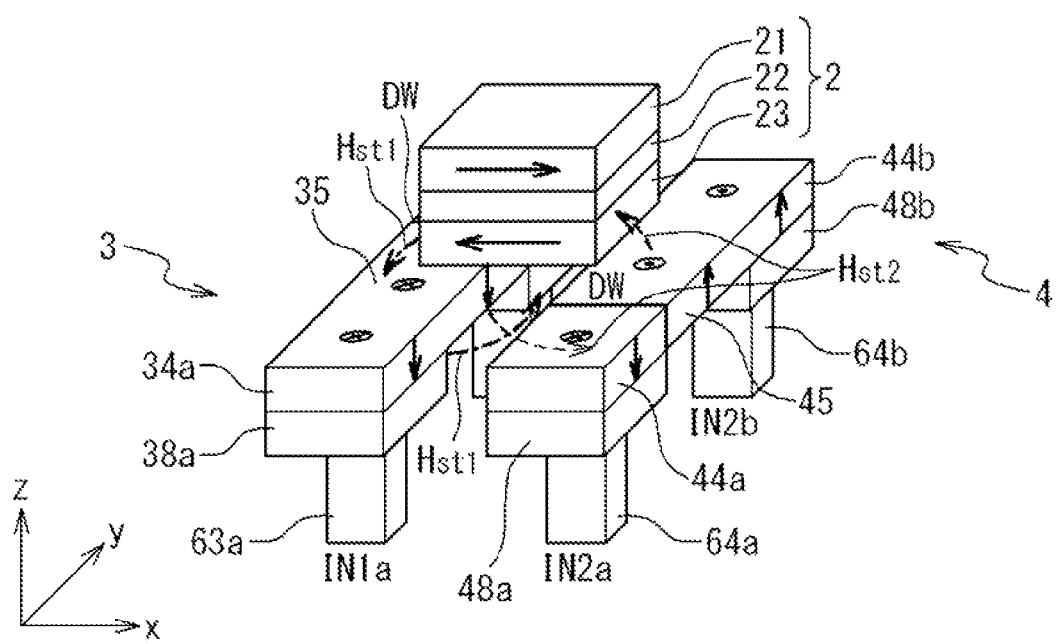
FIG. 17 is a perspective view showing an example of the state of the non-volatile logic circuit in the third exemplary embodiment of the present invention.

FIG. 17 is a perspective view showing an example of a state of the non-volatile logic circuit according to the third exemplary embodiment of the present invention. Here, for convenience of understanding, the control layer 5, the metal layers 6 and 7, the control terminal 65, the common terminal 66, and the output terminal 67 are omitted in this figure. This figure shows the state α3 shown in FIG. 2C or the state β3 shown in FIG. 3C. At this time, the input section 3 is in the second magnetization state MS2 and the input section 4 is in the first magnetization state MS1. The leakage magnetic field Hst1 from the magnetization invertible region 35 and the leakage magnetic field Hst2 from the magnetization invertible region 45 have an influence on the magnetization state of the sensor layer 23 in the output section 2. The functions of these magnetization invertible regions 35 and 45 are the same as the memory layers A 33 and 43 in the input sections 3 and 4 in the first exemplary embodiment.

The other functions and operations of the non-volatile logic 1 in the present exemplary embodiment are the same when the magnetization invertible regions 35 and 45 in the input sections 3 and 4 are regarded as the memory layers A 33 and 43 in the input sections 3 and 4 in the first exemplary embodiment, and the description is omitted.

It should be noted that the metal layer 6 may be not electrically connected with the input sections 3 and 4. Also, in case that the metal layer 6 is connected at least one of the input sections 3 and 4, the common terminal (Com) 66 can be replaced with the input terminals of the input sections without being provided.

In this case, too, the same effect as in the first exemplary embodiment can be attained.

Also, in this case, too, the terminals which supply the current to the input sections 3 and 4 are independent from each other, like the second exemplary embodiment. That is, the operation to write the first input data in the input section 3 and the operation to write the second input data in the input section 4 can be carried out at a same time. With this, the operation can be made high-speed.

Fourth Exemplary Embodiment

Figure 18:
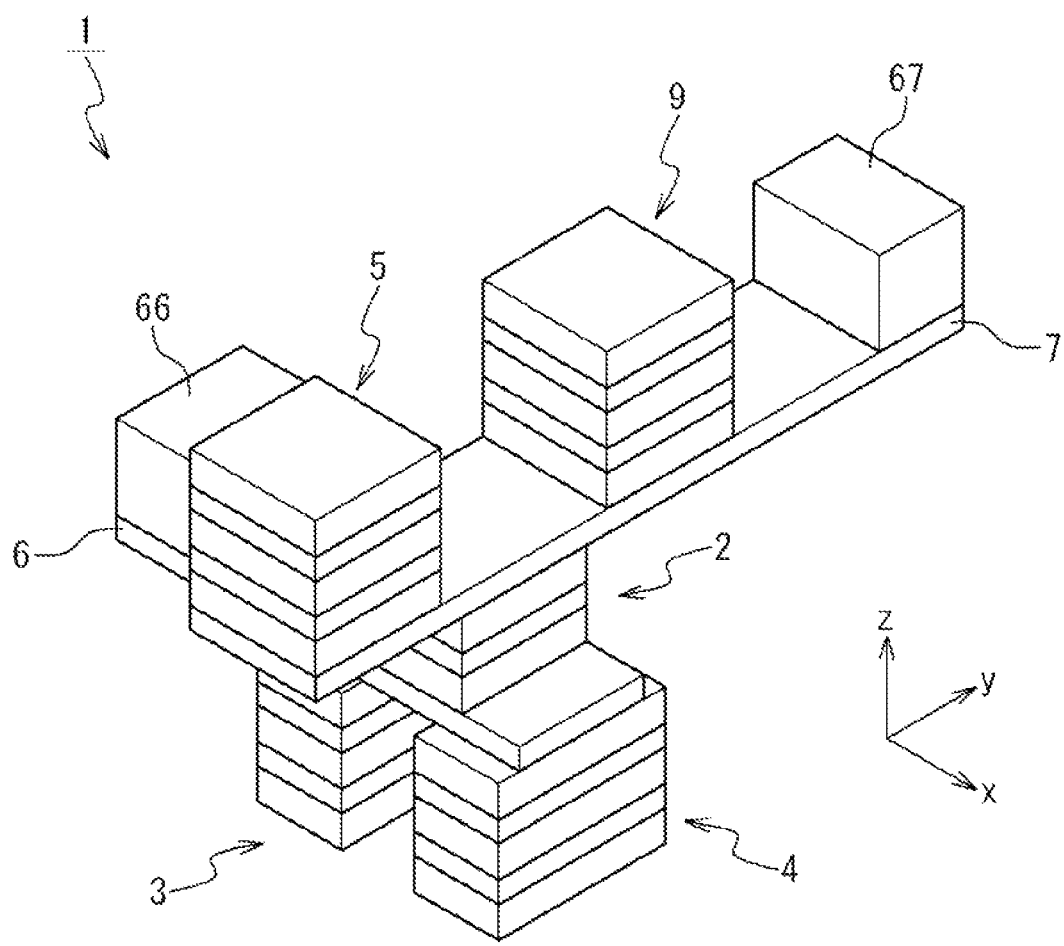
FIG. 18 is a perspective view showing the configuration of the non-volatile logic circuit according to a fourth exemplary embodiment of the present invention.

The non-volatile logic circuit according to a fourth exemplary embodiment of the present invention will be described. FIG. 18 is a perspective view showing a configuration of the non-volatile logic circuit according to the fourth exemplary embodiment of the present invention. The non-volatile logic circuit 1 is provided with the input sections 3 and 4, the output section 2 and other input sections 5 and 9. The non-volatile logic circuit 1 is different from the first exemplary embodiment having the control section 5 on the output section 2 in that the input sections 5 and 9 are provided in upper portions of the output section 2. That is, the non-volatile logic circuit 1 of 4 inputs in the present exemplary embodiment is different from the non-volatile logic circuit 1 of 2 inputs in the first exemplary embodiment.

The configurations of the input sections 5 and 9 are the same as those of the input sections 3 and 4 when they are turned up and down. That is, the input section 5 contains a memory layer C58, an intermediate layer 57, a pinned layer 56 in order from the lower side (on the side of −z). Also, the input section 9 contains a memory layer D93, an intermediate layer 92, a pinned layer 91 in order from the lower side. However, the input sections 3 and 4 are arranged in the direction of x on the lower side of the output section 2 (on the side of −z) but the input sections 5 and 9 are arranged in the direction of y on the upper surface of the output section 2 (on the side of +z).

Figure 19:
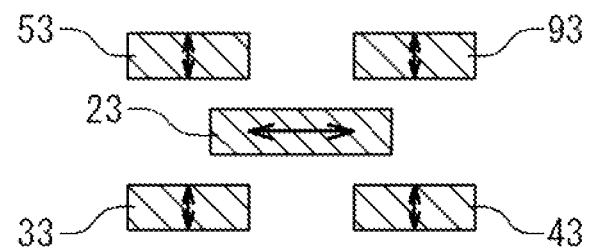
FIG. 19 is a sectional view schematically showing the magnetization state of the non-volatile logic circuit according to the fourth exemplary embodiment of the present invention.

FIG. 19 is a diagram schematically showing the magnetization state of the non-volatile logic circuit according to the fourth exemplary embodiment of the present invention. The magnetization state (the magnetization direction) of the output section 2 (the sensor layer 23) is determined based on a combination of the leakage magnetic fields from the memory layer A 33, the memory layer B 43, the memory layer C58, and the memory layer D93 in the output sections 3 and 4, 5, 9. The output is determined based on a value of the MTJ resistance which is determined based on an angular relation of the magnetization direction of the reference layer 21 in the output section 2 and the magnetization direction of the sensor layer 23. In this example, the directions of the leakage magnetic fields applied to the sensor layer 23 from the memory layer C58 and the memory layer D93 are the direction of y, as shown in FIG. 18. The directions of the leakage magnetic fields applied to the sensor layer 23 from the memory layer A 33 and the memory layer B 43 are the direction of x. In this way, both of the leakage magnetic fields have an angle relatively and the magnetization direction of the sensor layer 23 can be turned to the reference layer 21 more efficiently.

In the present exemplary embodiment, the same effect as in the first exemplary embodiment can be attained. In addition to it, in the present exemplary embodiment, the 4-input device can be realized.

It should be noted that although in the above exemplary embodiments, the input sections 3 and 4 have perpendicular magnetic anisotropy, the present invention is never limited to this example. That is, if it is possible to generate the leakage magnetic field component to pass through the sensor layer 23 in the direction of +x or the direction of −x, the input section may not have in-plane magnetic anisotropy.

Fifth Exemplary Embodiment

1. Basic Configuration of Non-Volatile Logic Circuit

Figure 20A:
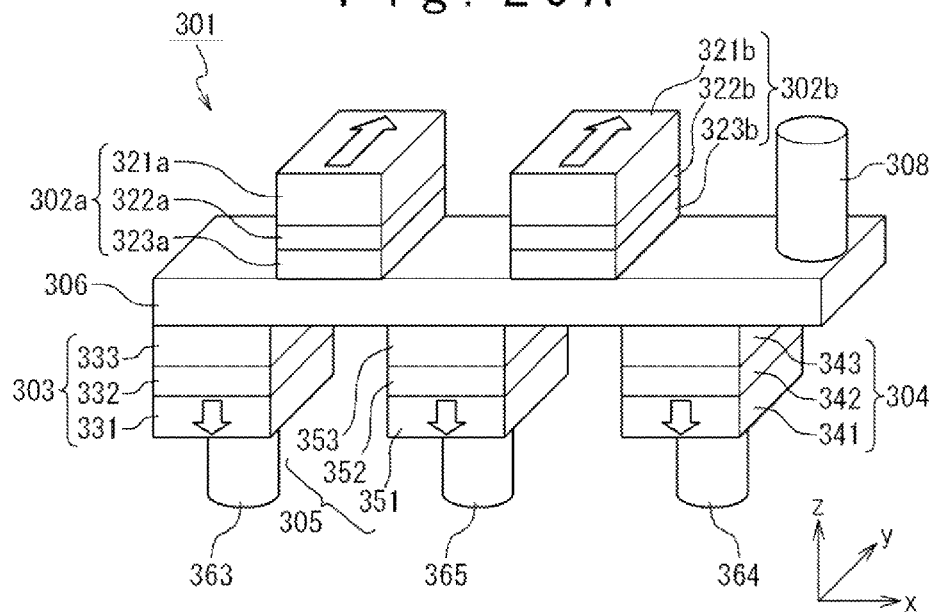
FIG. 20A is a perspective view showing the configuration of the non-volatile logic circuit according to a fifth exemplary embodiment of the present invention.
Figure 20B:
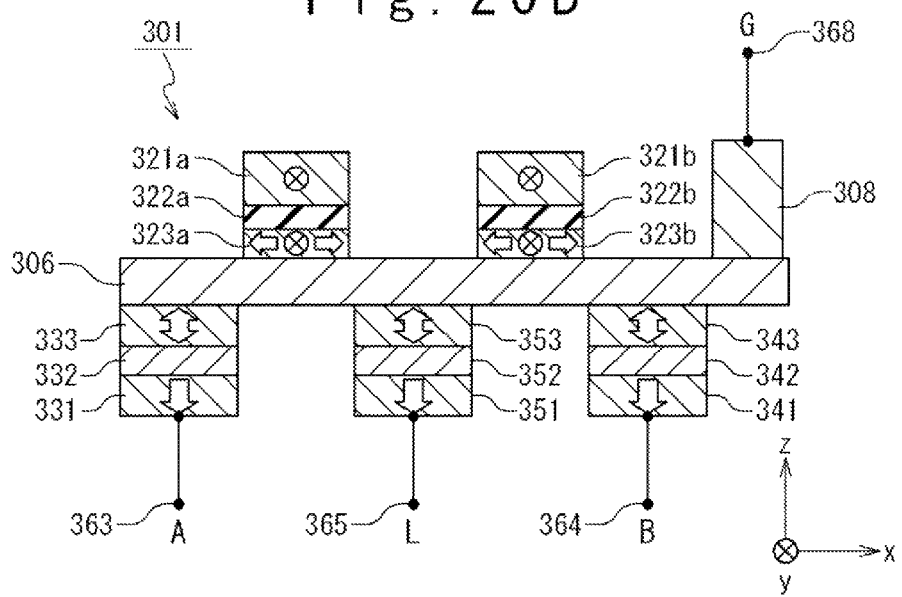
FIG. 20B is a sectional view showing the configuration of the non-volatile logic circuit according to the fifth exemplary embodiment of the present invention.

Hereinafter, the basic configuration of the non-volatile logic circuit according to a fifth exemplary embodiment of the present invention will be described. FIG. 20A are a perspective view showing the configuration of the non-volatile logic circuit according to the fifth exemplary embodiment of the present invention. FIG. 20B is a sectional view showing the configuration of the non-volatile logic circuit according to the fifth exemplary embodiment of the present invention. The non-volatile logic circuit 301 is provided with input sections 303 and 304, output sections 302a and 302b, a control section 305, a conductor layer 306 and a plug 308.

The input section 303 is a spin polarized current write type GMR element or TMR element. The input section 303 is provided with a pinned layer 331, an intermediate layer 332 and a memory layer A 333 which are laminated in the direction of +z. The pinned layer 331 is provided to be connected with one of the surfaces of the intermediate layer 332, and the memory layer A 333 is provided to be connected with the other surface of the intermediate layer 332. The intermediate layer 332 is a non-magnetic film which is provided between the pinned layer 331 and the memory layer A 333.

The pinned layer 331 is a ferromagnetic layer which has perpendicular magnetic anisotropy and in which the magnetization direction is fixed. The magnetization direction of the pinned layer 331 is fixed in the direction of −z in an example of this figure. The pinned layer 331 may be composed of the plurality of ferromagnetic layers having a synthetic ferrimagnetic coupling to fix the magnetization direction firmly (not shown). An anti-ferromagnetic layer may be provided in the neighborhood of the ferromagnetic layer to FIX the magnetization direction firmly (not shown).

The memory layer A 333 is a ferromagnetic layer in which the magnetization direction is invertible. It is desirable that the memory layer A 333 has perpendicular magnetic anisotropy. In case that the memory layer A 333 is the ferromagnetic layer having perpendicular magnetic anisotropy, it is possible to reduce the write current while keeping heat stability, when the memory layer A 333 is thinner. In this case, a device can be made smaller. The magnetization direction of the memory layer A 333 can be inverted to the direction of +z or the direction of −z direction in an example of this figure. An input data is inputted to the memory layer A 333. Specifically, the write current corresponding to the input data is supplied. The magnetization direction of the memory layer A 333 is inverted through the interaction with spin electrons in the pinned layer 331 when the write current passes through the input section 303 in the direction of z. Thus, the input data is stored in accordance with the magnetization direction of the memory layer A 333. The memory layer A 333 is equivalent to the free layer in the GMR element and the TMR element. The memory layer A 333 is magnetically coupled with the sensor layer 323a in the output section 302a to be described later. Therefore, the magnetization direction of the memory layer A 333 has an influence on the magnetization state of the sensor layer 323a in the output section 302a.

The input section 304 is a spin polarized current write type GMR element or TMR element. The input section 304 is provided with a pinned layer 341, the intermediate layer 342 and the memory layer B 343, which are laminated in the direction of +z. Because these are the same as the pinned layer 331, the intermediate layer 332 and the memory layer A 333 in the input section 303, respectively, the description thereof is omitted. However, the memory layer B 343 is magnetically coupled with the sensor layer 323b in the output section 302b, to be described later. Therefore, the magnetization direction of the memory layer A 343 has an influence on the magnetization state of the sensor layer 323b in the output section 302b. The input section 304 is arranged in parallel to the input section 303 in the direction of x.

The control section 305 is a spin polarized current write type GMR element or TMR element. The control section 305 is provided with a pinned layer 351, an intermediate layer 352 and a bias layer 353, which are laminated in the direction of +z. Because these are the same as the pinned layer 331, the intermediate layer 332 and the memory layer A 333 in the input section 303, respectively, the description thereof is omitted. However, the bias layer 353 is magnetically coupled with the sensor layer 323a in the output section 302a and the sensor layer 323b in the output section 302b, to be described later. Therefore, the magnetization direction of the bias layer 353 has an influence on the magnetization states of the sensor layer 323a in the output section 302a and the sensor layer 323b in the output section 302b. The control section 305 is provided in parallel to the input section 303 and the input section 304 in the direction of x between the input section 303 and the input section 304 in a straight line.

In the control section 305, the bias layer 353 may be a ferromagnetic layer whose magnetization direction is fixed, in order to realize the non-volatile logic circuit having a logical element and a memory and operable at the room temperature. However, because it is impossible to change a logic species (e.g. NOR, AND) to be described later in this case, the bias layer 353 is formed of a ferromagnetic layer whose magnetization direction can be changed, in order to realize the re-configurable non-volatile logic circuit.

The output section 302a is a TMR element. The output section 302a is provided with the sensor layer 323a, the barrier layer 322a and the reference layer 321a, which are laminated in the direction of +z. The reference layer 321a is provided to be connected with one of the surfaces of the barrier layer 322a. The sensor layer 323a is provided to be connected with the other surface of the barrier layer 322a. The sensor layer 323a, the barrier layer 322a and the reference layer 321a in the output section 302a configure the magnetic tunnel junction (MTJ). The barrier layer 322a is an insulating film provided between the sensor layer 323a and the reference layer 321a.

The reference layer 321a is a ferromagnetic layer which has in-plane magnetic anisotropy and whose magnetization direction is fixed. The magnetization direction of the reference layer 321a is fixed in the direction of +y in an example of this figure. The reference layer 321a may be composed of a plurality of ferromagnetic layers having a synthetic ferrimagnetic coupling to fix the magnetization direction firmly (not shown). The reference layer 321a may be formed such that an anti-ferromagnetic layer is provided to be connected with a ferromagnetic layer (not shown).

The sensor layer 323a is a ferromagnetic layer which has in-plane magnetic anisotropy and whose magnetization direction is changeable. The magnetization direction of the sensor layer 323a is either of the direction of +y, the direction of +x, and the direction of −x direction in an example of this figure. The sensor layer 323a is magnetically coupled with the memory layer A 333 and the bias layer 353, to be described later. Therefore, the magnetization direction of the sensor layer 323a undergoes influence of the magnetization states (the magnetization directions) of the memory layer A 333 and the bias layer 353.

Here, it is desirable that the sensor layer 323a (the output section 302a) is formed such that the direction of y is a direction of a magnetization easy axis and the direction of x is a direction of a magnetization hard axis. The magnetic anisotropy can be given by shape anisotropy, material anisotropy and the leakage magnetic field from a reference layer and so on. Therefore, the magnetization direction of the sensor layer 323a turns to the direction of +y when the magnetization directions of the memory layer A 333 and the bias layer 353 are the same (e.g. the direction of +z). On the other hand, when the magnetization directions of the memory layer A 333 and the bias layer 353 are different (e.g. the direction of +z in the memory layer A 333, and the direction of −z in the bias layer 353), the magnetization direction of the sensor layer 323a turns to the direction of +x. That is, the magnetization direction is changed due to the synthetic magnetic field from the memory layer A 333 and the bias layer 353 and it is stored.

The output section 302b is a TMR element. The output section 302b is provided with the sensor layer 323b, the barrier layer 332b and the reference layer 331b, which are laminated in the direction of +z. Because these are the same as the sensor layer 323a, the barrier layer 322a and the reference layer 321a in the output section 302a, respectively, the description thereof is omitted. However, the sensor layer 323b is magnetically coupled with the memory layer B343 and the bias layer 353, to be described later. Therefore, the magnetization direction of the sensor layer 323b undergoes influence of the magnetization states (the magnetization directions) of the memory layer B343 and the bias layer 353. The magnetization direction of the sensor layer 323b turns to the direction of +y when the magnetization directions of the memory layer B343 and the bias layer 353 are the same (e.g. the direction of +z). On the other hand, when the magnetization directions of the memory layer B343 and the bias layer 353 are different (e.g. the direction of +z in the memory layer B343, and the direction of −z in the bias layer 353), the magnetization direction of the sensor layer 323b turns to the direction of −x. That is, the magnetization direction is changed by the synthetic magnetic field due to the memory layer B343 and the bias layer 353 and is stored.

As a film having perpendicular magnetic anisotropy for the memory layer A 333, the memory layer B343, and the bias layer 353, the film for the memory layer A 33 in the first exemplary embodiment can be used. Also, as a film for the pinned layers 331, 341, and 351 can use the film as used for the pinned layer 31 of the mention by the first exemplary embodiment. Also, as a film having in-plane magnetic anisotropy for the sensor layers 323a and 323b, the film for the sensor layer 23 in the first exemplary embodiment can be used. Also, as a film like the reference layers 321a and 321b, the film for the pinned layer 21 in the first exemplary embodiment can be used. Moreover, as a film for the intermediate layers 332, 342, 352, the film for the intermediate layers 32, 42 and 52 in the first exemplary embodiment can be used. Also, the film for the barrier layers 322a and 322b, the film for the barrier layer 22 in the first exemplary embodiment can be used.

The memory layer A 333 in the input section 303, the memory layer B343 in the input section 304 and the bias layer 353 in the control section 305 are connected with the lower surface of the conductor layer 306 extending in the direction of x, at the upper surface (on the side of +z). The sensor layers 323a and 323b of the output sections 302a and 302b are connected with the upper surface of the conductor layer 306, at the upper surface (on the side of −z). The conductor layer 306 is connected with the plug 308 in the end portion. The pinned layer 331 in the input section 303 is connected with the first input terminal 363, and the pinned layer 341 in the input section 304 is connected with the second input terminal 364. The pinned layer 351 in the control section 305 is connected with the control terminal 365. It should be noted that the output terminals (not shown) are connected with the reference layers 321a and 321b of the output sections 302a and 302b, respectively.

The conductor layer 306, plug 308, the first input terminal 363, the second input terminal 364, the control terminal 365, and the output terminal (not shown) may be formed of a material used for a usual wiring, a terminal (via) and so on in a semiconductor device such as Cu, Al, and W.

In the position relation of the input section 303, the input section 304, the control section 305, and the output sections 302a and 302b on the xy plane, it is desirable that the output section 302a is arranged between the input section 303 and the control section 305, and the output section 302b is arranged between the control section 305 and the input section 304 and they are arranged in a straight line in the direction of x. Or, the position relation can be set as follows.

Here, the center of gravity of the output section 302a (the sensor layer 323a) is shifted to the center of gravity of the input section 303 (the memory layer A 333) and the center of gravity of the control section 305 (the bias layer 353) on the xy plane. In other words, when the output section 302a (the sensor layer 323a), the input section 303 (the memory layer A 333) and the control section 305 (the bias layer 535) are projected onto the plane (the xy plane) which contains the bottom plane of the output section 302a, the position of the center of gravity of the projection of the output section 302a (the sensor layer 323a) is shifted in the direction of +x from the position of the center of gravity of the projection of the input section 303 (the memory layer A 333) and in the direction of −x from the position of the center of gravity of the projection of the control section 305 (the bias layer 535). It should be noted that the definition of the center of gravity is the same as in the first exemplary embodiment (hereinafter, it is the same).

In the same way, the center of gravity at the output section 302b (the sensor layer 323b) is shifted to the center of gravity of the input section 304 (the memory layer B343) and the center of gravity of the control section 305 (the bias layer 353) on the xy plane. In other words, when the output section 302b (the sensor layer 323b), the input section 304 (the memory layer B343) and the control section 305 (the bias layer 535) are projected on the plane (the xy plane) which contains the bottom plane of the output section 302b, the position of the center of gravity of the projection of the output section 302b (the sensor layer 323b) is shifted in the direction of −x from the position of the center of gravity of the projection of the input section 304 (the memory layer B343) and in the direction of +x from the position of the center of gravity of the projection of the control section 305 (the bias layer 535).

Because there is the above-mentioned position relation, the leakage magnetic fields from the input sections 303 and 304 (the memory layer A 333, and the memory layer B343) and the control section 305 (the bias layer 353) influences on the output sections 302a (the sensor layer 323a) and 302b (the sensor layer 323b) so that the magnetization states can be changed, to be described later. It should be noted that in an example of this figure, the xy sectional shapes of the input sections 303 and 304, the control section 305, and the output sections 302a and 302b are rectangular. However, the present invention is not limited to this example, and may have another sectional shape (e.g. the ellipse) if the magnetization state can be changed to be described later.

2. Operation Principle of Non-Volatile Logic Circuit

Next, a principle of operation of the non-volatile logic circuit according to the fifth exemplary embodiment of the present invention will be described.

FIG. 21A and FIG. 21B are tables showing a relation to the magnetization directions of the memory layers A and B, the bias layer and the sensor layer in the fifth exemplary embodiment of the present invention. Here, the symbol "A" shows the input data which is written in the input section 303 (the memory layer A), and the symbol "B" shows the input data which is written in the input section 304 (the memory layer B). The symbol "a" shows the magnetization direction of the memory layer A 333, and the symbol "b" shows the magnetization direction of the memory layer B343. The symbol "l" shows the magnetization direction of the bias layer 353, and the symbol "p" shows the magnetization direction of the sensor layer 323a. The symbol "q" shows the magnetization direction of the sensor layer 323b, and the symbol "out" shows output data. Also, the mark of a cross in a white circle shows the magnetization direction in the direction of −z, and the mark of a black point in a white circle shows the magnetization in the direction of +z. The upward direction arrow shows the magnetization direction in the direction of +y, and the right direction arrow shows the magnetization in the direction of +x. The left direction arrow shows the magnetization in the direction of −x.

Also, in this figure, when the magnetization directions of the pinned layer 331 and the memory layer A 333 in the input section 303 are parallel, i.e. the magnetization direction of the memory layer A 333 is the direction of −z, the input data of the input section 303 is set to "0". On the other hand, when the magnetization directions of the pinned layer 331 and the memory layer A 333 in the input section 303 are anti-parallel, i.e. the magnetization direction of the memory layer A 333 is the direction of +z, the input data of the input section 303 is set to "1". The relation is the same as in the input section 303 with respect to the input section 304 (the relation between the input data and the magnetization direction of the pinned layer 341/the memory layer B343), the control section 305 (the relation between the control data and the magnetization direction of the pinned layer 351/the bias layer 353).

FIG. 21A will be described. FIG. 21A shows a case where the magnetization direction of the bias layer 353 in the control section 305 is previously set to the direction of −z (control data "0").

(1) Case γ1

The input data ("A") of the input section 303 is "0" and the magnetization direction ("a") of the memory layer A 333 is the direction of −z. The input data ("B") of the input section 304 is "0" and the magnetization direction ("b") of the memory layer 8343 is the direction of −z. The control data of the control section 305 is "0" and the magnetization direction ("1") of the bias layer 353 is the direction of −z. At this time, the magnetic field (the leakage magnetic field) having a component in the direction of −x due to the input section 303 and the magnetic field (the leakage magnetic field) having a component in the direction of +x due to the control section 305 are applied to the sensor layer 323a in the output section 302a. As a result, the magnetization direction ("p") of the sensor layer 323a in the output section 302a is the direction of +y as the direction of the magnetization easy axis because both of the magnetic fields are cancelled by each other. In the same way, the magnetic field (the leakage magnetic field) having a component in the direction of +x due to the input section 304 and the magnetic field (the leakage magnetic field) having a component in the direction of −x due to the control section 305 are applied to the sensor layer 323b in the output section 302b. As a result, the magnetization direction ("q") of the sensor layer 323b in the output section 302b is the direction of +y as the direction of the of magnetization easy axis because both of the magnetic fields are cancelled by each other. As a result, the magnetization directions of the reference layer 321a and the sensor layer 323a in the output section 302a are parallel and MTJ in the output section 302a has a low resistance. In the same way, the magnetization directions of the reference layer 331b and the sensor layer 323b in the output section 302b becomes parallel and the MTJ in the output section 302b has a low resistance. The output data ("out") is set to "1" when both of the output sections have the low resistance.

(2) Case γ2

The input data of the input section 303 is "0" and the magnetization direction of the memory layer A 333 is the direction of −z. The input data of the input section 304 is "1" and the magnetization direction of the memory layer 8343 is the direction of +z. The control data of the control section 305 is "0" and the magnetization direction of the bias layer 353 is the direction of −z. At this time, the magnetic field having a component in the direction of −x due to the input section 303 and the magnetic field having a component in the direction of +x due to the control section 305 are applied to the sensor layer 323a in the output section 302a. As a result, the magnetization direction of the sensor layer 323a in the output section 302a is set to the direction of +y as the direction of the magnetization easy axis because both of the magnetic fields are substantially cancelled by each other. On the other hand, at this time, the magnetic field having a component in the direction of −x due to the input section 304 and the magnetic field having a component in the direction of −x due to the control section 305 are applied to the sensor layer 323b in the output section 302b. As a result, the magnetization direction of the sensor layer 323b in the output section 302b is set to the direction of −x which is parallel to the magnetic fields because both of the magnetic fields are substantially enhanced by each other. As a result, the magnetization directions of the reference layer 321a and the sensor layer 323a in the output section 302a becomes parallel, and the MTJ in the output section 302a has a low resistance. On the other hand, the magnetization directions of the reference layer 331b and the sensor layer 323b in the output section 302b are set to a state shifted with respect to each other by 90 degrees, and the MTJ in the output section 302b has a high resistance compared with the parallel case. The output data is set to "0" when at least one of both of the output sections does not have a low resistance.

(3) Case γ3

The input data of the input section 303 is "1" and the magnetization direction of the memory layer A 333 is the direction of +z. The input data of the input section 304 is "0" and the magnetization direction of the memory layer B 343 is the direction the direction of −z. The control data of the control section 305 is "0" and the magnetization direction of the bias layer 353 is the direction of −z. At this time, the magnetic field having a component in the direction of +x due to the input section 303 and the magnetic field having a component in the direction of +x due to the control section 305 are applied to the sensor layer 323a in the output section 302a. As a result, because both of the magnetic fields are substantially enhanced by each other, the magnetization direction of the sensor layer 323a in the output section 302a is set to the direction of +x which is parallel to the magnetic fields. On the other hand, at this time, the magnetic field having a component in the direction of +x due to the input section 304 and the magnetic field due to the control section 305 having a component in the direction of −x are applied to the sensor layer 323b in the output section 302b. As a result, the magnetization direction of the sensor layer 323b in the output section 302b is set to the direction of +y as the direction of the magnetization easy axis because both of the magnetic fields are substantially cancelled from each other. As a result, the magnetization directions of the reference layer 321a and the sensor layer 323a in the output section 302a are set to a state shifted with respect to each other by 90 degrees and the MTJ in the output section 302a has a high resistance compared with the parallel case. On the other hand, the magnetization directions of the reference layer 331b and the sensor layer 323b in the output section 302b becomes parallel and the MTJ in the output section 302b has a low resistance. The output data is set to "0" when at least one of the output sections does not have the low resistance.

(4) Case γ4

The input data of the input section 303 is "1" and the magnetization direction of the memory layer A 333 is the direction of +z. The input data of the input section 304 is "1" and the magnetization direction of the memory layer 8343 is the direction of −z. The control data of the control section 305 is "0" and the magnetization direction of the bias layer 353 is the direction of −z. At this time, the magnetic field having a component in the direction of +x due to the input section 303 and the magnetic field having a component in the direction of +x due to the control section 305 are applied to the sensor layer 323a in the output section 302a. As a result, because both of the magnetic fields are substantially enhanced by each other, the magnetization direction of the sensor layer 323a in the output section 302a is set to the direction of +x which is parallel to the magnetic fields in the same way, at this time, the magnetic field having a component in the direction of −x due to the input section 304 and the magnetic field having a component in the direction of −x due to the control section 305 are applied to the sensor layer 323b in the output section 302b. As a result, because both of the magnetic fields are substantially enhanced by each other, the magnetization direction of the sensor layer 323b in the output section 302b is set to the direction of −x which is parallel to the magnetic fields. As a result, the magnetization directions of the reference layer 321a and the sensor layer 323a in the output section 302a are shifted with respect to each other by 90 degrees and the MTJ in the output section 302a has a high resistance compared with the parallel case. In the same way, the magnetization directions of the reference layer 331b and the sensor layer 323b in the output section 302b are shifted with respect to each other by 90 degrees and the MTJ in the output section 302b has the high resistance compared with the parallel case. The output data is set to "0" when at least one of the output sections does not have a low resistance.

As mentioned above, the non-volatile logic circuit 301 outputs the output data of "1", "0", "0", and "0" to the input data "00", "01", "10", and "11", respectively. That is, when the control data "0" is set to the control section 305, the non-volatile logic circuit 301 can operate as a NOR circuit.

Next, FIG. 21B will be described. FIG. 21B shows a case that the magnetization direction of the bias layer 353 in the control section 305 is previously set to the direction of +z (control data "1").

(1) Case δ1

The input data ("A") in the input section 303 is "0" and the magnetization direction ("a") of the memory layer A 333 is the direction of −z. The input data ("B") in the input section 304 is "0" and the magnetization direction ("b") of the memory layer B 343 is the direction of −z. The control data of the control section 305 is "1" and the magnetization direction ("1") of the bias layer 353 is the direction of +z. At this time, the magnetic field (leakage magnetic field) having a component in the direction of −x due to the input section 303 and the magnetic field (leakage magnetic field) having a component in the direction of −x due to the control section 305 are applied to the sensor layer 323a in the output section 302a. As a result, because both of the magnetic fields are substantially enhanced by each other, the magnetization direction ("p") of the sensor layer 323a in the output section 302a is set to the direction of −x which is parallel to the magnetic fields. In the same way, at this time, the magnetic field (leakage magnetic field) having a component in the direction of +x due to the input section 304 and the magnetic field (leakage magnetic field) having a component in the direction of +x due to the control section 305 are applied to the sensor layer 323b in the output section 302b. As a result, because both of the magnetic fields are substantially enhanced by each other, the magnetization direction ("q") of the sensor layer 323b in the output section 302b is set to the direction of +x which is parallel to the magnetic fields. As a result, the magnetization directions of the reference layer 321a and the sensor layer 323a in the output section 302a are shifted with respect to each other by 90 degrees, and the MTJ in the output section 302a has high resistance compared with the parallel case. In the same way, the magnetization directions of the reference layer 331b and the sensor layer 323b in the output section 302b are shifted with respect to each other by 90 degrees and the MTJ in the output section 302b has a high resistance compared with the parallel case. The output data ("out") is sets to "0" when at least one of the output sections does not has a low resistance.

(2) Case δ2

The input data of the input section 303 is "0" and the magnetization direction of the memory layer A 333 is the direction of −z. The input data of the input section 304 is "1" and the magnetization direction of the memory layer B 343 is the direction of +z. The control data of the control section 305 is "1" and the magnetization direction of the bias layer 353 is the direction of +z. At this time, the magnetic field having a component in the direction of −x due to the input section 303 and the magnetic field having a component in the direction of −x due to the control section 305 are applied to the sensor layer 323a in the output section 302a. As a result, because both of the magnetic fields are substantially enhanced by each other, the magnetization direction of the sensor layer 323a in the output section 302a is set to the direction of −x which is parallel to the magnetic fields. On the other hand, at this time, the magnetic field having a component in the direction of −x due to the input section 304 and the magnetic field having a component in the direction of +x due to the control section 305 are applied to the sensor layer 323b in the output section 302b. As a result, the magnetization direction of the sensor layer 323b in the output section 302b is set to the direction of +y as the direction of the magnetization easy axis, because both of the magnetic fields are substantially cancelled by each other. As a result, the magnetization directions of the reference layer 321a and the sensor layer 323a in the output section 302a are shifted with respect to each other by 90 degrees, and the MTJ in the output section 302a has a high resistance compared with the parallel case. On the other hand, the magnetization directions of the reference layer 331b and the sensor layer 323b in the output section 302b become parallel and the MTJ in the output section 302b has a low resistance. The output data is set to "0" when at least one of the output sections does not have the low resistance.

(3) Case δ3

The input data of the input section 303 is "1" and the magnetization direction of the memory layer A 333 is the direction of +z. The input data of the input section 304 is "0" and the magnetization direction of the memory layer B343 is the direction of −z. The control data of the control section 305 is "1" and the magnetization direction of the bias layer 353 is the direction of +z. At this time, the magnetic field having a component in the direction of +x due to the input section 303 and the magnetic field having a component in the direction of −x due to the control section 305 are applied to the sensor layer 323a in the output section 302a. As a result, the magnetization direction of the sensor layer 323a in the output section 302a, both of the magnetic fields become the direction of +y is the direction of the magnetization easy axis substantially cancelled by each other: On the other hand, at this time, the magnetic field having a component in the direction of +x due to the input section 304 and the magnetic field having a component in the direction of +x due to the control section 305 are applied to the sensor layer 323b in the output section 302b. As a result, because both of the magnetic fields are substantially enhanced by each other, the magnetization direction of the sensor layer 323b in the output section 302b is set to the direction of +x which is parallel to the magnetic fields. As a result, the magnetization directions of the reference layer 321a and the sensor layer 323a in the output section 302a become parallel and the MTJ in the output section 302a has low resistance. On the other hand, the magnetization directions of the reference layer 331b and the sensor layer 323b in the output section 302b are shifted with respect to each other by 90 degrees and the MTJ in the output section 302b has a high resistance compared with the parallel case. The output data is set to "0" when at least one of the output sections does not have a low resistance.

(4) Case δ4

The input data of the input section 303 is "1" and the magnetization direction of the memory layer A 333 is the direction of +z. The input data of the input section 304 is "1" and the magnetization direction of the memory layer B343 is the direction of +z. The control data of the control section 305 is "1" and the magnetization direction of the bias layer 353 is the direction of +z. At this time, the magnetic field having a component in the direction of +x due to the input section 303 and the magnetic field due to the control section 305 having a component in the direction of −x are applied to the sensor layer 323a in the output section 302a. As a result, the magnetization direction of the sensor layer 323a in the output section 302a is set to the direction of +y that is the direction of the magnetization easy axis, because both of the magnetic fields are substantially cancelled by each other. In the same way, at this time, the magnetic field having a component in the direction of −x due to the input section 304 and the magnetic field having a component in the direction of +x due to the control section 305 are applied to the sensor layer 323b in the output section 302b. As a result, the magnetization direction of the sensor layer 323b in the output section 302b is set to the direction of +y as the direction of the magnetization easy axis, because both of the magnetic fields are substantially cancelled by each other. As a result, the magnetization directions of the reference layer 321a and the sensor layer 323a in the output section 302a becomes parallel and the MTJ in the output section 302a has a low resistance. In the same way, the magnetization direction of the reference layer 331b and the sensor layer 323b in the output section 302b becomes parallel and the MTJ in the output section 302b has the low resistance. The output data is set to "1" when both of the output sections have the low resistances.

As mentioned above, the non-volatile logic circuit 301 outputs the output data "0", "0", "0", and "1" to the input data "00", "01", "10", and "11", respectively. That is, when the control data "1" is set to the control section 305, the non-volatile logic circuit 301 can operate as an AND circuit.

In this way, the non-volatile logic circuit 301 in the present exemplary embodiment can be used as the NOR circuit or the AND circuit by controlling the magnetization state of the bias layer 353. Therefore, another logic circuit can be configured by combining the NOR circuit and the AND circuit according to the non-volatile logic circuit 301 in the present exemplary embodiment.

3. Data Input/Output Principle of Non-Volatile Logic Circuit

Next, the data input/output principle of the non-volatile logic circuit according to the fifth exemplary embodiment of the present invention will be described. The input of data to the non-volatile logic circuit 301 is carried out by writing the data into the GMR elements (or TMR elements) of the control section 305, and the input section 303 and 304. On the other hand, the output of data from the non-volatile logic circuit 301 is carried out by reading the data from the TMR element in the output sections 302a and 302b. Hereinafter, the principle will be described in detail.

First, the write of data into the input section 303 and the control section 305 304 will be described with the reference to FIG. 20A and FIG. 20B. The control data is previously written into the control section 305, before the non-volatile logic circuit 1 operates. The non-volatile logic circuit 301 can set to either of the NOR circuit and the AND circuit by writing the control data. On the other hand, the input sections 303 and 304 are respectively supplied with the first input data and the second input data when the non-volatile logic circuit 301 operates.

The write of the control data into the control section 305 is carried out in the following way. As mentioned previously, the control section 305 is a spin polarized current write type GMR element. When writing the control data in the control section 305, the write current Iw is applied between the control terminal 365 and the plug 308, for example. The write current Iw is applied into the direction corresponding to the control data to be written (the magnetization direction of the bias layer 353). In this case, spin electrons flow in a direction opposite to the direction of the write current Iw.

In an example of this figure, when setting the magnetization direction of the bias layer 353 to the direction of +z, the write current is supplied in a direction from the control terminal 365 to plug 308. In this case, the spin electrons flow in a direction from the plug 308 to the control terminal 365. As a result, by the spin torque effect through the interaction between the pinned layer 351 and the bias layer 353, the magnetization direction of the bias layer 353 is set to the direction of +z. On the other hand, when setting the magnetization direction of the bias layer 353 to the direction of −z, the write current is applied in a direction from the plug 308 to the control terminal 365. In this case, the spin electrons flow in a direction from the control terminal 365 to the plug 308. As a result, by the spin torque effect through the interaction between the pinned layer 351 and the bias layer 353, the magnetization direction of the bias layer 353 is set to the direction of −z.

On the other hand, the write of the input data into the input sections 303 and 304 is carried out in the following way. The input sections 303 and 304 are spin polarized current write type GMR elements. When writing the first input data into the input section 303, the write current Iw1 is applied between the first input terminal 363 and the plug 308. The write current Iw1 is applied in a direction corresponding to the first input data to be written (the magnetization direction of the memory layer A 333). In the same way, when writing second input data into the input section 304, the write current Iw2 is applied between the second input terminal 364 and the plug 308. The write current Iw2 is applied in the direction corresponding to the second input data to be written (the magnetization direction of the memory layer B343). In these cases, the spin electrons flow in a direction opposite to the direction of the write currents Iw1 and Iw2.

Specifically, the write principle is the same as in the control section 305. That is, in an example of this figure, when setting the magnetization direction of the memory layer A 333 to the direction of +z, the write current is applied in a direction from the first input terminal 363 to the plug 308. On the other hand, when setting the magnetization direction of the memory layer A 333 to the direction of −z, the write current is applied in a direction from the plug 308 to the first input terminal 363. In the same way, when setting the magnetization direction of the memory layer B343 to the direction of +z, the write current is applied in a direction from the second input terminal 364 to the plug 308. On the other hand, when setting the magnetization direction of the memory layer B343 to the direction of −z, the write current is applied in a direction from the plug 308 to the second input terminal 364.

The input of the data to the non-volatile logic circuit 301 is carried out in the above-mentioned way. By this data input, the control section 305 and the input section 303 and 304 are set to the desired magnetization states to reflect their data. As a result, the output data are written in the output sections 302a and 302b due to the leakage magnetic fields (the synthetic magnetic field) from the control section 305 and the input section 303 and 304, as shown in FIG. 21A to FIG. 21B. It should be noted that the routes of the write currents IW, IW1, and IW2 are not limited to the above examples. Any route may be adopted if it is possible to change the magnetization directions of the bias layers 353 in the control section 305, and the memory layer A 333, and the memory layer B343 in the input section 303 and 304.

Next, the read of the data from the output sections 302a and 302b will be described with the reference to FIG. 20A and FIG. 20B. The output sections 302a and 302b are TMR elements. The magnetization state of the output section 302a has been changed due to the leakage magnetic field (synthetic magnetic field) from the input section 303 and the control section 305 and the magnetization state of the output section 302b has been changed due to the leakage magnetic fields (synthetic magnetic field) from the input section 304 and the control section 305. That is, the magnetization direction of the sensor layer 323a in the output section 302a has been changed to a direction corresponding to a combination of the control data and the first input data, and the magnetization direction of the sensor layer 323b in the output section 302b has been changed in a direction corresponding to a combination of the control data and the second input data. As a result, the resistance of the MTJ of each of the output sections 302a and 302b has a value corresponding to a combination of the control data, the first input data and the second input data. In this state, for example, the resistance value of the MTJ can be read by applying a read current IR through a route which passes one of the output terminals (not shown), the output section 302a, the conductor layer 308, the output section 302b and the other output terminal (not shown). The direction of the read current IR is not especially limited. The output data of the non-volatile logic circuit 301 is determined based on a resistance value of the MTJs (a total resistance value of the output section 302a and the output section 302b). It should be noted that the route of the read current IR is not limited to the above example, and any routes may be used if the resistance value of the MTJ of each output section can be measured individually or in a total.

4. Logic Gate Using Non-Volatile Logic Circuit

Figure 22:
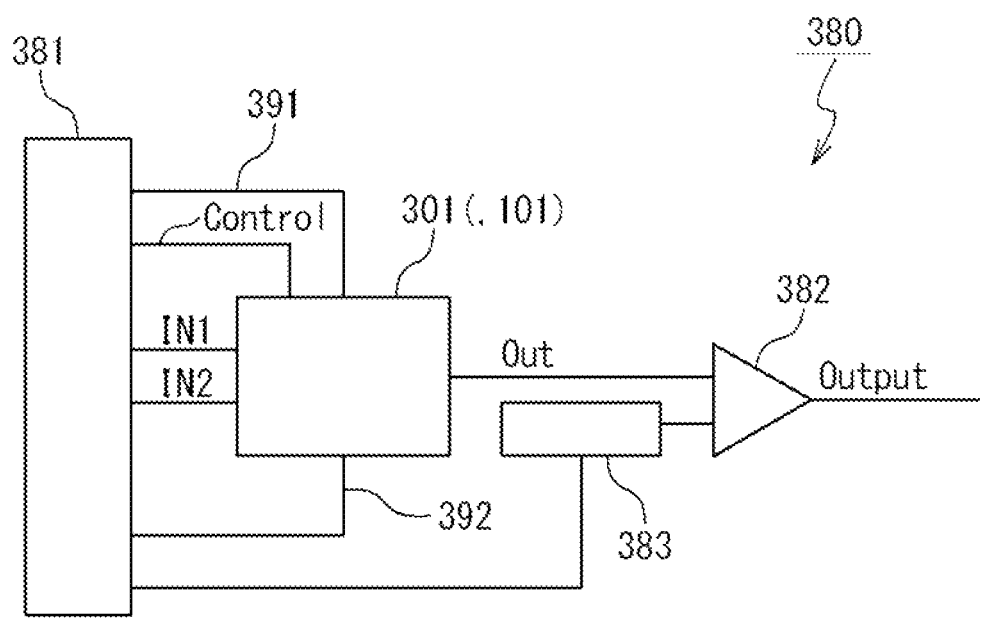
FIG. 22 is a block diagram showing an example of a logic gate in the fifth exemplary embodiment of the present invention.

Next, the configuration and operation of a logic gate using the non-volatile logic circuit according to the fifth exemplary embodiment of the present invention will be described. FIG. 22 is a block diagram showing an example of the logic gate according to the fifth exemplary embodiment of the present invention. The logic gate 380 is provided with a control circuit 381, a non-volatile logic circuit 301, an MTJ reference element 383 and a comparator 382.

The control circuit 381 is provided with a switch to convert a logic input and a logic control data into a current. The control circuit 381 generates a write current IW having a value and direction specified based on the control data as a preliminary setting operation of the non-volatile logic circuit 301 in response to the supply of the control data. Then, the generated write current IW is supplied to the route of the control terminal 365, the control section 305, the conductor layer 306 and the plug 308 in the non-volatile logic circuit 301 through the terminal control and the terminal 392. With this, the control data can be set to the control section 305 (the bias layer 353). As a result, the non-volatile logic circuit 301 can be set to the desired logical operation circuit (e.g. an NOR circuit).

Also, as the operation of the non-volatile logic circuit 301, first, the control circuit 381 generates the write current IW1 having a direction and value corresponding to the first input data in response to the supply of the first input data. Then, the control circuit 381 supplies the write current IW to the route of the first input terminal 363, the input section 303, the conductor layer 308 and the plug 308 in the non-volatile logic circuit 301 through terminal IN1 and terminal 392. Next, in response to the supply of the second input data, the control circuit 381 generates the write current IW2 having a value and direction corresponding to the second input data. Then, the control circuit 381 supplies the generated write current IW to the route of the second input terminal 364, the input section 304, the conductor layer 306 and the plug 308 in the non-volatile logic circuit 301 through terminal IN2 and terminal 392. Thus, the input data (the first input data and the second input data) can be inputted to the input sections 303 and 304. After that, the control circuit 381 generates a read current IR. Then, the read current is applied to the route of the output terminal (not shown), the output section 302a, the conductor layer 306, the output section 302b and another output terminal (not shown) through the terminal 391 and the terminal 392. At this time, the voltage (the output voltage) corresponding to the resistance values of the MTJs in the output section 302a and the output section 302b is outputted from the terminal Out to the comparator 382. The comparator 382 outputs the final output data by comparing the output voltage from the non-volatile logic circuit 301 and the reference voltage from the MTJ reference element 383. With this, the non-volatile logic circuit 301 can output the output data representing the desired logical operation result to the input data.

By the above configuration and operation, the non-volatile logic circuit 301 can be set to the desired logic circuit, and it becomes possible for the non-volatile logic circuit 301 to input the input data and output the output data.

In the non-volatile logic circuit 301 in the present exemplary embodiment, the logic can be re-configured by changing the control data (the configuration information) supplied to the control section 305. That is, the non-volatile logic circuit 301 in the present exemplary embodiment can realize a re-configurable logic circuit by using a GMR (or TMR) spin transfer elements (the control section 305, and the memory sections 303 and 304) and the MTJ elements (the output sections 302a and 302b).

The non-volatile logic circuit in the present exemplary embodiment stores configuration information (the control data) in the control section 305. It is possible to regard the control section 305 as the non-volatile memory using a GMR element or a TMR element. It is not necessary that the non-volatile logic circuit has an SRAM which retains configuration information at the time of power-off by using the non-volatile memory. Therefore, the chip area increase due to the non-volatile memory which is a problem in FPGA can be solved.

Also, the non-volatile logic circuit in the present exemplary embodiment uses a magneto-resistance element such as a GMR element or a TMR element in the control section 305, the memory sections 303 and 304, the output sections 302a and 302b. However, they function as a device having a logical element function and a non-volatile memory function as a whole. Therefore, even if a magneto-resistance element is used, the size of the device can be suppressed to be small as a whole. Also, because it is possible for the magneto-resistance element to operate at the room temperature, the non-volatile logic circuit in the present exemplary embodiment, too, can operate at the room temperature.

As mentioned above, the present invention can provides the re-configurable non-volatile logic circuit while suppressing the chip area increase.

In the present exemplary embodiment, by changing the setting of a reference voltage level, the logic of the non-volatile logic circuit 301 can be changed. For example, the non-volatile logic circuit 301 which is the NOR logic originally can be converted to the NAND logic if the output is set to "0" in case γ4 in FIG. 21A and the outputs are set to "1" in the other cases γ1 to γ3. In this case, the resistance value of the MTJ in the output sections 302a and 302b is set to "1" in case of a maximum and set to "0" otherwise. In the same way, the non-volatile logic circuit 301 which is an AND logic originally can be converted into an OR logic if the output is set to "0" in case δ1 in FIG. 21B and set to "1" in other cases δ2 to δ4. In this case, the resistance value of the MTJ in the output sections 302a and 302b is set to "1" in case of a maximum and set to "0" otherwise.

In the present exemplary embodiment, the control section 305 is provided between the input section 303 and the input section 304. However, in the present exemplary embodiment, the arrangement order of these input sections 303 and 304, and the control section 305 is not limited. As shown in FIG. 21A and FIG. 21B, this is because the output data is set to "1" when the magnetization directions of the output sections 302a and 302b are both the direction of +y as in the case γ1 and the case δ4, and the output data is set to "0" otherwise. As a result, the relative position relation of the input sections 303 and 304, and the control section 305 becomes free.

Also, in the present exemplary embodiment, a relation of the input sections 303 and 304, the control section 305, and the output sections 302a and 302b are not limited to the cases of FIG. 20A and FIG. 20B. FIG. 23A to FIG. 23D are diagrams schematically showing a modification example of the configuration of the non-volatile logic circuit according to the fifth exemplary embodiment of the present invention.

Figure 23A:
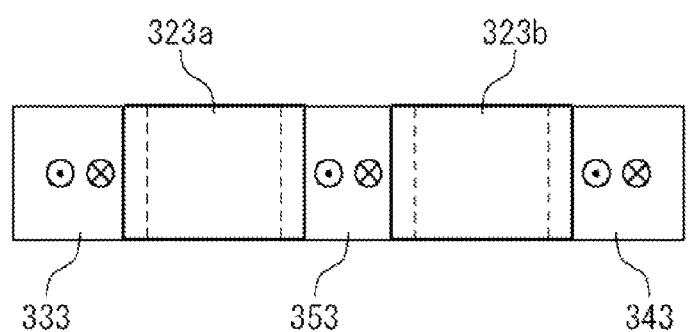
FIG. 23A is a diagram schematically showing a modification example of the configuration of the non-volatile logic circuit according to the fifth exemplary embodiment of the present invention.
Figure 23B:
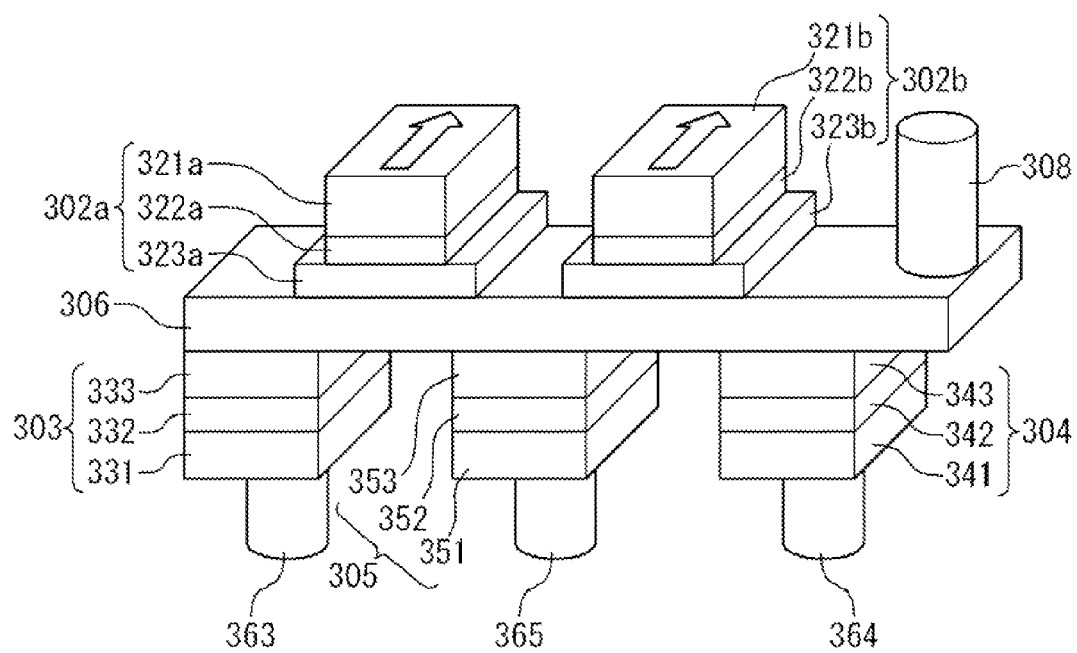
FIG. 23B is a diagram schematically showing the modification example of the configuration of the non-volatile logic circuit according to the fifth exemplary embodiment of the present invention.
Figure 23C:
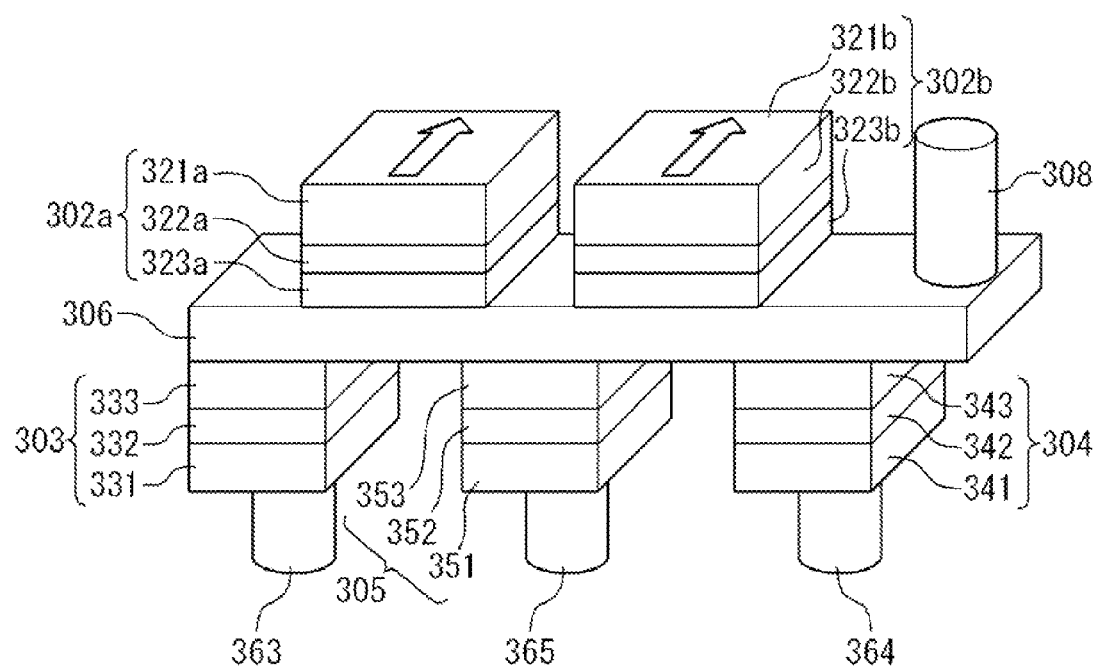
FIG. 23C is a diagram schematically showing the modification example of the configuration of the non-volatile logic circuit according to the fifth exemplary embodiment of the present invention.

As shown in FIG. 23A, for example, the output sections 302a and 302b and the sensor layers 323a and 323b may be arranged to overlap the input sections 303 and 304, and the control section 305. In the memory layer A 333 in the input section 303, the memory layer B 343 in the input section 304 and the bias layer 353 in the control section 305, the maximum leakage magnetic fields can be obtained at the edges. Therefore, by adopting the overlapping arrangement, the sensitivity of the sensor layers 323a and 323b can be more improved. In this case, the length of each of the sensor layers in the direction of x becomes larger than a distance between the input section and the control section 5. At this time, the overlapping arrangement may be only the sensor layers 323a and 323b as shown in FIG. 23B and may be the whole of the output sections 302a and 302b as shown in FIG. 23C.

Figure 23D:
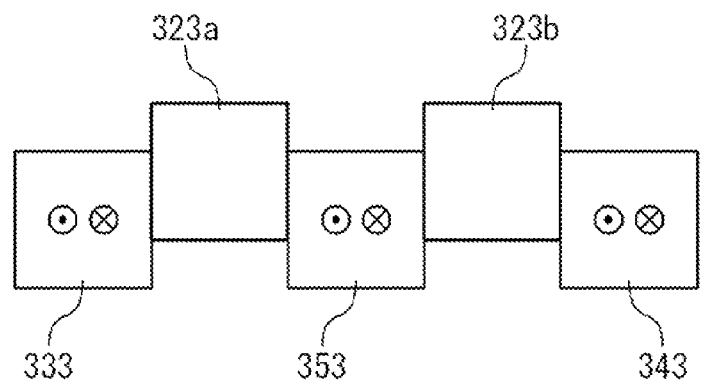
FIG. 23D is a diagram schematically showing the modification example of the configuration of the non-volatile logic circuit according to the fifth exemplary embodiment of the present invention.

Also, as shown in FIG. 23D, the shapes of the sensor layers 323a and 323b the output sections 302a and 302b, may be the arrangement in which the sensor layers 323a and 323b are shifted to the input sections 303 and 304, and the control section 305 in the direction of +y. When the output sections are shifted to the direction of +y, there is an advantage that it becomes easy to turn the magnetization direction of the sensor layer to the direction of +y, when the magnetization direction of the input sections which are on either side, and the control section 5 becomes parallel each other. In this case, too, the overlapping arrangement may be used as in FIG. 23B and FIG. 23C.

Figure 24C:
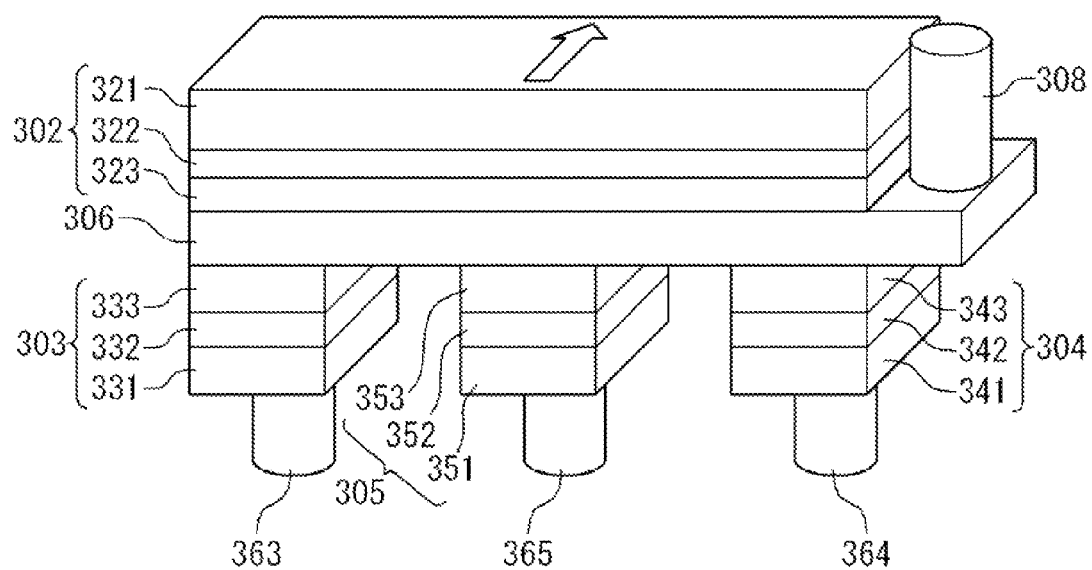
FIG. 24C is a diagram showing the other modification example of the configuration of the non-volatile logic circuit according to the fifth exemplary embodiment of the present invention.

Also, in the present exemplary embodiment, the shapes of the sensor layers 322a and 322b of the output sections 302a and 302b are not limited to those shown in FIG. 20A and FIG. 20B. FIG. 24A to FIG. 24C are diagrams showing other modification examples of the configuration of the non-volatile logic circuit according to the fifth exemplary embodiment of the present invention. As shown in FIG. 24A, the sensor layer of the output sections 302a and 302b may be a single large sensor layer 323. In this case, the sensor layer 323 has a multi-magnetic-domain structure. For example, the symbols "p" and "q" in FIG. 21A indicate the magnetization directions of the magnetic domains corresponding to positions in the output sections 302a and 302b ("p" and "q" shown as an area surrounded by a broken line), as shown in FIG. 24B (corresponding to FIG. 21A). By adopting such a configuration, the manufacture of the output section can be facilitated. Moreover, as shown in FIG. 24C, the reference layer and the output section (the whole of MTJ) may be manufactured as a large output section 302. In this case, too, the sensor layer 323 is formed to have the multi-magnetic-domain structure as shown in FIG. 24B. By such a configuration, the manufacture of the output section can be more facilitated. In these cases, two output terminals are provided to supply a read current to the output section/draw out it, as in FIG. 20A.

Also, in the present exemplary embodiment, the magnetization pinned layer (the hard layer) for the initialization may be provided in the neighborhood of each of the pinned layers of the input sections 303 and 304 and the control section 305 (not shown). However, the position of the magnetization pinned layer is optional if neighbor.

Figure 25A:
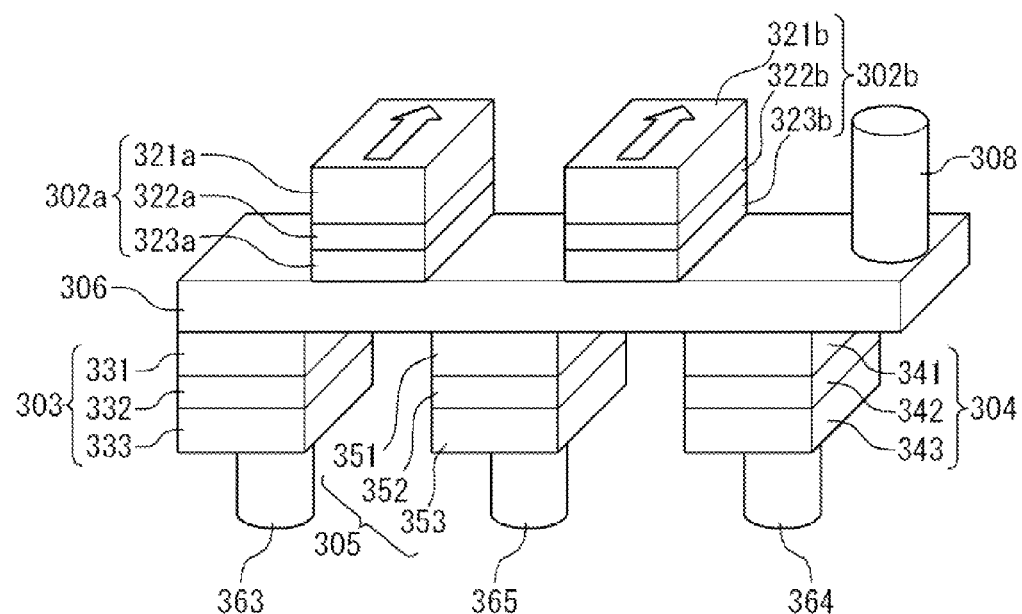
FIG. 25A is a diagram schematically showing the configuration of another modification example of the non-volatile logic circuit according to the fifth exemplary embodiment of the present invention.
Figure 25B:
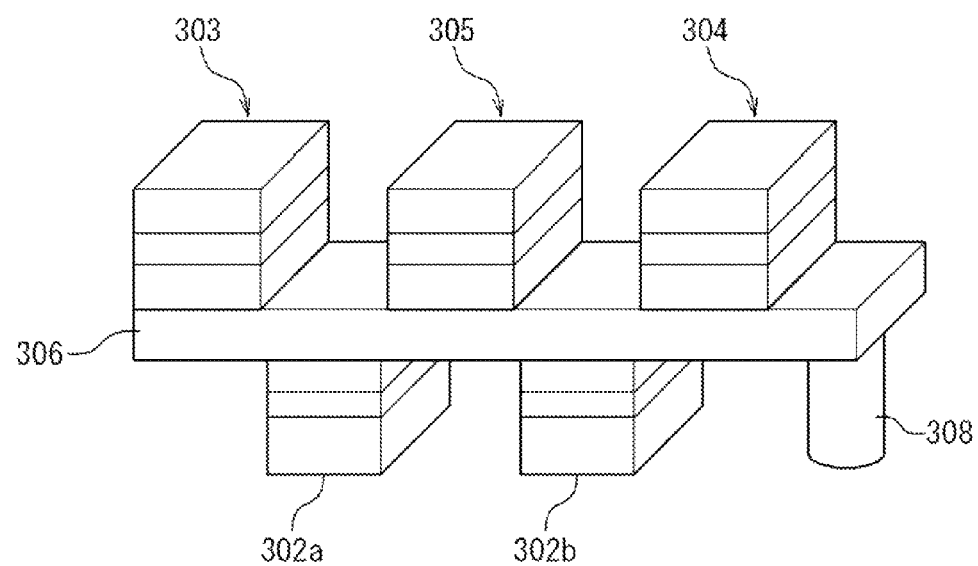
FIG. 25B is a diagram schematically showing the configuration of the modification example of the non-volatile logic circuit according to the fifth exemplary embodiment of the present invention.

Moreover, in the present exemplary embodiment, the position relation of the sections in the non-volatile logic circuit 301 is not limited to examples shown in FIG. 20A and FIG. 20B. FIG. 25A and FIG. 25B are diagrams schematically showing the configurations of other modification examples of the non-volatile logic circuit according to the fifth exemplary embodiment of the present invention. As shown in FIG. 25A, in the non-volatile logic circuit 301, the input sections 303 and 304, the control section 305 are turned up and down to the xv plane and the pinned layers 331, 341, 351 may contact the conductor layer 306. Also, as shown in FIG. 25B, the upper and lower relation (in the direction of z) may be turned between the input sections 303 and 304 and the control section 305, and the output sections 302a and 302b.

Moreover, in the present exemplary embodiment, the number of sections for each function in the non-volatile logic circuit 301 is not limited to the examples shown in FIG. 20A and FIG. 20B. FIG. 26 is a diagram schematically showing another modification example of the configuration of the non-volatile logic circuit according to the fifth exemplary embodiment of the present invention. As shown in FIG. 26, a plurality of the input sections and a plurality of the output sections may be provided. In an example of this figure, if the input sections 307 and 309 are added and output sections 302c and 302d are added. At this time, for example, the output data is "1" when the memory layers of all the input sections and the bias layer in the control section 5 are on the side of +z (or on the side of −z), and the output data is "0" otherwise, the NOR operation and the AND operation can be realized, like cases of FIG. 21A and FIG. 21B.

Sixth Exemplary Embodiment

Figure 27:
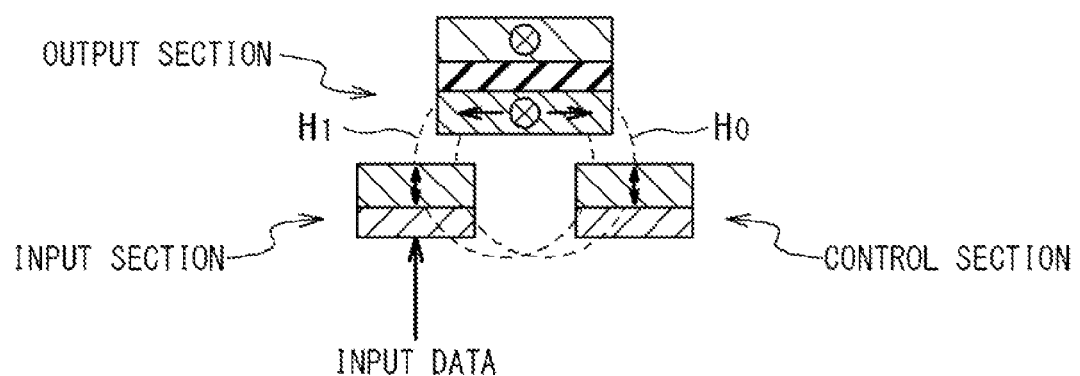
FIG. 27 is a diagram schematically showing the principle of the non-volatile logic circuit according to the present invention.

Hereinafter, the non-volatile logic circuit according to a sixth exemplary embodiment of the present invention will be described. FIG. 27 is a diagram schematically showing the principle of the non-volatile logic circuit according to the sixth exemplary embodiment of the present invention. The non-volatile logic circuit is provided with an input section, a control section and an output section. The input section and the control section have perpendicular magnetic anisotropy and contain ferromagnetic layers in which the magnetization state is changeable. The output section is provided in the neighborhood of the input section and the control section and contains a magnetic tunnel junction element in which the magnetization state is changeable. The magnetization state of the input section is changed based on the input data. The magnetization state of the magnetic tunnel junction element in the output section is changed based on the magnetization states of the input section and the control section. That is, the magnetization state of the magnetic tunnel junction element in the output section is changed in response to the leakage magnetic fields (H1, H0) which change based on the magnetization states of the input section and the control section. The output data for the input data can be obtained by detecting the resistance value of the magneto-resistance junction in which the magnetization state is changed. In this case, the control section, the input section and the output section configure the device attaining a logical element function and a memory function.

1. Basic Configuration of Non-Volatile Logic Circuit

Figure 28A:
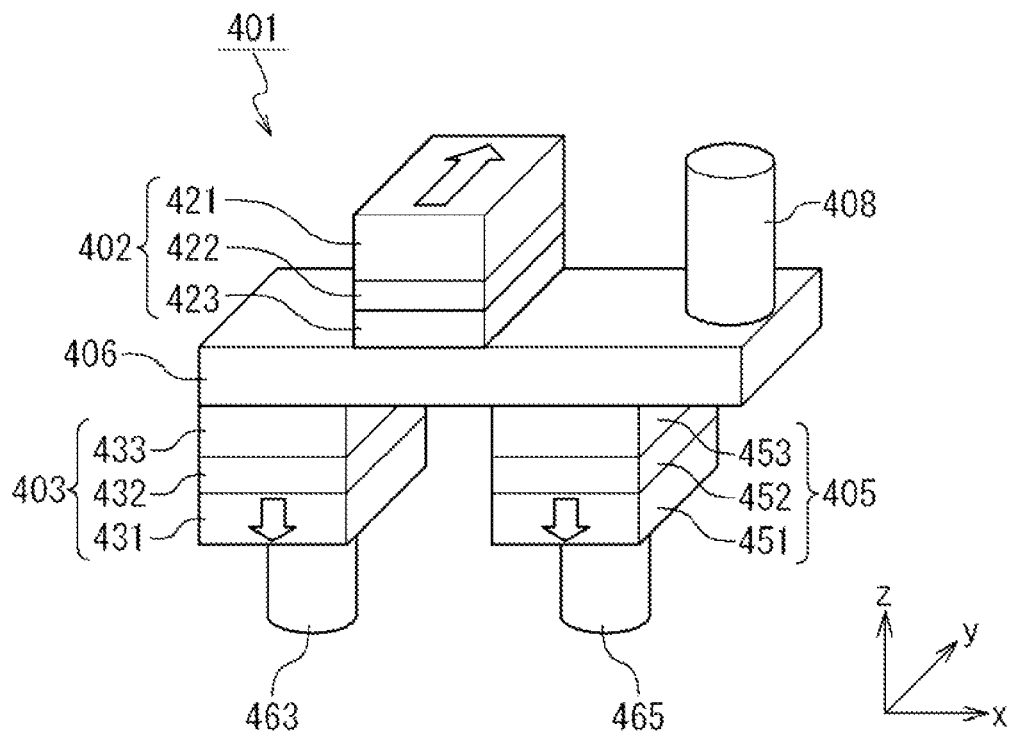
FIG. 28A is a perspective view showing the configuration of the non-volatile logic circuit according to a sixth exemplary embodiment of the present invention.
Figure 28B:
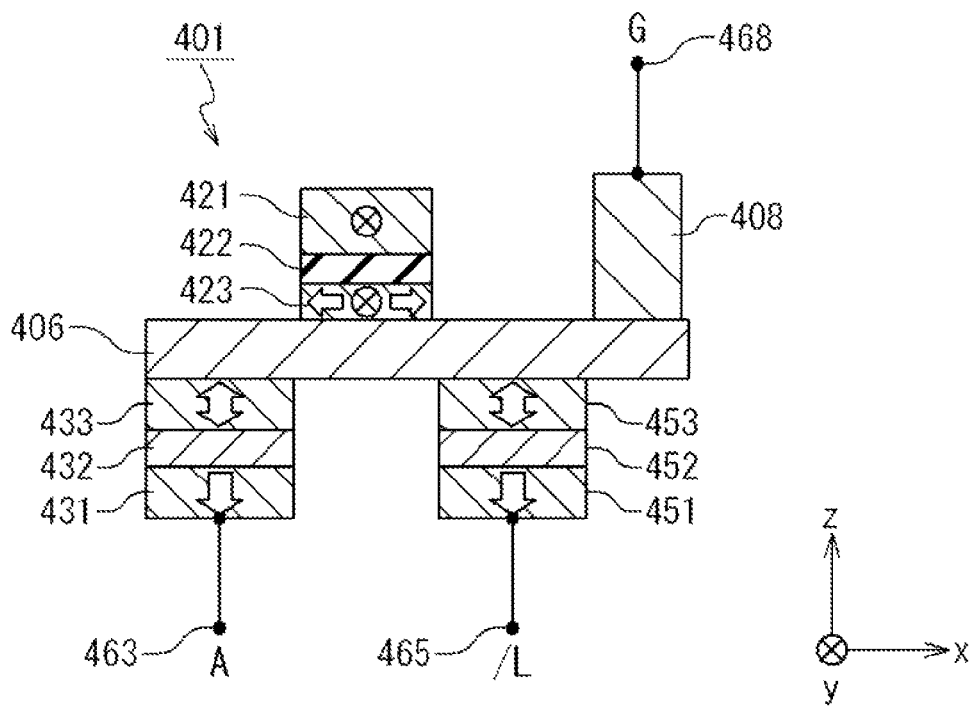
FIG. 28B is a sectional view showing the configuration of the non-volatile logic circuit according to the sixth exemplary embodiment of the present invention.

Hereinafter, the basic configuration of the non-volatile logic circuit according to the sixth exemplary embodiment of the present invention will be described. FIG. 28A is a perspective view showing the configuration of the non-volatile logic circuit according to the sixth exemplary embodiment of the present invention. FIG. 28B is a sectional view showing the configuration of the non-volatile logic circuit according to the sixth exemplary embodiment of the present invention. The non-volatile logic circuit 401 is provided with an input section 403, an output section 402, a control section 405, a conductor layer 406 and a plug 408.

In the non-volatile logic circuit 401, the number of input sections and the number of output sections are respectively less by one than the non-volatile logic circuit 301 (in the fifth exemplary embodiment). Otherwise, the non-volatile logic circuit 401 is the same as the non-volatile logic circuit 301. Therefore, the description of the same configuration is omitted. Here, the input section 403 (a pinned layer 431, an intermediate layer 432, and a memory layer A433), the output section 402 (a reference layer 421, a barrier layer 422, and a sensor layer 423), and the control section 405 (a pinned layer 451, an intermediate layer 452 and a bias layer 353), the conductor layer 406 and the plug 408 correspond to the input section 303 (the pinned layer 331, the intermediate layer 332, and the memory layer A 333), the output section 302a (the reference layer 321a, the barrier layer 322a, and the sensor layer 323a), the control section 305 (the pinned layer 351, the intermediate layer 352 and the bias layer 353), the conductor layer 306 and the plug 308, respectively.

2. Operation Principle of Non-Volatile Logic Circuit

Next, the principle of operation of the non-volatile logic circuit according to the sixth exemplary embodiment of the present invention will be described.

FIG. 29A and FIG. 29B are tables showing a relation to the magnetization directions of the memory layer A, the bias layer and the sensor layer according to the sixth exemplary embodiment of the present invention. Here, the symbol "A" shows the input data which is written in the input section 403, and the symbol "a" shows the magnetization direction of the memory layer A433. The symbol "l" shows the magnetization direction of the bias layer 453, and "r" shows the magnetization direction of the sensor layer 423. The symbol "out" shows output data. Also, the mark of cross in a white circle shows the magnetization in the direction of −z, and the mark of a black dot in a white circle shows the magnetization in the direction of +z. The upward direction arrow shows the magnetization in the direction of +y, and the right direction arrow shows the magnetization in the direction of +x. The left direction arrow shows the magnetization in the direction of −x.

Also, in an example of this figure, the input data to the input section 403 is set to "0" when the magnetization directions of the pinned layer 431 and the memory layer A433 in the input section 403 are parallel, i.e. the magnetization direction of the memory layer A433 is the direction of −z. On the other hand, the input data into the input section 403 is set to "1" when they are anti-parallel, i.e. the magnetization direction of the memory layer A433 is the direction of +z. Oppositely, when the magnetization directions of the pinned layer 451 and the bias layer 453 in the control section 405 are anti-parallel, i.e. when the magnetization direction of the bias layer 453 is +z, the control data of the control section 405 is set to "0". On the other hand, the control data of the control section 405 is set to "1" when they are parallel, i.e. the magnetization direction of the bias layer 453 is −z.

FIG. 29A will be described. FIG. 29A shows a case where the magnetization direction of the bias layer 453 in the control section 405 is previously set to the direction of +z (the control data "0").

(1) Case ϵ1

The input data ("A") in the input section 403 is "0" and the magnetization direction ("a") of the memory layer A433 is the direction of −z. The control data of the control section 405 is "0" and the magnetization direction ("1") of the bias layer 453 is the direction of +z. At this time, the magnetic field (the leakage magnetic field) having a component in the direction of −x due to the input section 403 and the magnetic field (the leakage magnetic field) having a component in the direction of −x due to the control section 405 are applied to the sensor layer 423 in the output section 402. As a result, because both of the magnetic fields are enhanced by each other, the magnetization direction ("r") of the sensor layer 423 in the output section 402 is set to the direction of −x which is parallel to the magnetic fields. As a result, the magnetization directions of the reference layer 421 and the sensor layer 423 in the output section 402 are shifted with respect to each other by 90 degrees and the MTJ in the output section 402 has a high resistance compared with the parallel case. The output data ("out") is set to "0" when the output section 402 has the high resistance.

(2) Case ϵ2

The input data into the input section 403 is "1" and the magnetization direction of the memory layer A433 is the direction of +z. The control data of the control section 405 is "0" and the magnetization direction of the bias layer 453 is the direction of +z. At this time, the magnetic field having a component in the direction of +x due to the input section 403 and the magnetic field having a component in the direction of −x due to the control section 405 are applied to the sensor layer 423 in the output section 402. As a result, the magnetization direction of the sensor layer 423 in the output section 402 is set to the direction of +y as the direction of the magnetization easy axis, because both of the magnetic fields are substantially cancelled by each other. As a result, the magnetization directions of the reference layer 421 and the sensor layer 423 in the output section 402 becomes parallel and the MTJ in the output section 402 has a low resistance. The output data is set to "1" when the output section 402 has the low resistance.

As mentioned above, the non-volatile logic circuit 401 outputs the output data "0" and "1" to the input data "0" and "1", respectively. That is, when the control data "0" is set to the control section 405, the non-volatile logic circuit 401 outputs an input data just as it is. Hereinafter, such a logic circuit is defined as a Through circuit.

Next, FIG. 29B will be described. FIG. 29B shows a case where the magnetization direction of the bias layer 453 in the control section 405 is previously set to the direction of −z (the control data "1").

(1) Case ξ1

The input data ("A") in the input section 403 is "0" and the magnetization direction ("a") of the memory layer A433 is the direction of −z. The control data of the control section 405 is "1" and the magnetization direction ("1") of the bias layer 453 is the direction of −z. At this time, the magnetic field (the leakage magnetic field) having a component in the direction of −x due to the input section 403 and the magnetic field (the leakage magnetic field) having a component in the direction of +x due to the control section 405 are applied to the sensor layer 423 in the output section 402. As a result, the magnetization direction ("r") of the sensor layer 423 in the output section 402 is set to the direction of +y as the direction of the magnetization easy axis, because both of the magnetic fields are substantially cancelled by each other. As a result, the magnetization directions of the reference layer 421 and the sensor layer 423 in the output section 402 becomes parallel and the MTJ in the output section 402 has a low resistance. The output data ("out") is set to "1" when the output section 402 has the low resistance.

(2) Case ξ2

The input data into the input section 403 is "1" and the magnetization direction of the memory layer A433 is the direction of +z. The control data of the control section 405 is "1" and the magnetization direction of the bias layer 453 is the direction of −z. At this time, the magnetic field having a component in the direction of +x due to the input section 403 and the magnetic field having a component in the direction of +x due to the control section 405 are applied to the sensor layer 423 in the output section 402. As a result, the magnetization direction of the sensor layer 423 in the output section 402 is set to the direction of +x which is parallel to the magnetic fields, because both of the magnetic fields are substantially enhanced by each other. As a result, the magnetization directions of the reference layer 421 and the sensor layer 423 in the output section 402 are shifted with respect to each other by 90 degrees and the MTJ in the output section 402 has a high resistance compared with the parallel case. The output data is set to "0" when the output section 402 has the high resistance.

As mentioned above, the non-volatile logic circuit 401 outputs the output data "1" and "0" to the input data "0" and "1", respectively. That is, when the control data "1" is set to the control section 405, the non-volatile logic circuit 401 can operate as the NOT circuit.

The non-volatile logic circuit 401 in the present exemplary embodiment can be used as a Through circuit or a NOT circuit by controlling the magnetization state of the bias layer 353. Therefore, another logic circuit can be configured by configuring the Through circuit and the NOT circuit with the non-volatile logic circuit 401 in the present exemplary embodiment and by combining them. It should be noted that if "1" and "0" are inverted in case of setting of the output data, the Through circuit and the NOT circuit can be opposed.

3. Data Input/Output Principle of Non-Volatile Logic Circuit

Next, the data input/output principle of the non-volatile logic circuit according to the sixth exemplary embodiment of the present invention will be described. The input of the data to the non-volatile logic circuit 401 is carried out by writing data in a GMR element (or a TMR element) in each of the control section 405 and the input section 403. On the other hand, the output of data from the non-volatile logic circuit 401 is carried out by reading the data from the TMR element in the output section 402. The write and read of data based on the data input/output principle are the same as those of the non-volatile logic circuit 301 (the fifth exemplary embodiment). Therefore, the description is omitted.

4. Logic Gate Using Non-Volatile Logic Circuit

Figure 30:
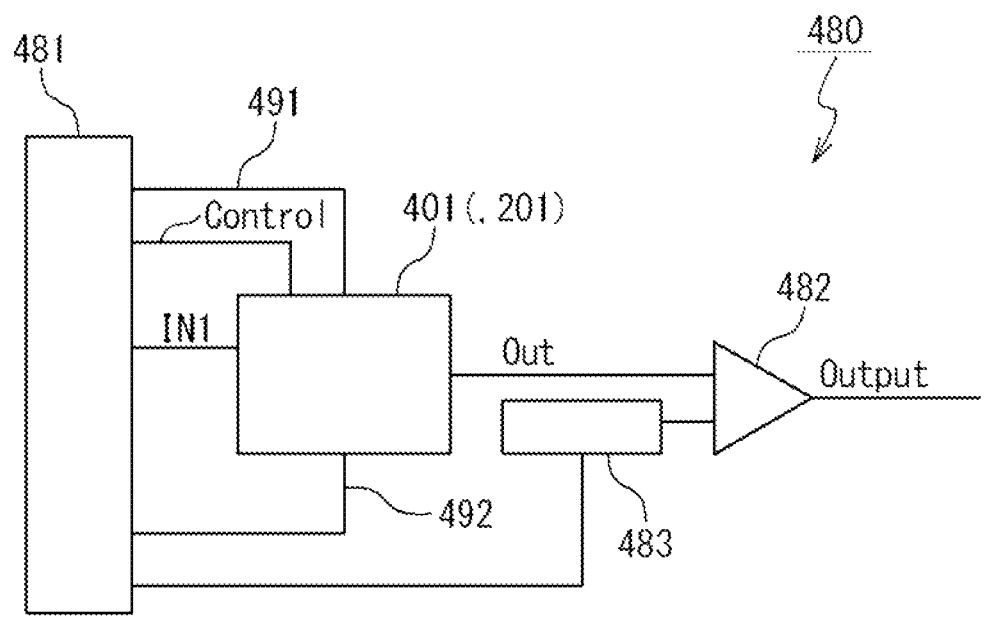
FIG. 30 is a block diagram showing an example of the logic gate in the sixth exemplary embodiment of the present invention.

Next, the configuration and the operation of the logic gate using the non-volatile logic circuit according to the sixth exemplary embodiment of the present invention will be described. FIG. 30 is a block diagram showing an example of the logic gate according to the sixth exemplary embodiment of the present invention. The logic gate 480 is provided with a control circuit 481, the non-volatile logic circuit 401, an MTJ reference element 483 and a comparator 482.

The control circuit 481 is provided with a switch to convert a logic input or a logic control value into a current. The control circuit 481 generates the write current IW having a value and direction corresponding to the control data as a preliminary setting operation of the non-volatile logic circuit 401, in response to the supply of the control data. Then, the control circuit 481 supplies the generated current to a route of the control terminal 465 of the non-volatile logic circuit 401, the control section 405, the conductor layer 406 and the plug 408 through a terminal Control and a terminal 492. With this, the control data can be set to the control section 405 (the bias layer 453). As a result, the non-volatile logic circuit 401 can be set to a desired logical operation circuit (e.g. the NOT circuit).

Also, first, the control circuit 481 generates the write current IW1 having a value and direction corresponding to the input data as the operation of the non-volatile logic circuit 401, in response to the supply of the input data. Then, the control circuit 481 supplies the generated current to the route of the first input terminal 463 of the non-volatile logic circuit 401, the input section 403, the conductor layer 406 and the plug 468 through a terminal IN1 and a terminal 492. With this, the input data can be inputted to the input section 403. After that, the control circuit 481 generates a read current IR. Thus, the read current is supplied to the route of the output terminal (not shown), the output section 402, the conductor layer 406 and the plug 408 through the terminal 491 and the terminal 492. At this time, the voltage (the output voltage) corresponding to the resistance value of the MTJ in the output section 402 is outputted from the terminal Out to the comparator 482. The comparator 482 outputs a final output data comparing the output voltage from the non-volatile logic circuit 401 and the reference voltage from the MTJ reference element 483. With this, the non-volatile logic circuit 401 can output the output data showing the desirable logical operation result to the input data.

By the above configuration and the operation, it is possible that the non-volatile logic circuit 401 is set to the desirable logic circuit and the input of the input data to the non-volatile logic circuit 401 and the output of the output data from the non-volatile logic circuit 401 can be carried out.

The same effect as in the non-volatile logic circuit 301 in the fifth exemplary embodiment can be attained in the non-volatile logic circuit 401 in the present exemplary embodiment. In addition, in the non-volatile logic circuit 401 in the present exemplary embodiment, the configuration can be modified like the non-volatile logic circuit 301 in the fifth exemplary embodiment, unless the technical contradiction occurs.

Seventh Exemplary Embodiment

1. Basic Configuration of Non-Volatile Logic Circuit

Figure 31:
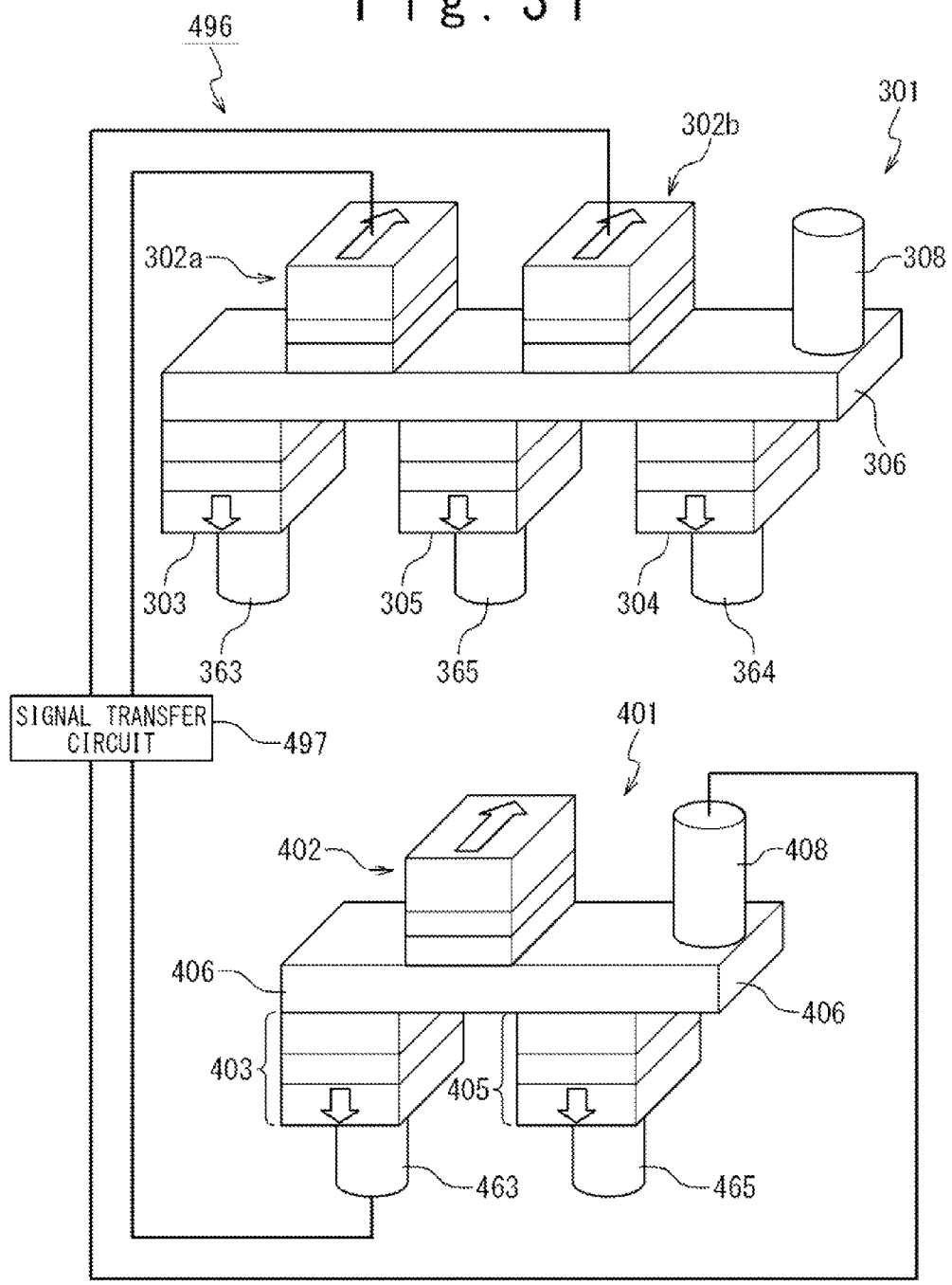
FIG. 31 is a perspective view showing the configuration of the non-volatile logic circuit according to a seventh exemplary embodiment of the present invention.

Hereinafter, the basic configuration of the non-volatile logic circuit according to a seventh exemplary embodiment of the present invention will be described. FIG. 31 is a perspective view showing the configuration of the non-volatile logic circuit according to the seventh exemplary embodiment of the present invention. The non-volatile logic circuit 496 is provided with the non-volatile logic circuit 301 according to the fifth exemplary embodiment, the non-volatile logic circuit 401 according to the sixth exemplary embodiment and a signal transferring circuit 497.

The non-volatile logic circuit 496 is a circuit in which the non-volatile logic circuit 301 (the fifth exemplary embodiment) and the non-volatile logic circuit 401 (the sixth exemplary embodiment) are combined. That is, the output data of the non-volatile logic circuit 301 is the input data of the non-volatile logic circuit 401. Specifically, first, the first input data is inputted to the input section 303 of the non-volatile logic circuit 301 and the second input data is inputted to the input section 304. Next, the magnetization states (the output data) of the output sections 302a and 302b which are changed based on the input data are detected by the signal transferring circuit 497. That is, the signal transferring circuit 497 detects the resistance values of the output sections 302a and 302b and the output data determines to be "0" or "1". Then, the signal transferring circuit 497 supplies the determined output data to the input section 403 of the non-volatile logic circuit 401 as the input data. The magnetization state (the output data) of the output section 402 which is changed based on the input data, is the final output data of the non-volatile logic circuit 496. The other matters are the same as those of the non-volatile logic circuits 301 and 401. Therefore, the description is omitted.

2. Operation Principle of Non-Volatile Logic Circuit

Next, the operation principle of the non-volatile logic circuit according to the seventh exemplary embodiment of the present invention will be described.

FIG. 32A and FIG. 32B are tables showing a relation of the magnetization directions of the memory layers A and B, the bias layer and the sensor layer of each of the non-volatile logic circuits according to the seventh exemplary embodiment of the present invention. Here, the symbol "A" shows the input data which is written in the input section 303 (the memory layer A), and the symbol "B" shows the input data which is written in the input section 304 (the memory layer B). The symbol "a" shows the magnetization direction of the memory layer A 333, and the symbol "b" shows the magnetization direction of the memory layer B 343. The symbol "l1" shows the magnetization direction of the bias layer 353. The symbol "p" shows the magnetization direction of the sensor layer 323a, and the symbol "q" shows the magnetization direction of the sensor layer 323b. The symbol "O-1" shows the output data of the output sections 302a and 302b and the input data to be written in the input section 403. The symbol "o" shows the magnetization direction of the memory layer A 433, and the symbol "l2" shows the magnetization direction of the bias layer 453. The symbol "r" shows the magnetization direction of the sensor layer 423. The symbol "O-2" shows the output data from the output section 402, i.e. the output data of the non-volatile logic circuit 496. Also, the mark of cross in a white circle shows the magnetization direction in the direction of −z. The mark of a black dot in a white circle shows the magnetization direction in the direction of +z. The upward direction arrow shows the magnetization direction in the direction of +y. The right direction arrow shows the magnetization direction in the direction of +x. The left direction arrow shows the magnetization direction in the direction of −x. The setting of "0" and "1" of each input data, each the control data and each output data is the same as those of the non-volatile logic circuits 301 and 401. Therefore, the description is omitted.

FIG. 32A will be described. FIG. 32A shows a case where the magnetization direction of the bias layer 353 in the control section 305 is previously set to the direction of −z (the control data "0"), and the magnetization direction of the bias layer 453 in the control section 405 is previously set to the direction of +z (the control data "0"). Thus, the non-volatile logic circuit 301 operates as the NOR circuit, as shown in FIG. 21A. On the other hand, the non-volatile logic circuit 401 operates as the Through circuit as shown in FIG. 29A. That is, the non-volatile logic circuit 496 operates as the NOR circuit as a whole.

(1) Case η1

The input data ("A") in the input section 303 is "0" and the input data ("B") in the input section 304 is "0". This is a case γ1 in FIG. 21A. In this case, the output data of the output section 302a of the non-volatile logic circuit 301 and 302b is "1". Therefore, the input data ("O-1") in the input section 403 is "1". This is case ε2 in FIG. 29A. Therefore, the output data ("O-2") from the output section 402 is "1".

(2) Case η2

The input data into the input section 303 is "0" and the input data into the input section 304 is "1". This is case γ2 in FIG. 21A. In this case, the output data of the output section 302a of the non-volatile logic circuits 301 and 302b is "0". Therefore, the input data into the input section 403 is "0". This is case ε1 in FIG. 29A. Therefore, the output data from the output section 402 is "0".

(3) Case η3

The input data into the input section 303 is "1" and the input data into the input section 304 is "0". This is case γ3 in FIG. 21A. In this case, the output data of the output section 302a of the non-volatile logic circuits 301 and 302b is "0". Therefore, the input data into the input section 403 is "0". This is case ε1 in FIG. 29A. Therefore, the output data from the output section 402 is "0".

(4) Case η4

The input data into the input section 303 is "1" and the input data into the input section 304 is "1". This is case γ4 in FIG. 21A. In this case, the output data of the output section 302a in the non-volatile logic circuits 301 and 302b is "0". Therefore, the input data into the input section 403 is "0". This is case ε1 in FIG. 29A. Therefore, the output data from the output section 402 is "0".

As mentioned above, the non-volatile logic circuit 496 outputs the output data "1", "0", "0", and "0" to the input data "00", "01", "10", and "11", respectively. That is, when the control data "0", and "0" are respectively set to the control sections 305 and 405, the non-volatile logic circuit 496 can operate as the NOR circuit.

Next, FIG. 32B will be described. FIG. 32B shows a case where the magnetization direction of the bias layer 353 in the control section 305 is previously set to the direction of +z (the control data "1") and the magnetization direction of the bias layer 453 in the control section 405 is previously set to the direction of −z (the control data "1"). The non-volatile logic circuit 301 operates as the AND circuit as shown in FIG. 21B. On the other hand, the non-volatile logic circuit 401 operates as the NOT circuit as shown in FIG. 29B. That is, the non-volatile logic circuit 496 operates as the NAND circuit as a whole.

(1) Case θ1

The input data ("A") in the input section 303 is "0" and input data ("B") in the input section 304 is "0". This is case Ed in FIG. 21B. In this case, the output data of the output section 302a in the non-volatile logic circuits 301 and 302b is "0". Therefore, input data ("O-1") in the input section 403 is "0". This is case ξ1 in FIG. 29B. Therefore, output data ("O-2") from the output section 402 is "1".

(2) Case θ2

The input data into the input section 303 is "0" and the input data into the input section 304 is "1". This is case δ2 in FIG. 21B. In this case, the output data of the output section 302a in the non-volatile logic circuits 301 and 302b is "0". Therefore, the input data into the input section 403 is "0". This is case ξ1 in FIG. 29B. Therefore, the output data from the output section 402 is "1".

(3) Case θ3

The input data into the input section 303 is "1" and the input data into the input section 304 is "0". This is case δ3 in FIG. 21B. In this case, the output data of the output section 302a of the non-volatile logic circuits 301 and 302b is "0". Therefore, the input data into the input section 403 is "0". This is case ξ1 in FIG. 29B. Therefore, the output data from the output section 402 is "1".

(4) Case θ4

The input data into the input section 303 is "1" and the input data into the input section 304 is "1". This is case δ4 in FIG. 21B. In this case, the output data of the output section 302a of the non-volatile logic circuits 301 and 302b is "1". Therefore, the input data into the input section 403 is "1". This is case ξ2 in FIG. 29B. Therefore, the output data from the output section 402 is "0".

As mentioned above, the non-volatile logic circuit 496 outputs the output data "1", "1", "1", and "0" to the input data "00", "01", "10", and "11", respectively. That is, when the control data "1" and "1" are respectively set to the control sections 305 and 405, the non-volatile logic circuit 496 can operate as the NAND circuit.

In this way, the non-volatile logic circuit 496 in the present exemplary embodiment can be used as the NOR circuit or the NAND circuit by controlling the magnetization states of the control sections 305 and 405 of the non-volatile logic circuits 301 and 401. Therefore, another logic circuit can be configured by configuring the NOR circuit and the NAND circuit with the non-volatile logic circuit 496 in the present exemplary embodiment and combining them.

3. Data Input/Output Principle of Non-Volatile Logic Circuit

Next, the data input/output principle of the non-volatile logic circuit according to the seventh exemplary embodiment of the present invention is the same as the fifth exemplary embodiment (the non-volatile logic circuit 301) and the sixth exemplary embodiment (the non-volatile logic circuit 401). Therefore, the description is omitted.

4. Logic Gate Using Non-Volatile Logic Circuit

Next, the configuration and operation of the logic gate using the non-volatile logic circuit according to the seventh exemplary embodiment of the present invention can be realized by combining the fifth exemplary embodiment (the logic gate 380 using the non-volatile logic circuit 301: FIG. 22) and the sixth exemplary embodiment (the logic gate 480 using the non-volatile logic circuit 401: FIG. 30). Therefore, the description is omitted. Here, the signal transferring circuit 497 can be configured from, for example, the comparator 382, the MTJ reference element 383, and a part which controls the comparator 382 and the MTJ reference element 383 in the control circuit 381 in FIG. 22.

In the non-volatile logic circuit 496 of the present exemplary embodiment, too, the same effect as the non-volatile logic circuit 301 in the fifth exemplary embodiment and the non-volatile logic circuit 401 in the sixth exemplary embodiment can be attained. Moreover, because the NOR circuit and the NAND circuit can be configured, all the logic circuits can be configured by combining them. In addition, in the non-volatile logic circuit 496 in the present exemplary embodiment, too, the configuration can be modified in the same way as the non-volatile logic circuit 301 in the fifth exemplary embodiment and the non-volatile logic circuit 401 in the sixth exemplary embodiment, unless the technical contradiction occurs.

Eighth Exemplary Embodiment

1. Basic Configuration of Non-Volatile Logic Circuit

Figure 33A:
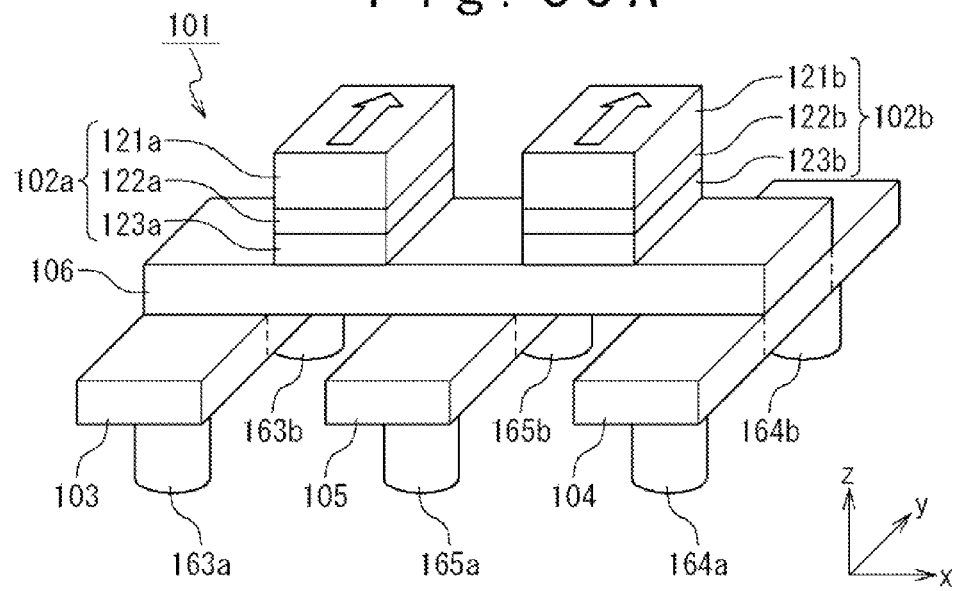
FIG. 33A is a perspective view showing the configuration of the non-volatile logic circuit according to an eighth exemplary embodiment of the present invention.
Figure 33B:
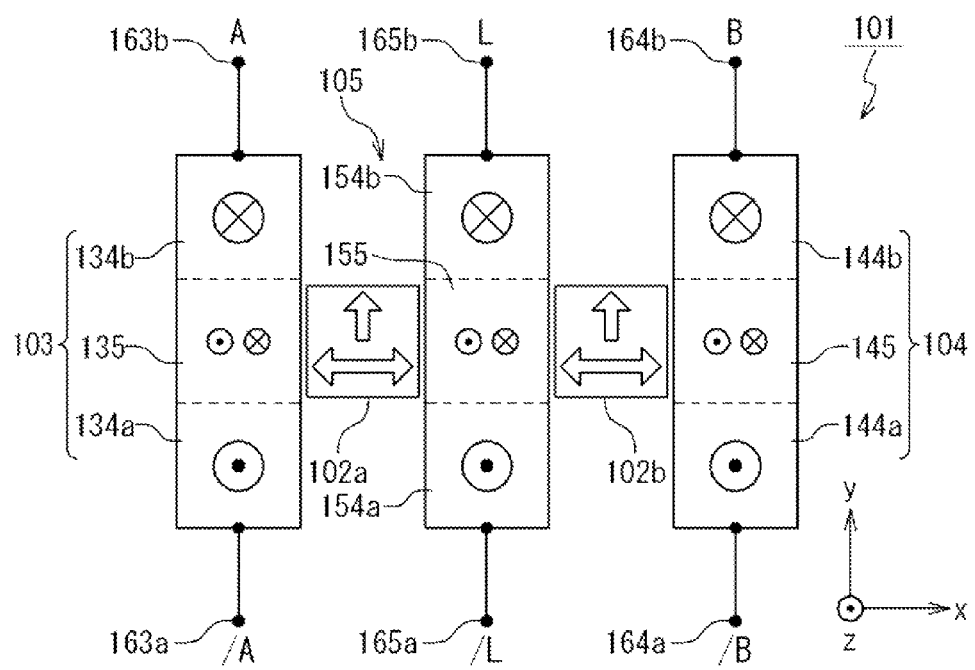
FIG. 33B is a plan view showing the configuration of the non-volatile logic circuit according to the eighth exemplary embodiment of the present invention.

Hereinafter, the basic configuration of the non-volatile logic circuit according to an eighth exemplary embodiment of the present invention will be described. FIG. 33A is a perspective view showing the configuration of the non-volatile logic circuit according to the eighth exemplary embodiment of the present invention. FIG. 33B is a plan view showing the configuration of the non-volatile logic circuit according to the eighth exemplary embodiment of the present invention. The non-volatile logic circuit 101 is provided with input sections 103 and 104, and the output sections 102*a* and 102*b*, the control section 105 and the conductor layer 106.

The input section 103 is a domain wall motion element which extends into the direction of +y and is a ferromagnetic layer having perpendicular magnetic anisotropy. The input section 103 is provided with the first magnetization pinned region 34*a*, the second magnetization pinned region 34*b* and the magnetization invertible region 135. The magnetization invertible region 135 is put between the first magnetization pinned region 34*a* and the second magnetization pinned region 34*b*. The magnetization direction of the first magnetization pinned region 34*a* is substantively fixed on the direction of +z. The magnetization direction of the second magnetization pinned region 34*b* is substantially fixed on the direction of −z. The magnetization direction of the magnetization invertible region 135 is not fixed and is invertible between the direction of −z and the direction of +z.

Here, the magnetization invertible region 135 is magnetically coupled with the sensor layer 123*a* in the output section 102*a* to be described later. Therefore, the magnetization direction of the magnetization invertible region 135 has an influence on the magnetization state of the sensor layer 123*a* in the output section 102*a*.

When the magnetization direction of the magnetization invertible region 135 is the direction of +z, the domain wall DW is formed in the neighborhood of the boundary between the second magnetization pinned region 34*b* and the magnetization invertible region 135. The magnetization state of the input section 103 is hereinafter referred to as a "first magnetization state MS1". On the other hand, when the magnetization direction of the magnetization invertible region 135 is the direction of −z, the domain wall DW is formed in the neighborhood of the boundary between the first magnetization pinned region 34*a* and the magnetization invertible region 135. The magnetization state of the input section 103 is hereinafter referred to as a "second magnetization state MS2". The magnetization state of input sections 103, i.e. the magnetization direction of the magnetization invertible region 135 can be changed by applying the write current to the direction of y. The write current is applied between the first input terminal 163*a* connected with the first magnetization pinned region 34*a* and the second input terminal 163*b* connected with the second magnetization pinned region 34*b*.

Specifically, for example, in order to change the magnetization state from the first magnetization state MS1 to the second magnetization state MS2, the first write current IW1 is applied in a direction from the first input terminal 163*a* to the second input terminal 163*b*. The spin polarized electrons in the direction of −z are supplied from the second magnetization pinned region 34*b* to the magnetization invertible region 135. The domain wall DW is driven by the spin torque effect and moves into the direction from the second magnetization pinned region 34*b* to the first magnetization pinned region 34*a*. As a result, the magnetization direction of the magnetization invertible region 135 is inverted to the direction of −z and the second magnetization state MS2 is attained. On the other hand, in order to change the magnetization state from the second magnetization state MS2 to the first magnetization state MS1, the second write current IW2 is applied from the second input terminal 163*b* to the first input terminal 163*a*. In this case, spin polarized electrons in the direction of +z are supplied from the first magnetization pinned region 34*a* to the magnetization invertible region 135. The domain wall DW is driven by the spin torque effect and moves into the direction from the first magnetization pinned region 34*a* to the second magnetization pinned region 34*b*. As a result, the magnetization direction of the magnetization invertible region 135 is inverted to the direction of +z and first magnetization state MS1 is attained.

In this way, the domain wall DW moves with the write current which flows between the first magnetization pinned region 34*a* and the second magnetization pinned region 34*b*. This inverts the magnetization direction of the magnetization invertible region 135 and the magnetization state of the input section 103 changes. That is, the input data is inputted to the input section 103. Which of the first magnetization state MS1 and the second magnetization state MS2 is attained depends on the direction of the write current. In other words, by controlling the direction of the write current, the input data inputted to the input section 103 can be set.

In the same way, the input section 104 is a domain wall motion type element which extends into the direction of +y and is a ferromagnetic layer having perpendicular magnetic anisotropy. The input section 104 has the first magnetization pinned region 44*a*, the second magnetization pinned region 44*b* and the magnetization invertible region 145. These are the same as the first magnetization pinned region 34*a*, the second magnetization pinned region 34*b* and the magnetization invertible region 135 in the input section 103, respectively, and therefore the description is omitted. Here, the magnetization invertible region 145 is magnetically coupled with the sensor layer 123*b* in the output section 102*b* to be described later. Therefore, the magnetization direction of the magnetization invertible region 145 has an influence on the magnetization state of the sensor layer 123*b* in the output section 102*b*. The control section 105 is arranged between the input section 103 and the input section 104 and is arranged in a straight line in parallel to the direction of x.

In the same way, the control section 105 is a domain wall motion type element which extends into the direction of +y and is a ferromagnetic layer having perpendicular magnetic anisotropy. The control section 105 has a first magnetization pinned region 154*a*, a second magnetization pinned region 154*b* and a magnetization invertible region 155. These are the same as the first magnetization pinned region 34*a*, the second magnetization pinned region 34*b* and the magnetization invertible region 135 in the input section 103, respectively, and therefore the description is omitted. Here, the magnetization invertible region 155 is magnetically coupled with the sensor layer 123*a* in the output section 102*a* and the sensor layer 323*b* in the output section 302*b*, to be described later. Therefore, the magnetization direction of the magnetization invertible region 155 has an influence on the magnetization states of the sensor layer 123*a* in the output section 102*a* and the sensor layer 123*b* in the output section 102*b*. The control section 105 is arranged between the input section 103 and the input section 104 in a straight line in parallel to the input section 103 and the input section 104 in the direction of x.

In the control section 105, in order to realize the non-volatile logic circuit operating at the room temperature, and functioning as a logical element and a memory, the magnetization invertible region 155 may be a ferromagnetic layer whose magnetization direction is fixed. However, in this case, it is impossible to change the logic species (e.g. the NOR and the AND) to be described later. Therefore, a ferromagnetic layer is used whose magnetization direction can be changed, in order to realize the re-configurable non-volatile logic circuit.

As a film having the perpendicular magnetic anisotropy which configures the input sections 103 and 104, and the control section 105, the film as used for the memory layer A 33 in the first exemplary embodiment can be used.

The output section 102a is a TMR element and is provided with the sensor layer 123a, the barrier layer 122a and the reference layer 121a (the MTJ element) which are laminated in the direction of +z. The output section 102b is a TMR element and is provided with the sensor layer 123b, the barrier layer 122b and the reference layer 121b (the MTJ element), which are laminated in the direction of +z. These are the same as the sensor layers 323a and 323b, the barrier layers 322a and 322b, and the reference layers 321a and 321b in the output sections 302a and 302b in the fifth exemplary embodiment, respectively. Therefore, the description is omitted. However, the magnetization invertible regions 135, 145, 155 are magnetically coupled with the sensor layer 123a in the output section 102a and the sensor layer 323b in the output section 302b.

The magnetization invertible region 135 in the input section 103, the magnetization invertible region 145 in the input section 104 and the magnetization invertible region 155 in the control section 105 are connected with the lower surface of the conductor layer 106 extending the direction of x at their upper sides (on the side of +z). The sensor layers 123a and 123b of the output sections 102a and 102b are connected with the upper surface of the conductor layer 106 at their lower side (on the side of −z). The first magnetization pinned region 34a and the second magnetization pinned region 34b in the input section 103 are connected with the first input terminal 163a and the second input terminal 163b, respectively. The first magnetization pinned region 44a and the second magnetization pinned region 44b in the input section 104 are connected with the first input terminal 164a and the second input terminal 164b, respectively. The first magnetization pinned region 154a and the second magnetization pinned region 154b in the control section 105 are connected with the first control terminal 165a and the second control terminal 165b, respectively. It should be noted that output terminals (not shown) are connected with the reference layers 121a and 121b of the output sections 102a and 102b, respectively.

The conductor layer 106, the first input terminals 163a and 164a, the second input terminals 163b and 164b, the first control terminal 165a, the second control terminal 165b, the output terminals (not shown) may be formed of a material which is used for usual wiring, a terminal (via) and so on in a semiconductor device such as Cu, Al, and W.

With respect to the position relation of the input section 103, the input section 104, the control section 105, and the output sections 102a and 302b on the xy plane, it is desirable that the output section 102a is arranged between the magnetization invertible region 135 in the input section 103 and the magnetization invertible region 155 in the control section 105, that the output section 102b is arranged between the magnetization invertible region 155 in the control section 305 and the magnetization invertible region 145 in the input section 104, and that they are arranged in a straight line in the direction of x. Otherwise, it is possible to set as follows.

Here, the center of gravity of the output section 102a (the sensor layer 123a) is shifted on the xy plane with respect to the center of gravity of the magnetization invertible region 135 in the input section 103 and the center of gravity of the magnetization invertible region 155 in the control section 105. In other words, when the output section 102a (the sensor layer 123a) and the magnetization invertible region 135 in the input section 103 and the magnetization invertible region 155 in the control section 105 are projected on the plane (the xy plane) which contains the bottom plane of the output section 102a, the position of the center of gravity of the projection of the output section 102a (the sensor layer 123a) is shifted from the position of the center of gravity of the projection of the magnetization invertible region 135 in the input section 103 in the direction of +x and is shifted from the position of the center of gravity of the projection of the magnetization invertible region 155 in the control section 105 in the direction of −x.

In the same way, the center of gravity of the output section 102b (the sensor layer 123b) is shifted on the xy plane with respect to the center of gravity of the magnetization invertible region 145 in the input section 104 and the center of gravity of the magnetization invertible region 155 in the control section 105. In other words, when the output section 102b (the sensor layer 123b) and the magnetization invertible region 145 in the input section 104 and the magnetization invertible region 155 in the control section 105 are projected on the plane (the xy plane) which contains the bottom plane of the output section 102b, the position of the center of gravity of the projection of the output section 102b (the sensor layer 123b) is shifted from the position of the center of gravity of the projection of the magnetization invertible region 145 in the input section 104 in the direction of −x and is shifted from the position of the center of gravity of the projection of the magnetization invertible region 155 in the control section 105 in the direction of +x.

Because there is the above-mentioned position relation, the leakage magnetic fields from the magnetization invertible regions 135 and 145 in the input sections 103 and 104 and the magnetization invertible region 155 in the control section 105 have an influence on the output section 102a (the sensor layer 123a) and 102b (the sensor layer 123b) so that the magnetization states can be changed, to be described later. It should be noted that in the example of this figure, the xy sectional shapes of the input sections 103 and 104, the control section 105, and the output sections 102a and 102b are rectangular. However, the present invention is not limited to the examples and the xy sectional shape may have another sectional shape (e.g. ellipse) if the magnetization state can be changed as described later.

2. Operation Principle of Non-Volatile Logic Circuit

Next, the principle of operation of the non-volatile logic circuit according to the eighth exemplary embodiment of the present invention will be described.

FIG. 34A and FIG. 34B are tables showing relations of the magnetization invertible region and the magnetization direction of the sensor layer in the eighth exemplary embodiment of the present invention. Here, the symbol "A" shows the input data which is written in the input section 103 (the magnetization invertible region 135), and the symbol "B" shows the input data which is written in the input section 104 (the magnetization invertible region 145). The symbol "a"

shows the magnetization direction of the magnetization invertible region 135, and the symbol "b" shows the magnetization direction of the magnetization invertible region 145. The symbol "l" shows the magnetization direction of the magnetization invertible region 155, and the symbol "p" shows the magnetization direction of the sensor layer 123a. The symbol "q" shows the magnetization direction of the sensor layer 123b. The symbol "out" shows output data. Also, the mark of cross in a white circle shows the magnetization in the direction of −z. The mark of a black dot in a white circle shows the magnetization in the direction of +z. The upward direction arrow shows the magnetization in the direction of +y. The right direction arrow shows the magnetization in the direction of +x. The left direction arrow shows the magnetization in the direction of −x.

Also, in this figure, when the magnetization direction of the magnetization invertible region 135 in the input section 103 is the direction of −z, an input data into the input section 103 is set to "0". On the other hand, in case of the direction of +z, an input data is set to "1". Like the input section 103, this is carried out in the input section 104 (the relation between the input data and the magnetization direction of the magnetization invertible region 145), and the control section 105 (the relation between the control data and the magnetization direction of the magnetization invertible region 155).

FIG. 34A will be described. FIG. 34A shows a case where the magnetization direction of the magnetization invertible region 155 in the control section 105 is previously set to the direction of −z (the control data "0").

(1) Case κ1

The input data ("A") in the input section 103 is "0" and the magnetization direction ("a") of the magnetization invertible region 135 is the direction of −z. The input data ("B") in the input section 104 is "0" and the magnetization direction ("b") of the magnetization invertible region 145 is the direction of −z. The control data of the control section 105 is "0" and the magnetization direction ("1") of the magnetization invertible region 155 is the direction of −z. At this time, the magnetic field (the leakage magnetic field) having a component in the direction of −x due to the input section 103 and the magnetic field (the leakage magnetic field) having a component in the direction of +x due to the control section 105 are applied to the sensor layer 123a in the output section 102a. As a result, the magnetization direction ("p") of the sensor layer 123a in the output section 102a is set to the direction of +y as the direction of the magnetization easy axis, because both of the magnetic fields are substantially cancelled by each other. In the same way, at this time, the magnetic field (the leakage magnetic field) having a component in the direction of +x due to the input section 104 and the magnetic field (the leakage magnetic field) having a component in the direction of −x due to the control section 105 are applied to the sensor layer 123b in the output section 102b. As a result, the magnetization direction ("q") of the sensor layer 123b in the output section 102b is set to the direction of +y as the direction of the magnetization easy axis, because both of the magnetic fields are substantially cancelled by each other. As a result, the magnetization direction of the reference layer 121a and the sensor layer 323a in the output section 102a becomes parallel and the MTJ in the output section 102a has a low resistance. In the same way, the magnetization direction of the reference layer 121b and the sensor layer 323b in the output section 102b becomes parallel and the MTJ in the output section 102b has the low resistance. The output data ("out") is set to "1" when these both the output sections have the low resistance.

(2) Case κ2

The input data into the input section 103 is "0" and the magnetization direction of the magnetization invertible region 135 is the direction of −z. The input data into the input section 104 is "1" and the magnetization direction of the magnetization invertible region 145 is the direction of +z. The control data of the control section 105 is "0" and the magnetization direction of the magnetization invertible region 155 is the direction of −z. At this time, the magnetic field having a component in the direction of −x due to the input section 103 and the magnetic field having a component in the direction of +x due to the control section 105 are applied to the sensor layer 123a in the output section 102a. As a result, the magnetization direction of the sensor layer 123a in the output section 102a is set to the direction of +y as the direction of the magnetization easy axis, because both of the magnetic fields are substantially cancelled by each other. On the other hand, at this time, the magnetic field having a component in the direction of −x due to the input section 104 and the magnetic field having a component in the direction of −x due to the control section 105 are applied to the sensor layer 123b in the output section 102b. As a result, the magnetization direction of the sensor layer 123b in the output section 102b is parallel to the magnetic fields and is the direction of −x, because both of the magnetic fields are substantially enhanced by each other. As a result, the magnetization directions of the reference layer 121a and the sensor layer 123a in the output section 102a becomes parallel and the MTJ in the output section 102a has a low resistance. On the other hand, the magnetization directions of the reference layer 121b and the sensor layer 123b in the output section 102b are shifted with respect to each other by 90 degrees, and the MTJ in the output section 102b has a high resistance compared with the parallel case. The output data is set to "0" when at least one of the output sections does not have the low resistance.

(3) Case κ3

The input data into the input section 103 is "1" and the magnetization direction of the magnetization invertible region 135 is the direction of +z. The input data into the input section 104 is "0" and the magnetization direction of the magnetization invertible region 145 is the direction of −z. The control data of the control section 105 is "0" and the magnetization direction of the magnetization invertible region 155 is the direction of −z. At this time, the magnetic field having a component in the direction of +x due to the input section 103 and the magnetic field having a component in the direction of +x due to the control section 105 are applied to the sensor layer 123a in the output section 102a. As a result, because both of the magnetic fields are substantially enhanced by each other, the magnetization direction of the sensor layer 123a in the output section 102a is set to the direction of +x which is parallel to the magnetic fields. On the other hand, at this time, the magnetic field having a component in the direction of +x due to the input section 104 and the magnetic field due to the control section 105 having a component in the direction of −x are applied to the sensor layer 123b in the output section 102b. As a result, the magnetization direction of the sensor layer 123b in the output section 102b is set to the direction of +y as the direction of the magnetization easy axis because both of the magnetic fields are substantially cancelled by each other. As a result, the magnetization directions of the reference layer 121a and the sensor layer 123a in the output section 102a are shifted with respect to each other by 90 degrees, and the MTJ in the output section 102a has a high resistance compared with the parallel case. On the other hand, the magnetization directions of the reference layer 121b and the sensor layer 123b in the output section 102b becomes parallel and the MTJ in the output section 102b has a low resistance. The output data is set to "0" when at least one of the output sections does not have the low resistance.

(4) Case κ4

The input data into the input section 103 is "1" and the magnetization direction of the magnetization invertible region 135 is the direction of +z. The input data into the input section 104 is "1" and the magnetization direction of the magnetization invertible region 145 is the direction of −z. The control data of the control section 105 is "0" and the magnetization direction of the magnetization invertible region 155 is the direction of −z. At this time, the magnetic field having a component in the direction of +x due to the input section 103 and the magnetic field having a component in the direction of +x due to the control section 105 are applied to the sensor layer 123a in the output section 102a. As a result, because both of the magnetic fields are substantially enhanced by each other, the magnetization direction of the sensor layer 123a in the output section 102a is set to the direction of +x which is parallel to the magnetic fields. In the same way, at this time, the magnetic field having a component in the direction of −x due to the input section 104 and the magnetic field having a component in the direction of −x due to the control section 105 are applied to the sensor layer 123b in the output section 102b. As a result, the magnetization direction of the sensor layer 123b in the output section 102b is set to the direction of −x which is parallel to the magnetic fields, because both of the magnetic fields are substantially enhanced by each other. As a result, the magnetization directions of the reference layer 121a and the sensor layer 123a in the output section 102a are shifted with respect to each other by 90 degrees, and the MTJ in the output section 102a has a high resistance compared with the parallel case. In the same way, the magnetization directions of the reference layer 121b and the sensor layer 123b in the output section 102b are shifted with respect to each other by 90 degrees and the MTJ in the output section 102b has a high resistance compared with the parallel case. The output data is set to "0" when at least one of the output sections does not have a low resistance.

As mentioned above, the non-volatile logic circuit 301 outputs the output data "1", "0", "0", and "0" to the input data "00", "01", "10", and "11", respectively. That is, when the control data "0" is set to the control section 105, the non-volatile logic circuit 101 can operate as the NOR circuit.

Next, FIG. 34B will be described. FIG. 34B shows a case where the magnetization direction of the bias layer 153 in the control section 105 is previously set to the direction of +z (the control data "1").

(1) Case λ1

The input data ("A") in the input section 103 is "0" and the magnetization direction ("a") of the magnetization invertible region 135 is the direction of −z. The input data ("B") in the input section 104 is "0" and the magnetization direction ("b") of the magnetization invertible region 145 is the direction of −z. The control data of the control section 105 is "1" and the direction ("1") of the magnetization direction of the magnetization invertible region 155 is the direction of +z. At this time, the magnetic field (the leakage magnetic field) having a component in the direction of −x due to the input section 103 and the magnetic field (the leakage magnetic field) having a component in the direction of −x due to the control section 105 are applied to the sensor layer 123a in the output section 102a. As a result, the magnetization direction ("p") of the sensor layer 123a in the output section 102a is set to the direction of −x which is parallel to the magnetic fields, because both of the magnetic fields are substantially enhanced by each other. In the same way, at this time, the magnetic field (the leakage magnetic field) having a component in the direction of +x due to the input section 104 and the magnetic field (the leakage magnetic field) having a component in the direction of +x due to the control section 105 are applied to the sensor layer 123b in the output section 102b. As a result, the magnetization direction ("q") of the sensor layer 123b in the output section 102b is set to the direction of +x which is parallel to the magnetic fields, because both of the magnetic fields are substantially enhanced by each other. As a result, the magnetization directions of the reference layer 121a and the sensor layer 123a in the output section 102a are shifted with respect to each other by 90 degrees and the MTJ in the output section 102a has a high resistance compared with the parallel case. In the same way, the magnetization directions of the reference layer 121b and the sensor layer 123b in the output section 102b are shifted with respect to each other by 90 degrees, and the MTJ in the output section 102b has a high resistance compared with the parallel case. The output data ("out") is set to "0" when at least one of the output sections does not have a low resistance.

(2) Case λ2

The input data into the input section 103 is "0" and the magnetization direction of the magnetization invertible region 135 is the direction of −z. The input data into the input section 104 is "1" and the magnetization direction of the magnetization invertible region 145 is the direction of +z. The control data of the control section 105 is "1" and the magnetization direction of the magnetization invertible region 155 is the direction of +z. At this time, the magnetic field having a component in the direction of −x due to the input section 103 and the magnetic field having a component in the direction of −x due to the control section 105 are applied to the sensor layer 123a in the output section 102a. As a result, the magnetization direction of the sensor layer 123a in the output section 102a is set to the direction of −x which is parallel to the magnetic fields, because both of the magnetic fields are substantially enhanced by each other. On the other hand, at this time, the magnetic field having a component in the direction of −x due to the input section 104 and the magnetic field having a component in the direction of +x due to the control section 105 are applied to the sensor layer 123b in the output section 102b. As a result, to the magnetization direction of the sensor layer 123b in the output section 102b is set to the direction of +y as the direction of the magnetization easy axis, because both of the magnetic fields are substantially cancelled by each other. As a result, the magnetization directions of the reference layer 121a and the sensor layer 123a in the output section 102a are shifted with respect to each other by 90 degrees, and the MTJ in the output section 102a has a high resistance compared with the parallel case. On the other hand, the magnetization directions of the reference layer 121b and the sensor layer 123b in the output section 102b becomes parallel and the MTJ in the output section 102b has a low resistance. The output data is set to "0" when at least one of the output sections does not have the low resistance.

(3) Case λ3

The input data into the input section 103 is "1" and the magnetization direction of the magnetization invertible region 135 is the direction of +z. The input data into the input section 104 is "0" and the magnetization direction of the magnetization invertible region 145 is the direction of −z. The control data of the control section 105 is "1" and the magnetization direction of the magnetization invertible region 155 is the direction of +z. At this time, the magnetic field having a component in the direction of +x due to the input section 103 and the magnetic field having a component in the direction of −x due to the control section 105 are applied to the sensor layer 123a in the output section 102a. As a result, the magnetization direction of the sensor layer 123a in the output section 102a is set to the direction of +y as the direction of the magnetization easy axis, because both of the magnetic fields substantially cancelled by each other. On the other hand, at this time, the magnetic field having a component in the direction of +x due to the input section 104 and the magnetic field having a component in the direction of +x due to the control section 105 are applied to the sensor layer 123b in the output section 102b. As a result, the magnetization direction of the sensor layer 123b in the output section 102b is set to the direction of +x which is parallel to the magnetic fields, because both of the magnetic fields are substantially enhanced by each other. As a result, the magnetization directions of the reference layer 121a and the sensor layer 123a in the output section 102a becomes parallel, and the MTJ in the output section 102a has a low resistance. On the other hand, the magnetization directions of the reference layer 121b and the sensor layer 123b in the output section 102b are shifted with respect to each other by 90 degrees, and the MTJ in the output section 102b has a high resistance compared with the parallel case. The output data is set to "0" when at least one of the output sections is not the low resistance.

(4) Case λ4

The input data into the input section 103 is "1" and the magnetization direction of the magnetization invertible region 135 is the direction of +z. The input data into the input section 104 is "1" and the magnetization direction of the magnetization invertible region 145 is the direction of +z. The control data of the control section 105 is "1" and the magnetization direction of the magnetization invertible region 155 is the direction of +z. At this time, the magnetic field having a component in the direction of +x due to the input section 103 and the magnetic field due to the control section 105 having a component in the direction of −x are applied to the sensor layer 123a in the output section 102a. As a result, the magnetization direction of the sensor layer 123a in the output section 102a is set to the direction of +y is the direction of the magnetization easy axis, because both of the magnetic fields are substantially cancelled by each other. In the same way, at this time, the magnetic field having a component in the direction of −x due to the input section 104 and the magnetic field having a component in the direction of +x due to the control section 105 are applied to the sensor layer 123b in the output section 102b. As a result, the magnetization direction of the sensor layer 123b in the output section 102b is set to the direction of +y as the direction of the magnetization easy axis, because both of the magnetic fields are substantially cancelled by each other. As a result, the magnetization directions of the reference layer 121a and the sensor layer 123a in the output section 102a becomes parallel and the MTJ in the output section 102a has a low resistance. In the same way, the magnetization directions of the reference layer 121b and the sensor layer 123b in the output section 102b becomes parallel and the MTJ in the output section 102b has a low resistance. The output data is set to "1" when both of the output sections have the low resistance.

As described above, the non-volatile logic circuit 301 outputs the output data "0", "0", "0", and "1" to the input data "00", "01", "10", and "11", respectively. That is, when the control data "1" is set to the control section 105, the non-volatile logic circuit 101 can operate as the AND circuit.

In this way, the non-volatile logic circuit 101 in the present exemplary embodiment can be used as the NOR circuit or the AND circuit by controlling the magnetization state of the magnetization invertible region 155. Therefore, another logic circuit can be configured by configuring the NOR circuit and the AND circuit from the non-volatile logic circuits 101 in the present exemplary embodiment and combining them.

3. Data Input/Output Principle of Non-Volatile Logic Circuit

Next, with the reference to FIG. 33A and FIG. 33B, the data input/output principle of the non-volatile logic circuit according to the eighth exemplary embodiment of the present invention will be described. The input of data to the non-volatile logic circuit 101 is carried out by writing the data into the control section 105, the input section 103 and the domain wall motion device 104. On the other hand, the output of data from the non-volatile logic circuit 101 is carried out by reading the data of the TMR element in the output sections 102a and 102b.

First, the control section 105 will be described. Before the non-volatile logic circuit 101 operates, the control data is written previously to the control section 105 (the control data is inputted to the control section 105). That is, for example, the domain wall motion device in the control section 105 is set to the first magnetization state MS1 or the second magnetization state MS2 based on "0" or "1" of the control data. A method of setting to the first magnetization state MS1 or the second magnetization state MS2 is as previously mentioned. By writing the control data, the non-volatile logic circuit 101 can set to either of the NOR circuit and the AND circuit.

Next, the input sections 103 and 104 will be described. First, the input data is written into the input section 103 (the input data is inputted to the input section 103), while the non-volatile logic circuit 101 operates. That is, for example, by setting the domain wall motion device in the input section 103 to the first magnetization state MS1 or the second magnetization state MS2 based on "0" or "1" of the input data, the writing operation is carried out. The method of setting the first magnetization state MS1 or the second magnetization state MS2 as previously mentioned.

Moreover, the input data is written in the input section 104 (the input data is inputted to the input section 104), while the non-volatile logic circuit 101 operates. That is, for example, the domain wall motion device in the input section 104 is set to the first magnetization state MS1 or the second magnetization state MS2 based on "0" or "1" of the input data, and the writing operation is carried out. A method of setting to the first magnetization state MS1 or the second magnetization state MS2 is as previously mentioned.

As mentioned above, the input of data to the non-volatile logic circuit 101 is carried out. The control section 105 and the input section 103 and 104 are set to the desired magnetization states based on the data input to reflect the data. As a result, as shown in FIG. 34A to FIG. 34B, the output data is written in the output sections 102a and 102b with the leakage magnetic fields (the synthetic magnetic field) from the control section 105 and the input section 103 and 104.

Next, because the read of the data from the output sections 102a and 102b is the same as in the fifth exemplary embodiment about, the description is omitted.

4. Logic Gate Using Non-Volatile Logic Circuit

Next, with the reference to FIG. 22, the configuration and operation of the logic gate using the non-volatile logic circuit according to the eighth exemplary embodiment of the present invention will be described. In the present exemplary embodiment, too, the configuration of FIG. 22 can be used as an example of the logic gate using the non-volatile logic circuit 101.

The control circuit 381 generates the write current IW having a value and direction corresponding to the control data as a preliminary setting operation of the non-volatile logic circuit 101, in response to the supply of the control data. Then, the control circuit 381 supplies the generated current to the route of the first control terminal 165a of the non-volatile logic circuit 101 and the second control terminal 165b of the control section 105 through the terminal Control and the terminal 392. With this, the control data can be set to the control section 105 (the magnetization invertible region 155). As a result, the non-volatile logic circuit 101 can be set to the desired logical operation circuit (e.g. the NOR circuit).

Also, the control circuit 381 generates the write current IW1 having a value and direction corresponding to the first input data, as a preliminary operation of the non-volatile logic circuit 101, in response to the supply of the first input data. Then, the control circuit 381 supplies the generated current to the route of the first input terminal 163a of the non-volatile logic circuit 101 and the second input terminal 163b of the input section 103 through the terminal IN1 and the terminal 392. Next, in response to the supply of the second input data, the control circuit 381 generates the write current IW2 having a value and direction corresponding to the second input data. Then, the control circuit 381 supplies the generated current to the route of the first input terminal 164a of the non-volatile logic circuit 101 and the second input terminal 164b of the input section 104 through the terminal IN2 and the terminal 392. With this, the input data (the first input data and the second input data) can be inputted to the input sections 103 and 104. After that, the control circuit 381 generates a read current ER. Then, the read current is applied to the route of an output terminal (not shown), the output sections 102a, the conductor layer 106, the output section 102b and another output terminal (not shown) through the terminal 391 and the terminal 392. At this time, the voltage (the output voltage) corresponding to the resistance value of the MTJ in the output section 102a and the output section 102b is outputted from the terminal Out to the comparator 382. The comparator 382 outputs the final output data by comparing the output voltage from the non-volatile logic circuit 101 and the reference voltage from the MTJ reference element 383. With this, the non-volatile logic circuit 101 can output the output data showing the desired logical operation result to the input data.

By the above configuration and operation, it is possible to set the non-volatile logic circuit 101 to the desired logic circuit and to carry out the input of the input data to the non-volatile logic circuit 101 and the output of the output data from the non-volatile logic circuit 101.

The logic of the non-volatile logic circuit 101 in the present exemplary embodiment can be re-configured by changing the control data (the configuration information) inputted to the control section 105. That is, the re-configurable logic circuit can be realized with the non-volatile logic circuit 101 in the present exemplary embodiment by using a read separation type domain wall motion device (the control section 105, and the input sections 103 and 104) and the MTJ (the output sections 102a and 102b).

The non-volatile logic circuit in the present exemplary embodiment stores the configuration information (the control data) in the control section 105. The control section 105 can be regarded as the non-volatile memory using a domain wall motion device. It is not necessary to provide an SRAM retaining the configuration information at the time power-off since the non-volatile memory is used. Therefore, the chip area increase by the non-volatile memory which is a problem in FPGA can be solved.

Also, in the non-volatile logic circuit in the present exemplary embodiment, a magneto-resistance element such as a domain wall motion device is used for the control section 105, the memory sections 103 and 104, and the output sections 102a and 102b.

However, the non-volatile logic circuit operates as a device having a logical element function and a non-volatile memory function as a whole. Therefore, even if the magneto-resistance element is used, the size of the device can be suppressed to be small as a whole. Also, because the magneto-resistance element can operate at the room temperature, the non-volatile logic circuit in the present exemplary embodiment, too, can operate at the room temperature.

As mentioned above, while suppressing the chip area increase, the re-configurable non-volatile logic circuit can be provided.

In the present exemplary embodiment, by changing the setting of a level of the reference voltage, the logic of the non-volatile logic circuit 101 can be changed. For example, if in FIG. 34A, the output in case κ4 is set to "0" and the logic in the other cases κ1 to κ3 is set to "1", the circuit which is a NOR logic circuit originally, can be changed to a NAND logic circuit. In this case, when the resistance value of the MTJ in the output sections 102a and 102b are at a maximum, the logic is set to "1" and set to "0" otherwise. In the same way, in FIG. 34B, if the logic in case λ1 is set to "0" and the logic in the other cases λ2 to λ4 is set to "1", the circuit which is an AND logic circuit originally, can be changed to an OR logic circuit. In this case, when the resistance value of the MTJ in the output sections 102a and 102b is at a maximum, the logic is set to "1", and otherwise, set to "0".

In the present exemplary embodiment, the control section 105 is provided between the input section 103 and the input section 104. However, in the present exemplary embodiment, the arrangement order of these input sections 103 and 104 and the control section 105 is optional. As shown in FIG. 34A and FIG. 34B, "1" is assigned for the output data when the magnetization directions of the output sections 102a and 102b are the direction of +y in both, like case κ1 and case λ4, and "0" is assigned for the output data, otherwise. As a result, the relative position relation between the input section 103 and 104 and the control section 105 has no meaning.

Also, in the present exemplary embodiment, a relation between the output sections 102a and 102b, and the input sections 103 and 104 and the control section 105 is not limited to cases of FIG. 33A and FIG. 33B. FIG. 35A to FIG. 35D are diagrams schematically showing a modification example of the configuration of the non-volatile logic circuit according to the eighth exemplary embodiment of the present invention.

Figure 35A:
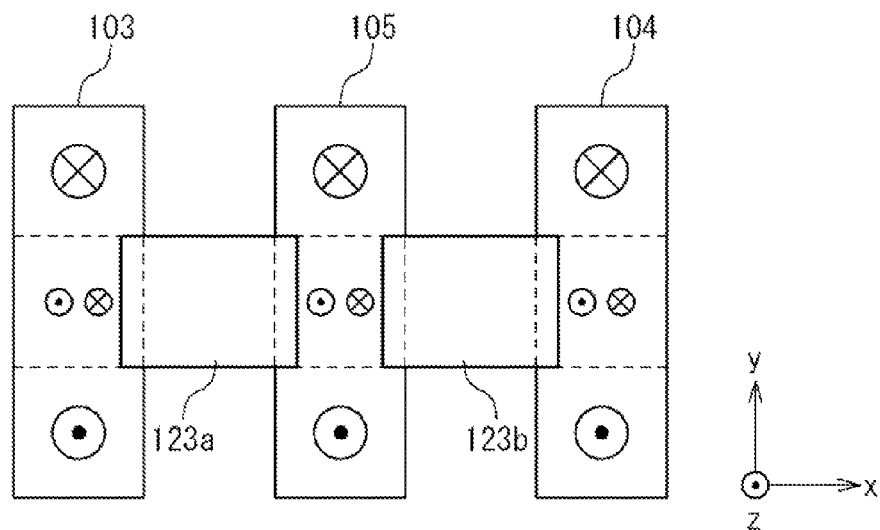
FIG. 35A is a diagram schematically showing a modification example of the configuration of the non-volatile logic circuit according to the eighth exemplary embodiment of the present invention.
Figure 35B:
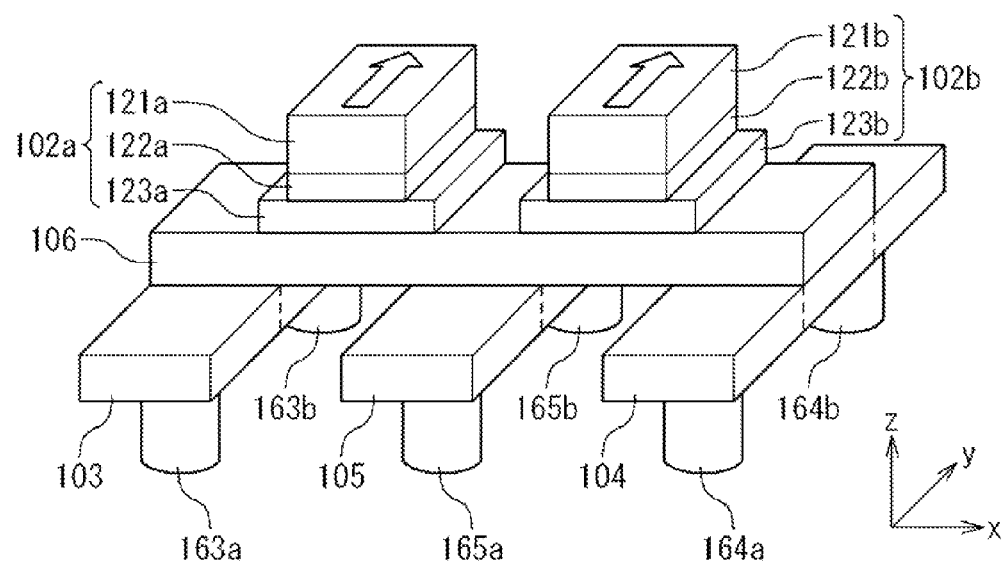
FIG. 35B is a diagram schematically showing a modification example of the configuration of the non-volatile logic circuit according to the eighth exemplary embodiment of the present invention.
Figure 35C:
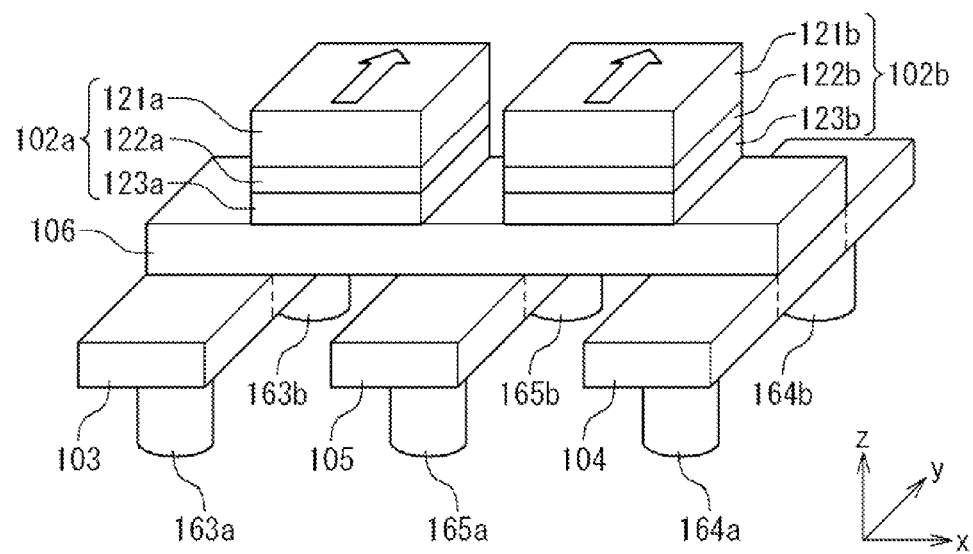
FIG. 35C is a diagram schematically showing a modification example of the configuration of the non-volatile logic circuit according to the eighth exemplary embodiment of the present invention.

As shown in FIG. 35A, the sensor layers 123a and 123b in the output sections 102a and 102b may be arranged to overlap the input sections 103 and 104, and the control section 105. In the magnetization invertible region 135 in the input section 103, the magnetization invertible region 145 in the input section 104 and the magnetization invertible region 155 in the control section 105, the maximum leakage magnetic fields are obtained at their edges. Therefore, by arranging to overlap, the sensitivity of the sensor layers 123a and 123b can be more improved. In this case, the length in the direction of x in each of the sensor layers is larger than an interval between the input section and the control section. At this time, the overlapping portion may be only the sensor layers 123a and 123b as shown in FIG. 35B, and may be the whole of output sections 102a and 102b as shown in FIG. 35C.

Figure 35D:
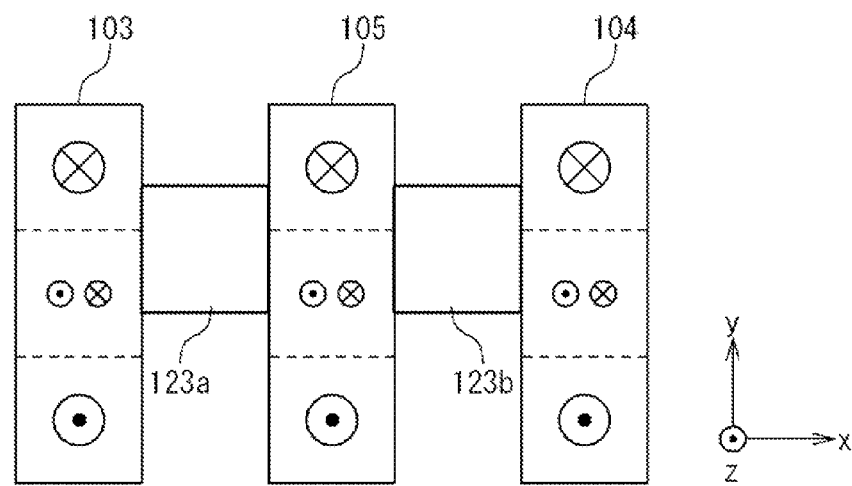
FIG. 35D is a diagram schematically showing a modification example of the configuration of the non-volatile logic circuit according to the eighth exemplary embodiment of the present invention.

Also, as shown in FIG. 35D, the sensor layers 123a and 123b of the output sections 102a and 102b may be the arranged to be shifted in the direction of +y to the input sections 103 and 104, and the control section 105. There is a merit that it is easy to turn the magnetization direction of the sensor layer to the direction of +y, when the magnetization directions of the input sections and the control sections on either side becomes parallel to each other, by shifting each output section into the direction of +y. In this case, too, the overlapping arrangement may be used like FIG. 35B and FIG. 35C.

Figures 36A, 36B:
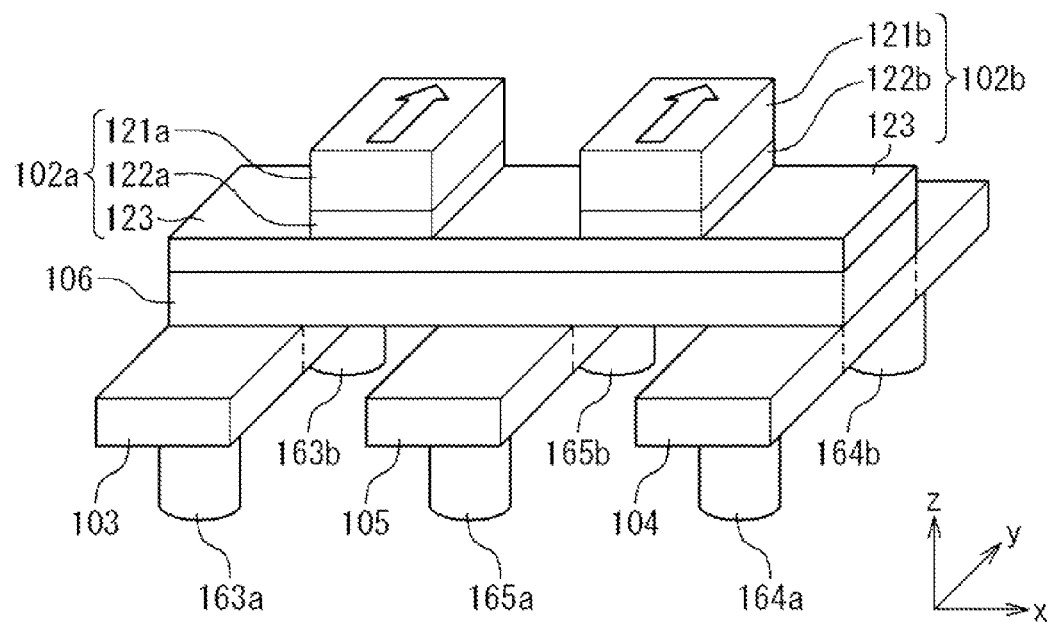
FIG. 36A is a diagram showing a modification example of the configuration of the non-volatile logic circuit according to the eighth exemplary embodiment of the present invention.
FIG. 36B is a diagram showing the modification example of the configuration of the non-volatile logic circuit according to the eighth exemplary embodiment of the present invention.
Figure 36C:
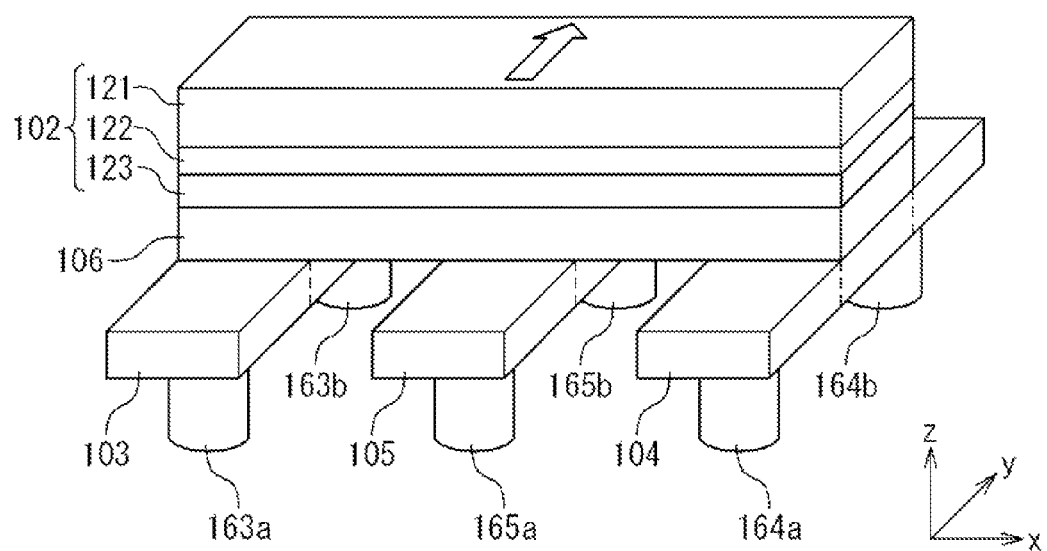
FIG. 36C is a diagram showing the modification example of the configuration of the non-volatile logic circuit according to the eighth exemplary embodiment of the present invention.

Also, in the present exemplary embodiment, the shapes of the sensor layers of 122a and 122b of the output sections 102a and 102b are not limited to the examples shown in FIG. 33A and FIG. 33B. FIG. 36A to FIG. 36C are diagrams showing the other modification examples of the configuration of the non-volatile logic circuit according to the eighth exemplary embodiment of the present invention. As shown in FIG. 36A, the sensor layers of the output sections 102a and 102b may be formed as one large sensor layer 123. In this case, the sensor layer 123 has a multi-magnetic domain structure. For example, the symbols "p" and "q" in FIG. 34A indicate of the magnetization directions ("p" and "q" shown by surroundings of a broken line) of the magnetic domains corresponding to positions of the output sections 102a and 102b as shown in FIG. 36B (corresponding to FIG. 34A). By such a configuration, the manufacture of the output section can be facilitated. Moreover, as shown in FIG. 36C, the output section (whole MTJ) including the reference layer may be formed as a large output section 102. In this case, the sensor layer 123 has the multi-magnetic domain structure like FIG. 36B. By such a configuration, the manufacture of the output section can be more facilitated. In these cases, the two output terminals are provided to supply a read current and draw out the current to and from the output section as in FIG. 33A.

Figure 37A:
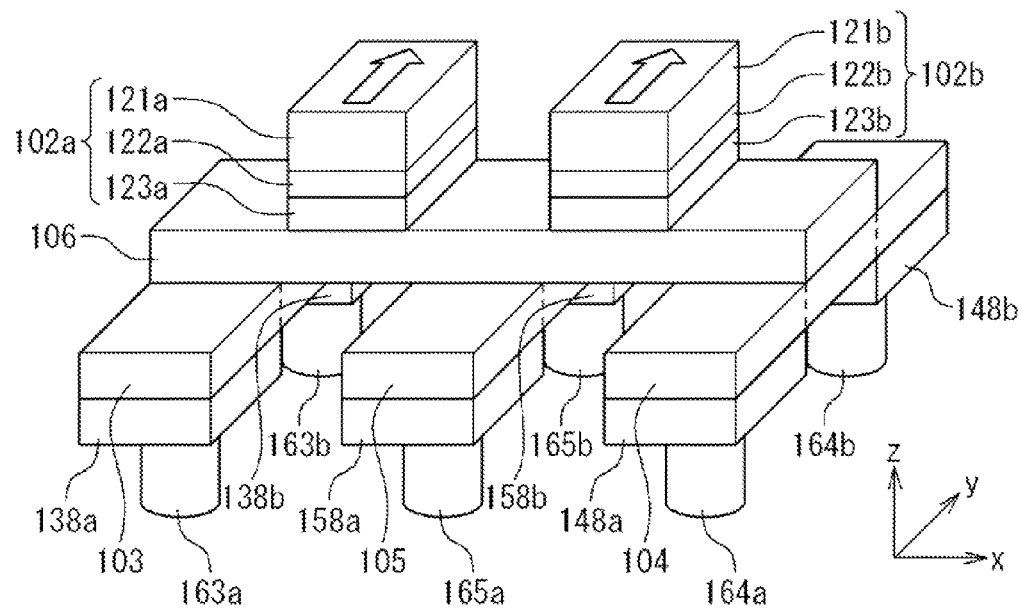
FIG. 37A is a diagram showing the configuration of another modification example of the non-volatile logic circuit according to the eighth exemplary embodiment of the present invention.
Figure 37B:
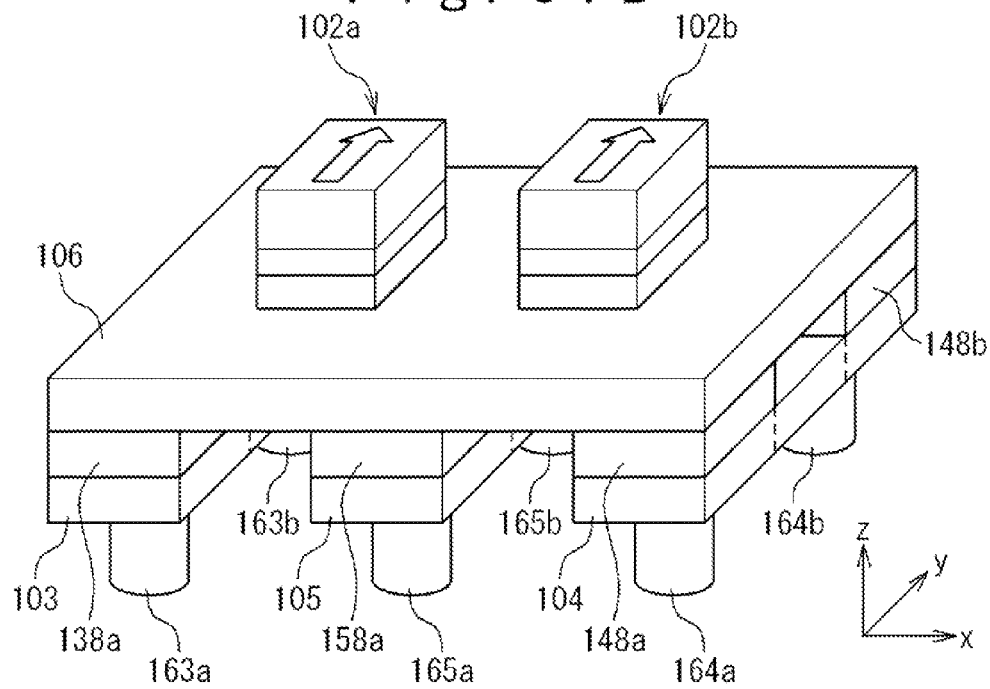
FIG. 37B is a diagram showing the configuration of the modification example of the non-volatile logic circuit according to the eighth exemplary embodiment of the present invention.

Also, in the present exemplary embodiment, the magnetization pinned layer (the hard layer) for the initialization may be provided for the magnetization pinned region in each of the input sections 103 and 104, and the control section 105. FIG. 37A to FIG. 37B are diagrams showing other modification examples of the configuration of the non-volatile logic circuit according to the eighth exemplary embodiment of the present invention. In FIG. 37A, each magnetization pinned layer is provided to be connected with the lower side (on the side of −z) of each of the magnetization pinned regions. However, the position of the magnetization pinned layer is optional if neighbor. At this time, for example, it is desirable that the magnetization pinned layer 148a and the magnetization pinned layer 148b in the input sections 104 are different from each other in the magnetic property. The operation of the magnetization pinned layer is to make anti-parallel initialization possible and moreover to provide the pin site of the domain wall. It should be noted that one of the magnetization pinned layers may be a non-magnetic material (not shown). Moreover, each of the magnetization pinned layers may be provided to be connected with the upper side (on the side of +z) of each of the magnetization pinned regions as shown in FIG. 37B and may be provided. The direct magnetic coupling can be carried out if there are the contacts on the upper side, the possible manufacture are easy.

Figure 38:
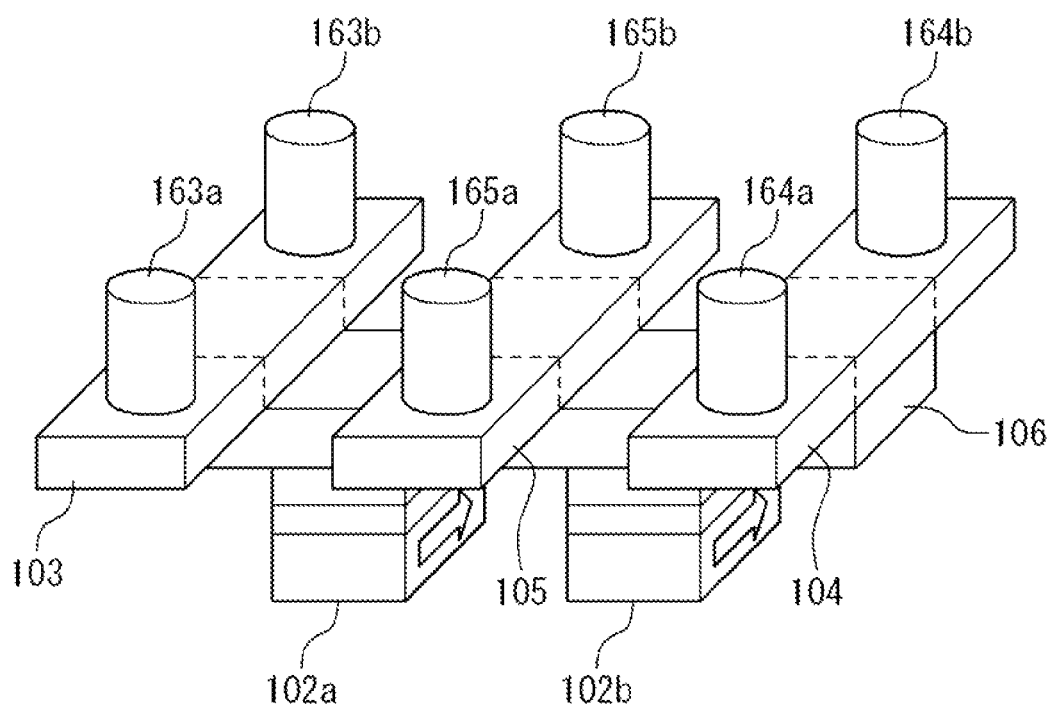
FIG. 38 is a perspective view showing the modification example of the configuration of the non-volatile logic circuit according to the eighth exemplary embodiment of the present invention.

Moreover, in the present exemplary embodiment, the position relation of various sections in the non-volatile logic circuit 101 is not limited to examples shown in FIG. 33A and FIG. 33B. FIG. 38 is a perspective view showing another modification example of the configuration of the non-volatile logic circuit according to the eighth exemplary embodiment of the present invention. As shown in FIG. 38, the input sections 103 and 104, the control section 105, and the output sections 102a and 102b may be opposite to each other (in the direction of z). When providing the magnetization pinned layer (the hard layer) as shown in FIG. 37A and FIG. 37B, it is desirable in a manufacturing method to configure the non-volatile logic circuit 101 in the order like FIG. 38.

Figure 39:
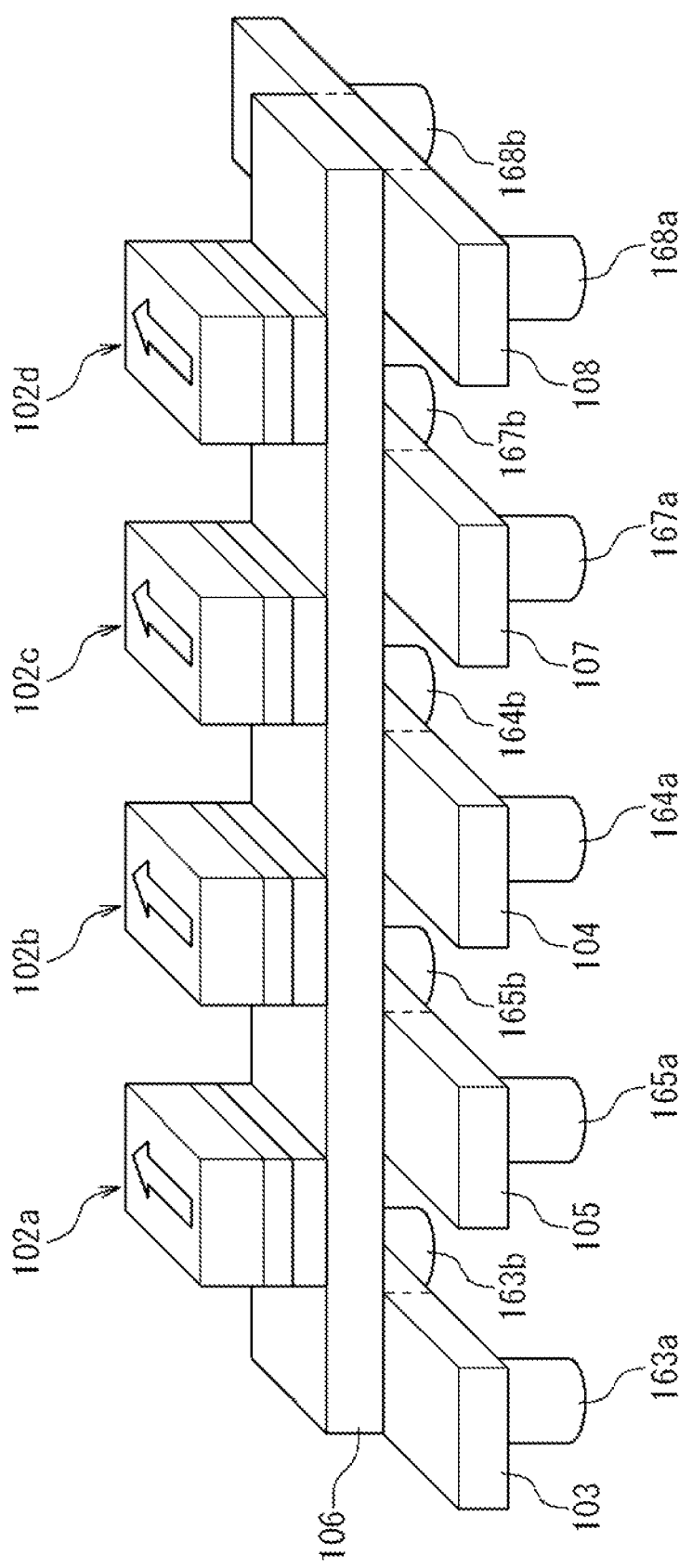
FIG. 39 is a diagram schematically showing the modification example of the configuration of the non-volatile logic circuit according to the eighth exemplary embodiment of the present invention showing more.

Moreover, in the present exemplary embodiment, the number of the sections at the non-volatile logic circuit 101 is not limited to examples shown in FIG. 33A and FIG. 33B. FIG. 39 is a diagram schematically showing another modification example of the configuration of the non-volatile logic circuit according to the eighth exemplary embodiment of the present invention. As shown in FIG. 39, the input section and the output section may be plural. In an example of this figure, the input sections 107 and 108 are added and the output section 102c and 102d are added. At this time, for example, if the output data is "1" when the memory layer of the input section and the bias layer of the control section are all in the direction of +z (or the direction of −z), and is "0" otherwise, an NOR operation and an AND operation can be implemented like FIG. 34A and FIG. 34B.

Ninth Exemplary Embodiment

1. Basic Configuration of Non-Volatile Logic Circuit

Figure 40A:
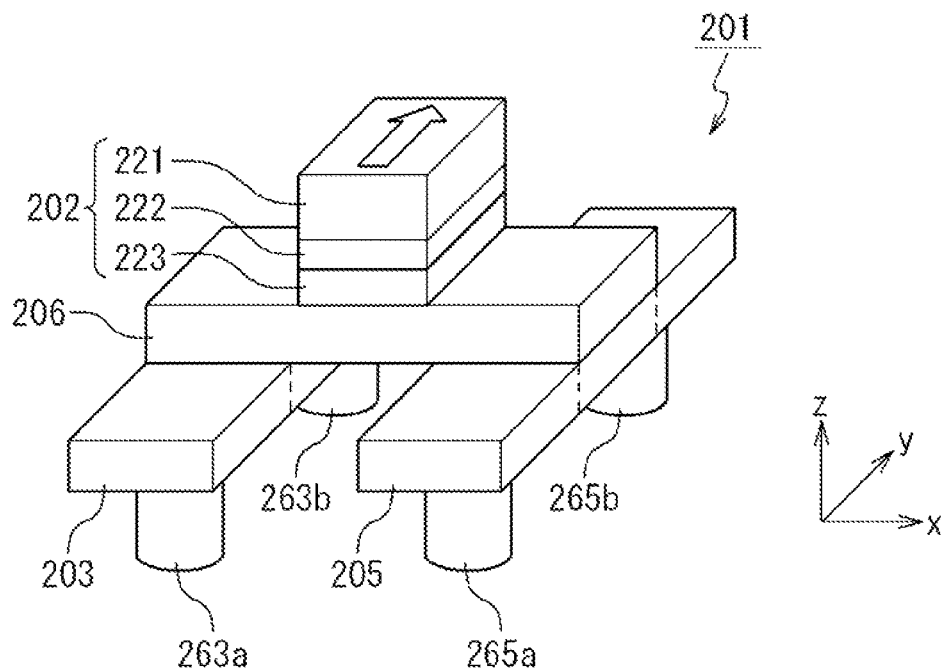
FIG. 40A is a perspective view showing the configuration of the non-volatile logic circuit according to the ninth exemplary embodiment of the present invention.
Figure 40B:
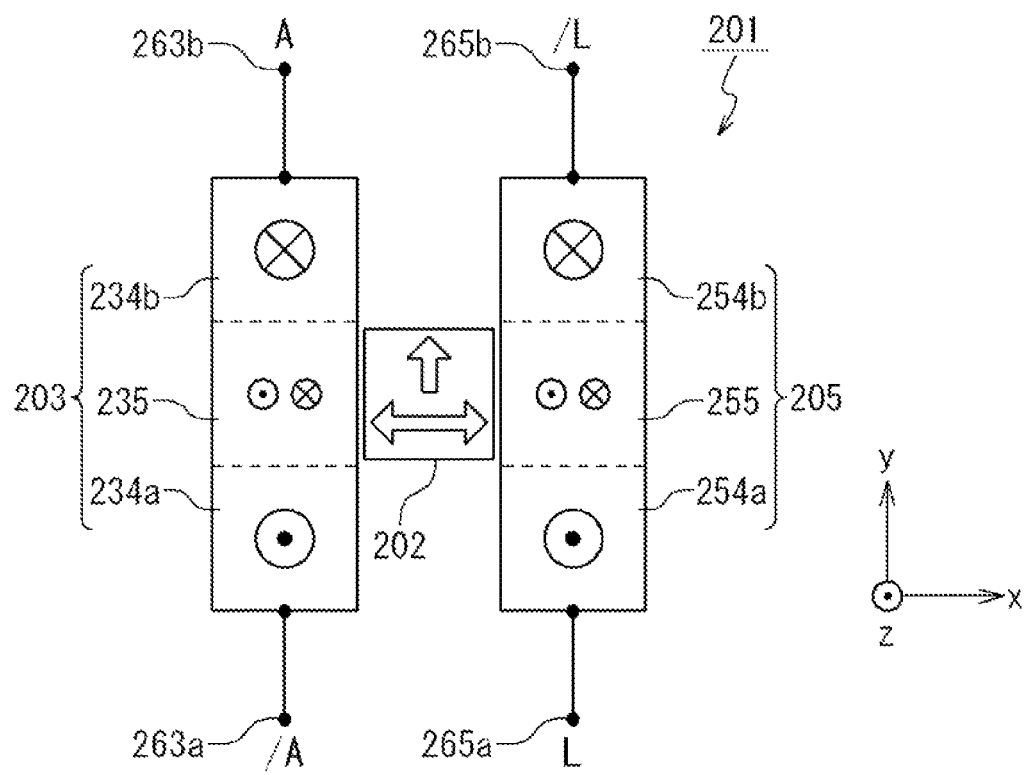
FIG. 40B is a plan view showing the configuration of the non-volatile logic circuit according to the ninth exemplary embodiment of the present invention.

Hereinafter, the basic configuration of the non-volatile logic circuit according to a ninth exemplary embodiment of the present invention will be described. FIG. 40A is a perspective view showing the configuration of the non-volatile logic circuit according to the ninth exemplary embodiment of the present invention. FIG. 40B is a plan view showing the configuration of the non-volatile logic circuit according to the ninth exemplary embodiment of the present invention. The non-volatile logic circuit 201 is provided with an input section 203, an output section 202, a control section 205 and a conductor layer 206.

The non-volatile logic circuit 201 is the same as the non-volatile logic circuit 101 excluding that each of the input section and the output section are less by one, comparing with the non-volatile logic circuit 101 (the eighth exemplary embodiment). Therefore, the description is omitted. Here, the input section 203 (the first magnetization pinned region 34a, the magnetization invertible region 235, the second magnetization pinned region 34b), the output section 202 (the reference layer 221, the barrier layer 222, and the sensor layer 223), the control section 205 (the first magnetization pinned region 254a, the magnetization invertible region 255, and the first magnetization pinned region 254b), and the conductor layer 206 are equivalent to the input section 103 (the first magnetization pinned region 34a, the magnetization invertible region 135, and the second magnetization pinned region 34b), the output section 102a (the reference layer 121a, the barrier layer 122a, and the sensor layer 123a), the control section 105 (the first magnetization pinned region 154a, the magnetization invertible region 155, and the second magnetization pinned region 154b) and the conductor layer 106, respectively.

2. Operation Principle of Non-Volatile Logic Circuit

Next, a principle of operation of the non-volatile logic circuit according to the ninth exemplary embodiment of the present invention will be described.

FIG. 41A and FIG. 41B are tables showing a relation of the magnetization directions of the magnetization invertible region and the sensor layer in the ninth exemplary embodiment of the present invention. Here, the symbol "A" shows the input data which is written in the input section 203, and the symbol "a" shows the magnetization direction of the magnetization invertible region 235. The symbol "l" shows the magnetization direction of the magnetization invertible region 255, and the symbol "r" shows the magnetization direction of the sensor layer 223. The symbol "out" shows output data. Also, the mark of cross in a white circle shows the magnetization in the direction of −z. The mark of a black dot in a white circle shows the magnetization in the direction of +z. The upward direction arrow shows the magnetization in the direction of +y. The right direction arrow shows the magnetization in the direction of +x. The left direction arrow shows the magnetization in the direction of −x.

Also, in this figure, when the magnetization direction of the magnetization invertible region 235 in the input section 203 is the direction of −z, the input data into the input section 203 is set as "0". On the other hand, when the magnetization direction of the magnetization invertible region 235 is the direction of +z, the input data into the input section 203 is set as "1". Oppositely, when the magnetization direction of the magnetization invertible region 255 in the control section 205 is +z, the control data of the control section 205 is set as "0". On the other hand, when the magnetization direction of the magnetization invertible region 255 is −z, the control data of the control section 205 is set as "1".

FIG. 41A will be described. FIG. 41A shows a case where the magnetization direction of the magnetization invertible region 255 in the control section 205 is previously set to the direction of +z (the control data "0").

(1) Case μ1

The input data ("A") in the input section 203 is "0" and the magnetization direction ("a") of the magnetization invertible region 235 is the direction of −z. The control data of the control section 205 is "0" and the magnetization direction ("1") of the magnetization invertible region 255 is the direction of +z. At this time, the magnetic field (the leakage magnetic field) having a component in the direction of −x due to the input section 203 and the magnetic field (the leakage magnetic field) having a component in the direction of −x due to the control section 205 are applied to the sensor layer 223 in the output section 202. As a result, the magnetization direction ("r") of the sensor layer 223 in the output section 202 is set to the direction of −x which is parallel to the magnetic fields, because both of the magnetic fields are enhanced by each other. As a result, the magnetization directions of the reference layer 221 and the sensor layer 223 in the output section 202 are shifted with respect to each other by 90 degrees and the MTJ in the output section 202 has a high resistance compared with the parallel case. The output data ("out") is set to "0" when the output section 202 has a high resistance.

(2) Case μ2

The input data into the input section 203 is "1" and the magnetization direction of the magnetization invertible region 235 is the direction of +z. The control data of the control section 205 is "0" and the magnetization direction of the magnetization invertible region 255 is the direction of +z. At this time, the magnetic field having a component in the direction of +x due to the input section 203 and the magnetic field having a component in the direction of −x due to the control section 205 are applied to the sensor layer 223 in the output section 202. As a result, the magnetization direction of the sensor layer 223 in the output section 202 is set to the direction of +y as the direction of the magnetization easy axis, because both of the magnetic fields are substantially cancelled by each other. As a result, the magnetization directions of the reference layer 221 and the sensor layer 223 are parallel, and the MTJ in the output section 202 in the output section 202 has a low resistance. The output data is set to "1" when the output section 202 has the low resistance.

As mentioned above, the non-volatile logic circuit 201 outputs the output data "0", and "1" to the input data "0" and "1", respectively. That is, when the control data "0" is set to the control section 205, the non-volatile logic circuit 201 can operate as the Through circuit.

Next, FIG. 41B will be described. FIG. 41B shows a case where the magnetization direction of the bias layer 253 in the control section 205 is previously set to the direction of −z (the control data "1").

(1) Case ν1

The input data ("A") in the input section 203 is "0" and the magnetization direction ("a") of the magnetization invertible region 235 is the direction of −z. The control data of the control section 205 is "1" and the magnetization direction ("1") of the magnetization invertible region 255 is the direction of −z. At this time, the magnetic field (the leakage magnetic field) having a component in the direction of −x due to the input section 203 and the magnetic field (the leakage magnetic field) having a component in the direction of +x due to the control section 205 are applied to the sensor layer 223 in the output section 202. As a result, the magnetization direction ("r") of the sensor layer 223 in the output section 202 is set to the direction of +y as the direction of the magnetization easy axis, because both of the magnetic fields are substantially cancelled by each other. As a result, the magnetization directions of the reference layer 221 and the sensor layer 223 in the output section 202 becomes parallel and the MTJ in the output section 202 has a low resistance. The output data is set to ("out") "1" when the output section 202 has the low resistance.

(2) Case ν2

The input data into the input section 203 is "1" and the magnetization direction of the magnetization invertible region 235 is the direction of +z. The control data of the control section 205 is "1" and the magnetization direction of the magnetization invertible region 255 is the direction of −z. At this time, the magnetic field having a component in the direction of +x due to the input section 203 and the magnetic field having a component in the direction of +x due to the control section 205 are applied to the sensor layer 223 in the output section 202. As a result, because both of the magnetic fields are substantially enhanced by each other, the magnetization direction of the sensor layer 223 in the output section 202 is set to the direction of +x which is parallel to the magnetic fields. As a result, the magnetization directions of the reference layer 221 and the sensor layer 223 in the output section 202 are shifted with respect to each other by 90 degrees, and the MTJ in the output section 202 has a high resistance compared with the parallel case. The output data is set to "0" when the output section 202 has the high resistance.

As mentioned above, the non-volatile logic circuit 201 outputs the output data "1" and "0" to the input data "0" and "1", respectively. That is, when the control data "1" is set to the control section 205, the non-volatile logic circuit 201 can operate as the NOT circuit.

In this way, the non-volatile logic circuit 201 in the present exemplary embodiment can be used as the Through circuit or the NOT circuit by controlling the magnetization state of the magnetization invertible region 255. Therefore, the Through circuit and the NOT circuit are configured with the non-volatile logic circuit 201 in the present exemplary embodiment. By combining them, another logic circuit can be configured. It should be noted that if "1" and "0" are made opposite in case of setting the output data, the Through circuit and the NOT circuit can be made in contrary.

3. Data Input/Output Principle of Non-Volatile Logic Circuit

Next, the data input/output principle of the non-volatile logic circuit according to the ninth exemplary embodiment of the present invention will be described. The input of data to the non-volatile logic circuit 201 is carried out by writing the data in the domain wall motion device in the control section 205 and the input section 203. On the other hand, the output of data from the non-volatile logic circuit 201 is carried out by reading the data from the TMR element in the output section 202. The write and read of the data in the data input/output principle are the same as in the non-volatile logic circuit 101 (the eighth exemplary embodiment). Therefore, the description is omitted.

4. Logic Gate Using Non-Volatile Logic Circuit

Next, the configuration and operation of the logic gate using the non-volatile logic circuit according to the ninth exemplary embodiment of the present invention will be described with reference to FIG. 30. In the present exemplary embodiment, too, the configuration of FIG. 30 can be used as an example of the logic gate using the non-volatile logic circuit 201.

The control circuit 481 generates the write current IW having a value and direction corresponding to the control data, as the preliminary setting operation of the non-volatile logic circuit 201, in response to the supply of the control data. Then, the control circuit 481 supplies the generated current to the route of the first control terminal 265*a* of the non-volatile logic circuit 201 and the control sections 205 and 265*b* of the second control terminal through the terminal Control and the terminal 492. With this, the control data can be set to the control section 205 (the magnetization invertible region 255). As a result, the non-volatile logic circuit 201 can be set to the desired logical operation circuit (e.g. the NOT circuit).

Also, the control circuit 481 generates the write current IW1 having a value and direction corresponding to the input data, as the operation of the non-volatile logic circuit 201, in response to the supply of the input data. Then, the control circuit 481 supplies the generated current to the route of the first input terminal 263*a* of the non-volatile logic circuit 201, the input section 203 and the second input terminal 263*b* through the terminal IN1 and the terminal 492. With this, the input data can be inputted to the input section 203. After that, the control circuit 481 generates a read current IR. Then, the read current is applied to the route of the output terminal (not shown), the output section 202, the conductor layer 206 and the first input terminal 236*a* through the terminal 491 and the terminal 492. At this time, the voltage (the output voltage) corresponding to the resistance value of the MTJ in the output section 202 is outputted from the terminal Out to the comparator 482. The comparator 482 outputs the final output data by comparing the output voltage from the non-volatile logic circuit 201 and the reference voltage from the MTJ reference element 483. With this, the non-volatile logic circuit 201 can output the output data showing the desired logical operation result to the input data.

By the above configuration and operation, it is possible to set the non-volatile logic circuit 201 to the desired logic circuit, and to carry out the input of the input data to the non-volatile logic circuit 201 and the output of the output data from the non-volatile logic circuit 201.

The same effect as in the non-volatile logic circuit 101 in the eighth exemplary embodiment can be attained in the non-volatile logic circuit 201 in the present exemplary embodiment. In addition, the non-volatile logic circuit 201 in the present exemplary embodiment can be modified like the non-volatile logic circuit 101 in the eighth exemplary embodiment in a range where the technical contradiction does not occurs.

Tenth Exemplary Embodiment

1. Basic Configuration of Non-Volatile Logic Circuit

Figure 42:
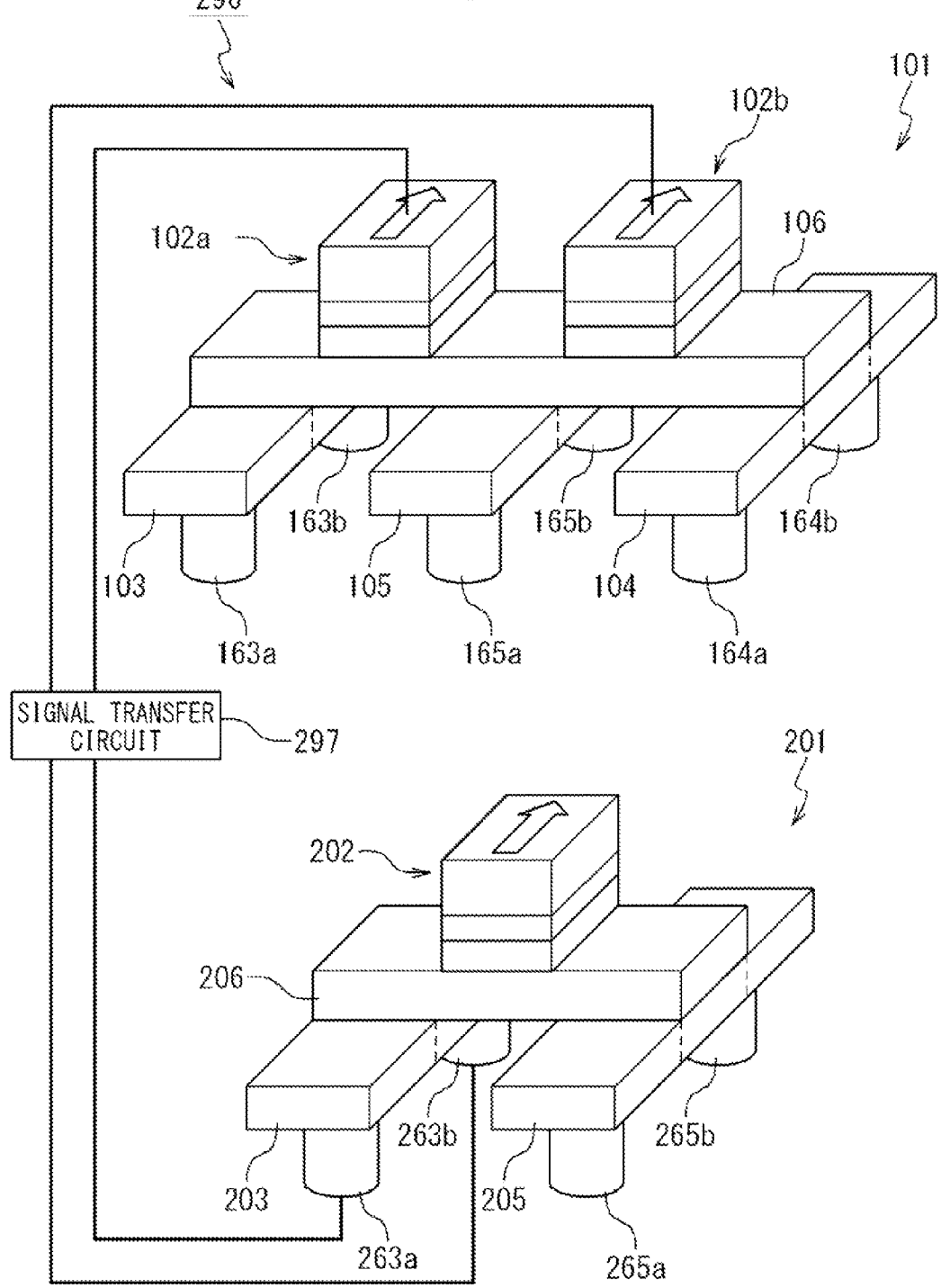
FIG. 42 is a perspective view showing the configuration of the non-volatile logic circuit according to the tenth exemplary embodiment of the present invention.

Hereinafter, the basic configuration of the non-volatile logic circuit according to a tenth exemplary embodiment of the present invention will be described. FIG. 42 is a perspective view showing the configuration of the non-volatile logic circuit according to the tenth exemplary embodiment of the present invention. The non-volatile logic circuit 296 is provided with the non-volatile logic circuit 101 according to the eighth exemplary embodiment, the non-volatile logic circuit 201 according to the ninth exemplary embodiment and a signal transferring circuit 297.

The non-volatile logic circuit 296 is a circuit in which the non-volatile logic circuit 101 (the eighth exemplary embodiment) and the non-volatile logic circuit 201 (the ninth exemplary embodiment) are combined. That is, the output data of the non-volatile logic circuit 101 is the input data of the non-volatile logic circuit 201. Specifically, first, the first input data is supplied to the input section 103 of the non-volatile logic circuit 101 and the second input data is supplied to the input section 104. Next, the magnetization states (the output data) of the output sections 102*a* and 102*b* changed based on these input data are detected by the signal transferring circuit 297. That is, the signal transferring circuit 297 detects the resistance values of the output sections 102*a* and 102*b* and whether the output data is "0" or "1" is determined. Then, the signal transferring circuit 297 supplies the determined output data to the input section 203 of the non-volatile logic circuit 201 as the input data. The magnetization state (the output data) of the output section 202 changed based on the input data is handled as the final output data of the non-volatile logic circuit 296. The other matters are the same as the non-volatile logic circuits 101 and 201. Therefore, the description is omitted.

2. Operation Principle of Non-Volatile Logic Circuit

Next, a principle of operation of the non-volatile logic circuit according to the tenth exemplary embodiment of the present invention will be described.

FIG. 43A and FIG. 43B are tables showing a relation of the magnetization directions of the magnetization invertible region and the sensor layer of the non-volatile logic circuit in the tenth exemplary embodiment of the present invention. Here, the symbol "A" shows the input data which is written in the input section 103 (the magnetization invertible region 135), and the symbol "B" shows the input data which is written in the input section 104 (the magnetization invertible region 145). The symbol "a" shows the magnetization direction of the magnetization invertible region 135 and the symbol "b" shows the magnetization direction of the magnetization invertible region 145. The symbol "l1" shows the magnetization direction of the magnetization invertible region 155, and the symbol "p" shows the magnetization direction of the sensor layer 123*a*. The symbol "q" shows the magnetization direction of the sensor layer 123*b*, and the symbol "O-1" shows the output data from the output sections 102*a* and 102*b* and the input data written in the input section 203. The symbol "o" shows the magnetization direction of the magnetization invertible region 235, and the symbol "I2" shows the magnetization direction of the magnetization invertible region 255. The symbol "r" shows the magnetization direction of the sensor layer 223, and the symbol "O-2" shows the output data from the output section 202, i.e. the output data of the non-volatile logic circuit 296. Also, the mark of a cross in a white circle shows the magnetization in the direction of −z. The mark of a black dot in a white circle shows the magnetization in the direction of +z. The upward direction arrow shows the magnetization in the direction of +y. The right direction arrow shows the magnetization in the direction of +x. The left direction arrow shows the magnetization in the direction of −x. The setting of "0" and "1" of each input data, each the control data and each output data is the same as in the non-volatile logic circuits 101 and 201. Therefore, the description is omitted.

FIG. 43A will be described. FIG. 43A shows a case where it is previously set that the magnetization direction of the magnetization invertible region 155 in the control section 105 is set to the direction of −z (the control data "0"), and the magnetization direction of the magnetization invertible region 255 in the control section 205 is set to the direction of +z (the control data "0"). Thus, the non-volatile logic circuit 101 operates as the NOR circuit as shown in FIG. 34A. On the other hand, the non-volatile logic circuit 201 operates as the Through circuit as shown in FIG. 41A. That is, the non-volatile logic circuit 296 operates as the NOR circuit as a whole.

(1) Case ξ1

The input data ("A") in the input section 103 is "0" and input data ("B") in the input section 104 is "0". This is a case κ1 in FIG. 34A. In this case, the output data of the output sections 102a and 102b in the non-volatile logic circuits 101 are "1". Therefore, the input data ("O-1") in the input section 203 is "1". This is a case μ2 in FIG. 41A. Therefore, the output data ("O-2") from the output section 202 is "1".

(2) Case ξ2

The input data into the input section 103 is "0" and the input data into the input section 104 is "1." This is a case κ2 in FIG. 34A. In this case, the output data of the output sections 102a and 102b of the non-volatile logic circuit 101 are "0". Therefore, the input data into the input section 203 is "0". This is a case μ1 in FIG. 41A. Therefore, the output data from the output section 202 is "0".

(3) Case ξ3

The input data into the input section 103 is "1" and the input data into the input section 104 is "0". This is a case κ3 in FIG. 34A. In this case, the output data of the output sections 102a and 102b of the non-volatile logic circuit 101 are "0". Therefore, the input data into the input section 203 is "0". This is a case μ1 in FIG. 41A. Therefore, the output data from the output section 202 is "0".

(4) Case ξ4

The input data into the input section 103 is "1" and the input data into the input section 104 is "1". This is a case κ4 in FIG. 34A. In this case, the output data of the output sections 302a and 302b of the non-volatile logic circuit 301 is "0". Therefore, the input data into the input section 203 is "0". This is the case μ1 in FIG. 41A. Therefore, the output data from the output section 202 is "0".

As mentioned above, the non-volatile logic circuit 296 outputs the output data "1", "0", "0", and "0" to the input data "00", "01", "10", and "11", respectively. That is, when the control data "0" and "0" are set to the control sections 105 and 205 respectively, the non-volatile logic circuit 296 can operate as the NOR circuit.

Next, FIG. 43B will be described. FIG. 43B shows a case where it is previously set that the magnetization direction of the magnetization invertible region 155 in the control section 105 is set to the direction of +z (the control data "1") and the magnetization direction of the magnetization invertible region 255 in the control section 205 is set to the direction of −z (the control data "1"). The non-volatile logic circuit 101 operates as the AND circuit for as shown in FIG. 34B. On the other hand, the non-volatile logic circuit 201 operates as the NOT circuit for as shown in FIG. 41B. That is, the non-volatile logic circuit 296 operates as the NAND circuit as a whole.

(1) Case π1

The input data ("A") in the input section 103 is "0" and input data ("B") in the input section 104 is "0". This is a case λ1 in FIG. 34B. In this case, the output data of the output sections 102a and 102b of the non-volatile logic circuit 101 are "0". Therefore, the input data ("O-1") in the input section 203 is "0". This is the case v1 in FIG. 41B. Therefore, the output data ("O-2") from the output section 202 is "1".

(2) Case π2

The input data into the input section 103 is "0" and the input data into the input section 104 is "1". This is the case l2 in FIG. 34B. In this case, the output data of the output sections 102a and 102b of the non-volatile logic circuit 101 are "0". Therefore, the input data into the input section 203 is "0". This is the case v1 in FIG. 41B. Therefore, the output data from the output section 202 is "1".

(3) Case π3

The input data into the input section 103 is "1" and the input data into the input section 104 is "0". This is the case λ3 in FIG. 34B. In this case, the output data of the output sections 102a and 102b of the non-volatile logic circuit 101 are "0". Therefore, the input data into the input section 203 is "0". This is the case v1 in FIG. 41B. Therefore, the output data from the output section 202 is "1".

(4) Case π4

The input data into the input section 103 is "1" and the input data into the input section 104 is "1". This is the case λ4 in FIG. 34B. In this case, the output data of the output sections 102a and 102b of the non-volatile logic circuit 101 are "1". Therefore, the input data into the input section 203 is "1". This is the case v2 in FIG. 41B. Therefore, the output data from the output section 202 is "0".

As mentioned above, the non-volatile logic circuit 296 outputs the output data "1", "1", "1", and "0" to the input data "00", "01", "10", and "11", respectively. That is, when the control data "1" and "1" are set to the control sections 105 and 205 respectively, the non-volatile logic circuit 296 can operate as the NAND circuit.

The non-volatile logic circuit 296 in the present exemplary embodiment can be used by controlling the NOR circuit or the NAND circuit as the magnetization states of the control sections 105 and 205 of the non-volatile logic circuits 101 and 201. Therefore, another logic circuit can be configured by configuring an NOR circuit and a NAND circuit with the non-volatile logic circuit 296 in the present exemplary embodiment and by combining them.

3. Data Input/Output Principle of Non-Volatile Logic Circuit

Next, the data input/output principle of the non-volatile logic circuit according to the tenth exemplary embodiment of the present invention is the same as that of the eighth exemplary embodiment (the non-volatile logic circuit 101) and the ninth exemplary embodiment (the non-volatile logic circuit 201). Therefore, the description is omitted.

4. Logic Gate Using Non-Volatile Logic Circuit

Next, the configuration and operation of the logic gate using the non-volatile logic circuit according to the tenth exemplary embodiment of the present invention can be executed by a combination of the eighth exemplary embodiment (the logic gate 380 using the non-volatile logic circuit 101: FIG. 22) and the ninth exemplary embodiment (the logic gate 480 using the non-volatile logic circuit 201: FIG. 30). Therefore, the description is omitted. However, the signal communication circuit 297 can be configured from the comparator 382 in FIG. 22, the MTJ reference element 383 and a part of the control circuit 381 which controls the comparator 382 and the MTJ reference element 383.

The same effect as those of the non-volatile logic circuit 101 in the eighth exemplary embodiment and the non-volatile logic circuit 201 in the ninth exemplary embodiment can be attained even in the non-volatile logic circuit 296 in the present exemplary embodiment. Moreover, the NOR circuit and the NAND circuit can be configured, and all the logic circuits can be configured by combining them. In addition, the non-volatile logic circuit 296 in the present exemplary embodiment can be modified in a range that the technical contradiction does not occur, like the non-volatile logic circuit 101 in the eighth exemplary embodiment and the non-volatile logic circuit 201 in the ninth exemplary embodiment.

As mentioned above, by appropriately selecting and combining the non-volatile logic circuits in the exemplary embodiments of the present invention and the logic gates using them, a semiconductor device can be formed by using for the semiconductor device (e.g. the semiconductor integrated circuit) which performs a logical operation.

With reference to the exemplary embodiments, the present invention has been described. However, the present invention is not limited to the above exemplary embodiments. Various modifications to the configuration and operation of the present invention can be carried out in the scope of the present invention. Also, the techniques in the exemplary embodiments can be combined, in a range that the technical contradiction does not occur.

The invention claimed is:

1. A non-volatile logic circuit comprising:
   an input section comprising a ferromagnetic layer which has a changeable magnetization state and has perpendicular magnetic anisotropy;
   a control section comprising a ferromagnetic layer which has a changeable magnetization state; and
   an output section provided in a neighborhood of said input section and said control section and comprising a magnetic tunnel junction element which has a changeable magnetization state,
   wherein the magnetization state of said input section is changed in response to input data, and
   wherein the magnetization state of said magnetic tunnel junction element in said output section is changed in response to the magnetization states of said input section and said control section.

2. The non-volatile logic circuit according to claim 1, wherein said magnetic tunnel junction element in said output section comprises:
   a sensor layer comprising a ferromagnetic layer which has an invertible magnetization and has in-plane magnetic anisotropy;
   a reference layer comprising a ferromagnetic layer which has a fixed magnetization direction and has in-plane magnetic anisotropy; and
   an insulating layer provided between said sensor layer and said reference layer.

3. The non-volatile logic circuit according to claim 2, wherein said input section comprises:
   a free layer comprising a ferromagnetic layer which has an invertible magnetization and has perpendicular magnetic anisotropy;
   a pinned layer comprising a ferromagnetic layer which has a fixed magnetization direction and has perpendicular magnetic anisotropy; and
   a non-magnetic layer provided between said free layer and said pinned layer.

4. The non-volatile logic circuit according to claim 3, wherein when said input section and said output section are projected to a plane containing a bottom plane of said output section, a position of a center of gravity of the projection of said input section is shifted with respect to a position of the center of gravity of said output section.

5. The non-volatile logic circuit according to claim 4, wherein said control section has perpendicular magnetic anisotropy,
   wherein a plurality of said input sections are provided, and
   wherein said control section and said plurality of input sections are arranged in a straight line.

6. The non-volatile logic circuit according to claim 5, further comprising a single-input device,
   wherein said plurality of input sections, said control section and said output section configure a multi-input device,
   wherein said single-input device comprises:
   a second input section comprising a ferromagnetic layer which has perpendicular magnetic anisotropy and has a changeable magnetization state;
   a second control section comprising a ferromagnetic layer which has a changeable magnetization state; and
   a second output section provided in a neighborhood of said second input section and said second control section and comprising a second magnetic tunnel junction element having a changeable magnetization state,
   wherein the magnetization state of said second input section is set in response to a transfer signal determined based on an output of said output section, and changes in response to a communication data, and
   wherein the magnetization state of said second magnetic tunnel junction element in said second output section is changed based on the magnetization states of said second input section and said second control section.

7. The non-volatile logic circuit according to claim 6, further comprising:
   a signal transferring circuit electrically connected with said output section to output the communication signal based on an output of said output section to said second input section.

8. The non-volatile logic circuit according to claim 4, wherein said sensor layer has magnetic anisotropy in a direction perpendicular to a direction in which said input section and said control section are arranged.

9. The non-volatile logic circuit according to claim 8, wherein the magnetization direction of said reference layer is fixed to a direction perpendicular to a direction of a line in which said input section and said control section are arranged.

10. The non-volatile logic circuit according to claim 4, wherein said control section has in-plane magnetic anisotropy, and wherein when said control section and said output section are projected on a plane containing the bottom plane of said output section, a position of the center of gravity of said projection of said control section overlaps a position of the center of gravity of said output section.

11. The non-volatile logic circuit according to claim 4, wherein said control section has a perpendicular magnetic anisotropy, and
wherein when said control section and said output section are projected on a plane containing the bottom plane of said output section, a position of the center of gravity of said projection of said control section is shifted with respect to a position of the center of gravity of said output section.

12. The non-volatile logic circuit according to claim 4, further comprising:
a second control section provided in a neighborhood of said output section and comprising a ferromagnetic layer,
wherein each of said control section and said second control section has perpendicular magnetic anisotropy, and
wherein when said control section, said second control section and said output section are projected on a plane containing the bottom plane of said output section, a position of the center of gravity of said projection of each of said control section and said second control section is shifted with respect to a position of the center of gravity of said output section.

13. The non-volatile logic circuit according to claim 2, wherein said input section comprises:
a first magnetization pinned region comprising a ferromagnetic layer which has perpendicular magnetic anisotropy, and has a magnetization fixed to a first direction;
a second magnetization pinned region comprising a ferromagnetic layer which has perpendicular magnetic anisotropy, and has magnetization fixed to a second direction which is opposite to the first direction; and
a magnetization invertible region provided between said first magnetization pinned region and said second magnetization pinned region, which has an invertible magnetization, and comprising a ferromagnetic layer which has perpendicular magnetic anisotropy and has an invertible magnetization.

14. The non-volatile logic circuit according to claim 13, wherein said input section further comprises:
at least one of (i) a first hard layer provided in a neighborhood of said first magnetization pinned region to pin a magnetization direction of said first magnetization pinned region, and (ii) a second hard layer provided in a neighborhood of said second magnetization pinned region to pin a magnetization of said second magnetization pinned region.

15. The non-volatile logic circuit according to claim 13, wherein when said input section and said output section are projected on a plane containing a bottom plane of said output section, a position of a center of gravity of the projection of said input section is shifted with respect to a position of a center of gravity of the projection of said output section.

16. The non-volatile logic circuit according to claim 15, wherein a direction into which said control section extends and a direction into which said input section extends are parallel.

17. The non-volatile logic circuit according to claim 16, wherein a plurality of said input sections are provided, and directions in which said plurality of input sections extend are parallel to each other.

18. The non-volatile logic circuit according to claim 17, wherein said control section has perpendicular magnetic anisotropy, and said control section and said plurality of input sections are arranged in a straight line.

19. The non-volatile logic circuit according to claim 17, further comprising a single input device,
wherein said plurality of input sections, said control section and said output section configure a multi-input device,
wherein said single input device comprises:
a second input section comprising a ferromagnetic layer which has a changeable magnetization state and having perpendicular magnetic anisotropy;
a second control section comprising a ferromagnetic layer; and
a second output section provided in a neighborhood of said second input section and said second control section and comprising a second magnetic tunnel junction element which has a changeable magnetization state,
wherein the magnetization state of said second input section is changed in response to a transfer signal determined based on an output of said output section, and
wherein the magnetization state of said second magnetic tunnel junction element in said second output section is changed based on the magnetization states of said second input section and said second control section.

20. The non-volatile logic circuit according to claim 19, further comprising:
a signal transferring circuit electrically connected with said output section to output the transfer signal to said second input section.

21. The non-volatile logic circuit according to claim 15, wherein said sensor layer has magnetic anisotropy in a direction perpendicular to a direction in which said input section and said control section are arranged in a line.

22. The non-volatile logic circuit according to claim 21, wherein the magnetization direction of said reference layer is fixed in a direction perpendicular to a direction in which said input section and said control section are arranged in a line.

23. The non-volatile logic-circuit according to claim 15, wherein said sensor layer has a magnetic anisotropy in a direction parallel to a direction in which said input section and said control section are arranged in a line.

24. The non-volatile logic circuit according to claim 15, wherein said control section has in-plane magnetic anisotropy, and
wherein when said control section and said output section are projected on a plane containing a bottom plane of said output section, a position of a center of gravity of the projection of said control section overlaps a position of the center of gravity of the projection of said output section.

25. The non-volatile logic circuit according to claim 15, wherein said control section has perpendicular magnetic anisotropy, and
wherein when said control section and said output section are projected on a plane containing a bottom plane of said output section, a position of center of gravity of the projection of said control section is shifted with respect to a position of center of gravity of the projection of said output section.

26. The non-volatile logic circuit according to claim 15, further comprising:
a second control section comprising a ferromagnetic layer provided in a neighborhood of said output section,
wherein said control section and said second control section have perpendicular magnetic anisotropy, and
wherein when said control section, said second control section and said output section are projected on a plane containing a bottom plane of said output section, positions of centers of gravity of the projections of said control section and said second control section are shifted with respect to a position of center of gravity of the projection of said output section.

27. The non-volatile logic circuit according to claim 1, wherein said control section is supplied with control data, and the magnetization state of said ferromagnetic layer in said control section is changed based on the control data,
  wherein said input section is supplied with input data and the magnetization state of said ferromagnetic layer in said input section is changed based on the input data, and
  wherein the magnetization state of said magnetic tunnel junction element in said output section is changed based on the magnetization state of said ferromagnetic material of said control section and the magnetization state of said ferromagnetic material of said input section, and is read.

28. An operation method of a non-volatile logic circuit, which comprises:
  an input section comprising a ferromagnetic layer which has perpendicular magnetic anisotropy and which has a changeable magnetization state;
  a control section comprising a ferromagnetic layer which has a changeable magnetization state; and
  an output section provided in a neighborhood of said input section and said control section and comprising a magnetic tunnel junction element which has a changeable magnetization state,
  wherein said operation method comprises:
  inputting control data to said control section to set the magnetization state of said ferromagnetic layer of said control section based on the control data;
  inputting input data to said input section to set the magnetization state of said ferromagnetic layer of said input section based on the input data; and
  reading the magnetization state of said magnetic tunnel junction element of said output section which state is changed based on the magnetization state of the ferromagnetic material of said control section and the magnetization state of the ferromagnetic material of said input section.

* * * * *